United States Patent
Yamazaki et al.

(10) Patent No.: US 9,905,579 B2
(45) Date of Patent: Feb. 27, 2018

(54) SEMICONDUCTOR DEVICE AND DISPLAY DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Kenichi Okazaki, Tochigi (JP); Hiroyuki Miyake, Aichi (JP); Kengo Akimoto, Kanagawa (JP); Masami Jintyou, Shimotsuga (JP); Takahiro Iguchi, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/451,540

(22) Filed: Mar. 7, 2017

(65) Prior Publication Data

US 2017/0271378 A1    Sep. 21, 2017

(30) Foreign Application Priority Data

Mar. 18, 2016 (JP) ................................. 2016-055861
Jun. 24, 2016 (JP) ................................. 2016-125919

(51) Int. Cl.
*H01L 27/12* (2006.01)
*H01L 29/786* (2006.01)
(Continued)

(52) U.S. Cl.
CPC ...... *H01L 27/1229* (2013.01); *H01L 27/1222* (2013.01); *H01L 27/1225* (2013.01);
(Continued)

(58) Field of Classification Search
CPC ............. H01L 27/1214; H01L 27/1222; H01L 27/1225; H01L 27/1229; H01L 27/1251;
(Continued)

(56) References Cited

U.S. PATENT DOCUMENTS 8,981,367 B2    3/2015  Yoneda et al.
9,472,680 B2   10/2016  Yoneda et al.
(Continued)

FOREIGN PATENT DOCUMENTS

JP    2013-138191    7/2013
JP    2015-194577   11/2015

*Primary Examiner* — Eduardo A Rodela
(74) *Attorney, Agent, or Firm* — Fish & Richardson P.C.

(57) ABSTRACT

A semiconductor device with a reduced layout area of transistors is provided. The semiconductor device includes a first transistor including a first oxide semiconductor film and a second transistor including a second oxide semiconductor film over a substrate. When the oxide semiconductor films are subjected to electron diffraction, the ratio of the integrated intensity of luminance of a diffraction spot derived from c-axis alignment to the integrated intensity of luminance of a diffraction spot derived from alignment in any direction in the first oxide semiconductor film is higher than that in the second oxide semiconductor film. In addition, part of the first transistor is located between the second transistor and the substrate.

22 Claims, 58 Drawing Sheets

(51) Int. Cl.
*H01L 29/04* (2006.01)
*H01L 29/24* (2006.01)
*H01L 27/32* (2006.01)

(52) U.S. Cl.
CPC ............ *H01L 29/045* (2013.01); *H01L 29/24* (2013.01); *H01L 29/786* (2013.01); *H01L 29/7869* (2013.01); *H01L 29/78696* (2013.01); *H01L 27/3262* (2013.01)

(58) Field of Classification Search
CPC ............... H01L 29/786; H01L 29/7869; H01L 29/78693; H01L 29/78696
See application file for complete search history.

(56) References Cited

U.S. PATENT DOCUMENTS

| | | |
|---|---|---|
| 9,564,482 B2 | 2/2017 | Teraguchi et al. |
| 2014/0291671 A1* | 10/2014 | Yamazaki ......... H01L 21/02554 257/43 |
| 2017/0033130 A1 | 2/2017 | Yoneda et al. |

* cited by examiner

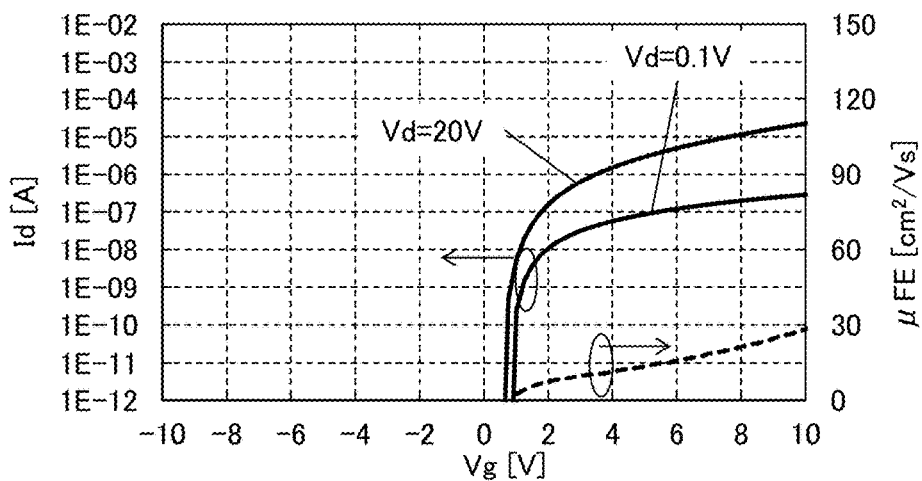
FIG. 8A  Sample A1: L/W=2/3 μm
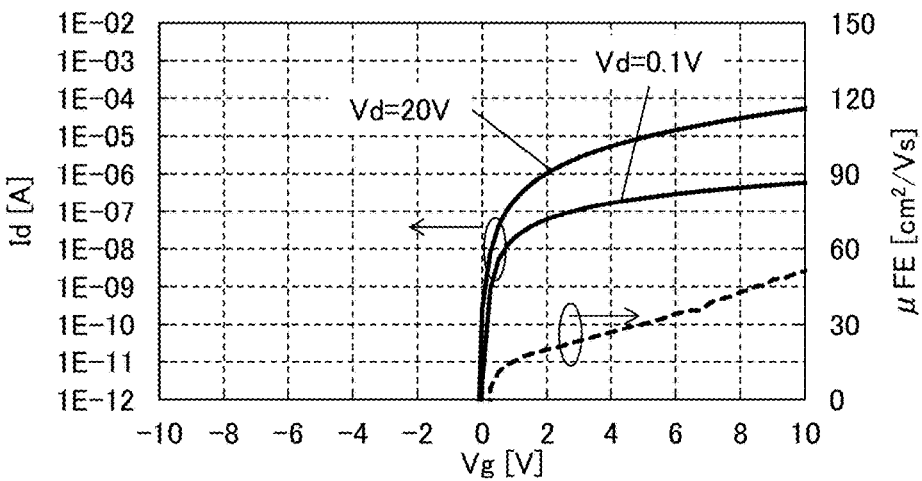
FIG. 8B  Sample A2: L/W=2/3 μm
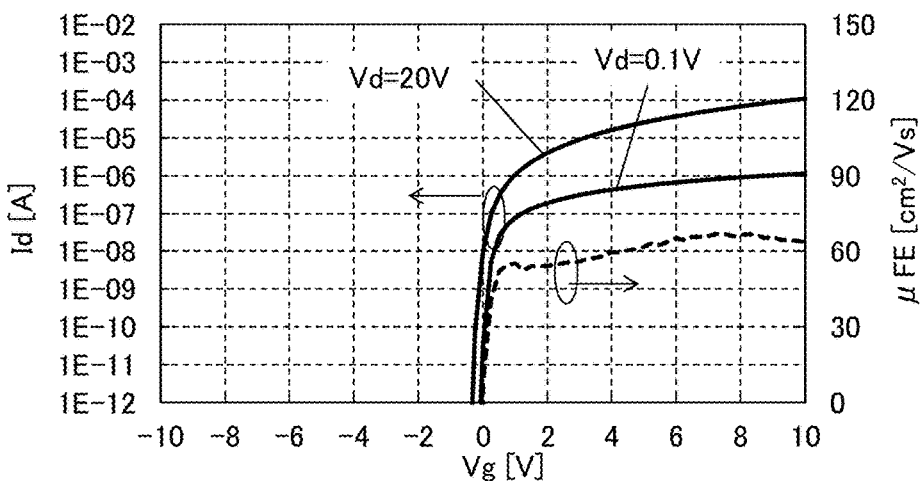
FIG. 8C  Sample A3: L/W=2/3 μm

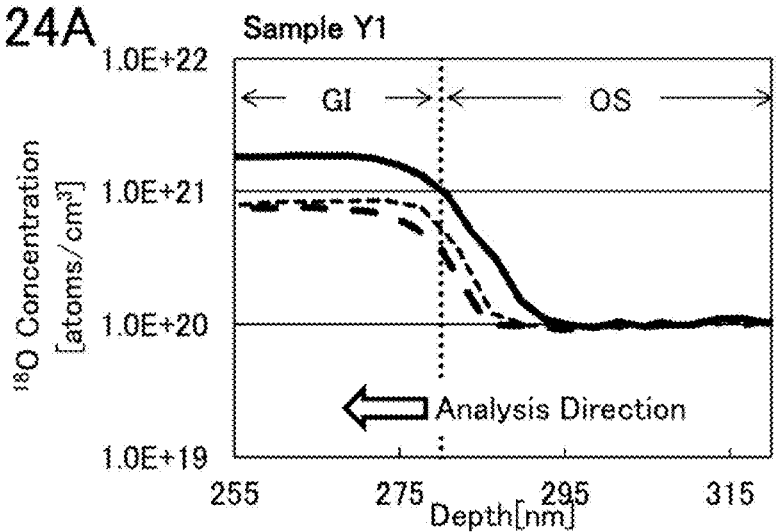
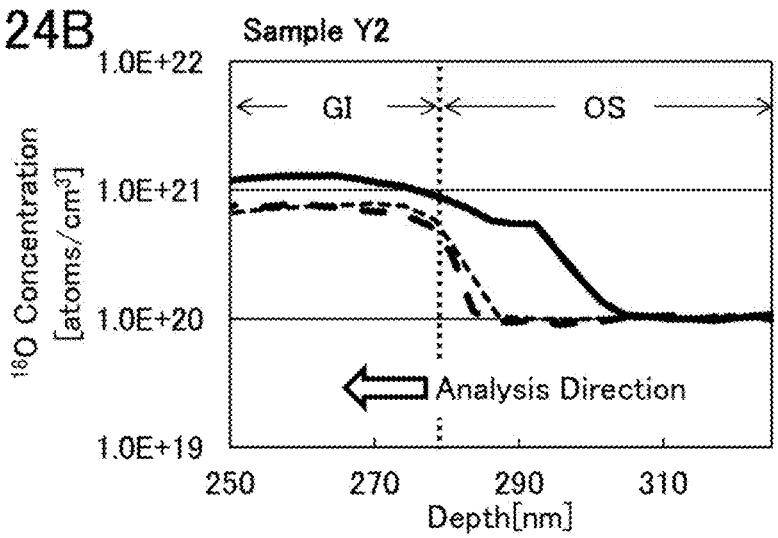
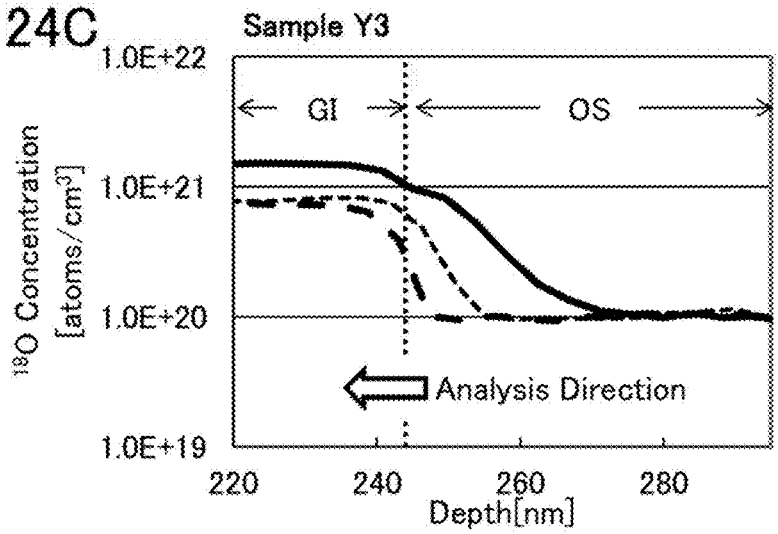

FIG. 34A
FIG. 34B
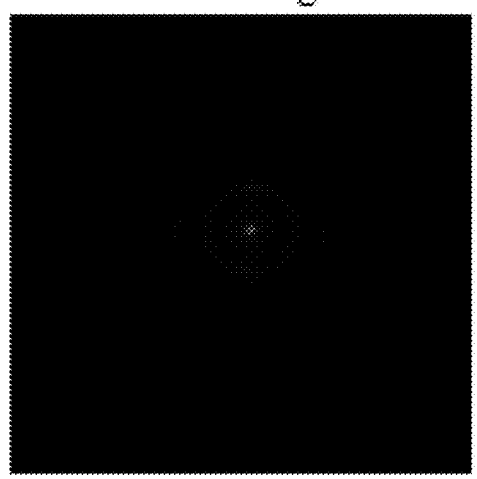
Raw Image
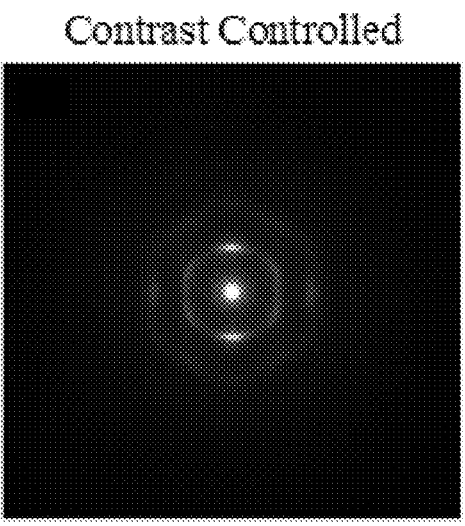
Contrast Controlled

FIG. 36

| | Line Profile | | $R = \dfrac{A - A'}{B - B', C - C'}$ | FWHM |
|---|---|---|---|---|
| | A–A' | B–B', C–C' | | |
| Single Crystal | (00$\bar{l}$), (00$l$) peaks | single peak | $R \gg 1$ | Small |
| only CAAC | (00$\bar{l}$), (00$l$) peaks | single peak | $R \gg 1$ | Relatively Small |
| CAAC + Nano-crystal | (00$\bar{l}$), (00$l$) peaks | nc, nc | $R > 1$ | Middle |
| Nano-crystal | nc, nc | nc, nc | $R = 1$ | Relatively Large |
| Amorphous | halo, halo | halo, halo | $R = 1$ or low intensity | Large |

FIG. 37A1
Sample X1 : 170°C, O₂=30%
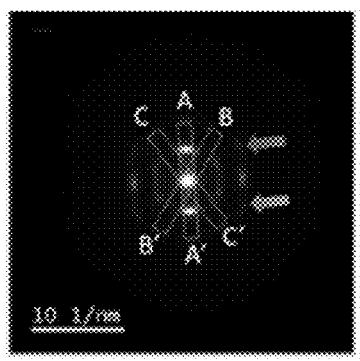
FIG. 37A2
Sample X1 : 170°C, O₂=30%
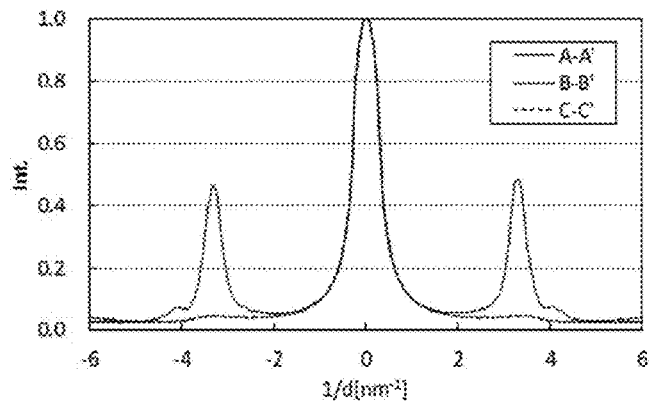
FIG. 37B1
Sample X2 : 130°C, O₂=10%
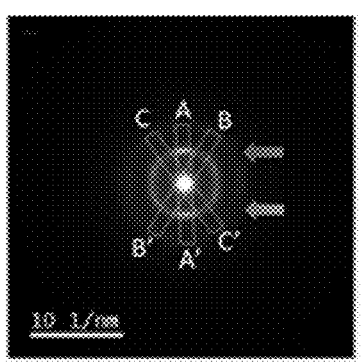
FIG. 37B2
Sample X2 : 130°C, O₂=10%
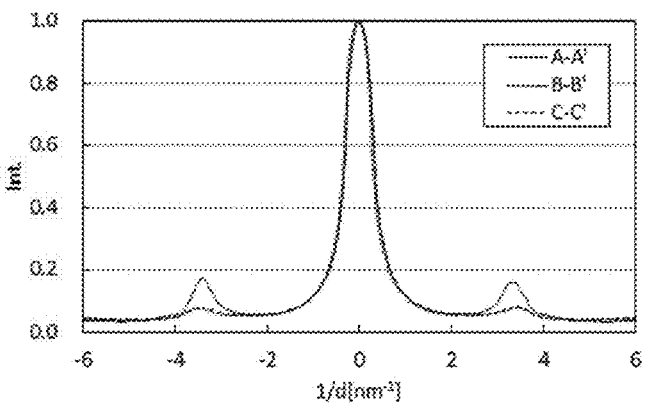
FIG. 37C1
Sample X3 : R.T., O₂=10%
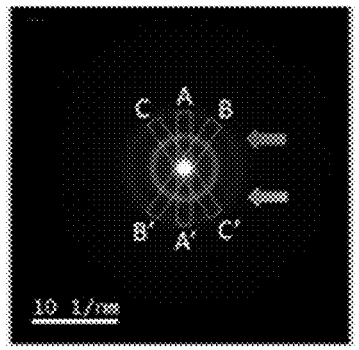
FIG. 37C2
Sample X3 : R.T., O₂=10%
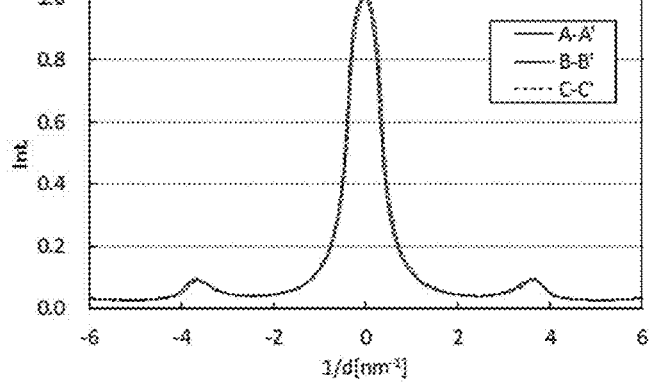

FIG. 39A1
Sample X1 : 170°C,O₂=30%
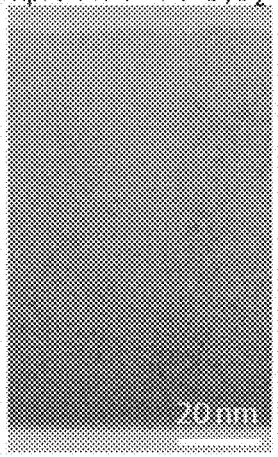
FIG. 39A2
Sample X1 : 170°C,O₂=30%
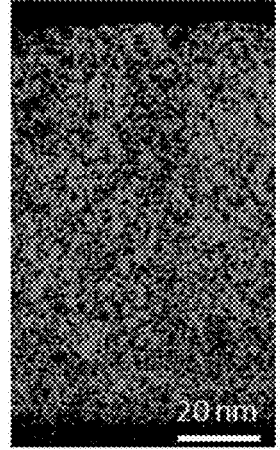
FIG. 39B1
Sample X2 : 130°C,O₂=10%
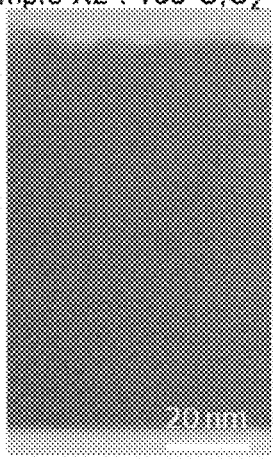
FIG. 39B2
Sample X2 : 130°C,O₂=10%
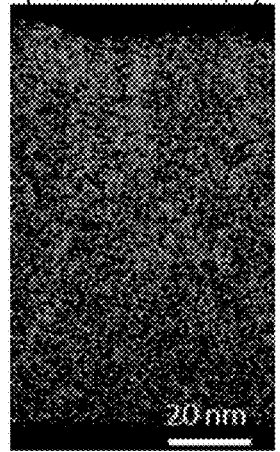
FIG. 39C1
Sample X3 : R.T.,O₂=10%
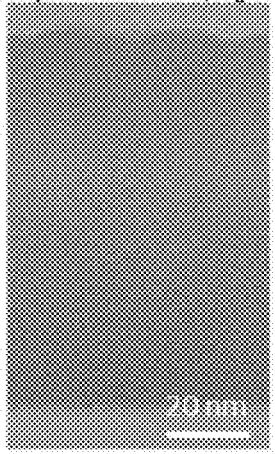
FIG. 39C2
Sample X3 : R.T.,O₂=10%
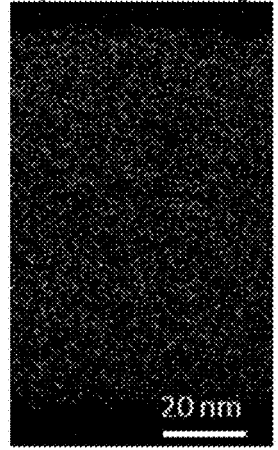

9100

9200

9101

9201

9102

9201

9201

SEMICONDUCTOR DEVICE AND DISPLAY DEVICE INCLUDING THE SEMICONDUCTOR DEVICE

BACKGROUND OF THE INVENTION

1. Field of the Invention

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition of matter. In particular, one embodiment of the present invention relates to a semiconductor device, a display device, a light-emitting device, a power storage device, a storage device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such a transistor is applied to a wide range of electronic devices such as an integrated circuit (IC) or an image display device (display device). A semiconductor material typified by silicon is widely known as a material for a semiconductor thin film that can be used for a transistor, and an oxide semiconductor has been attracting attention as well.

For example, Patent Document 1 discloses a technique to reduce the cell area by stacking a plurality of memory cells comprising a first transistor including an oxide semiconductor film and a second transistor including an oxide semiconductor film.

Patent Document 2 discloses a technique to reduce the area of a driver circuit portion in the vicinity of a pixel portion by stacking a first layer including the driver circuit portion for operating the plurality of pixels and a second layer including the pixel portion including a plurality of two-dimensionally arranged pixels.

REFERENCE

Patent Document

[Patent Document 1] Japanese Published Patent Application No. 2013-138191
[Patent Document 2] Japanese Published Patent Application No. 2015-194577

SUMMARY OF THE INVENTION

The layout area of transistors can be reduced by stacking a plurality of transistors as disclosed in Patent Documents 1 and 2. On the other hand, there is a problem in that the stacking of a plurality of transistors increases the number of masks or the number of steps.

In view of the above, an object of one embodiment of the present invention is to provide a semiconductor device including stacked transistors while increase in the number of masks or steps is suppressed. Another object of one embodiment of the present invention is to provide a semiconductor device with a reduced layout area of transistors. Another object of one embodiment of the present invention is to provide a highly reliable semiconductor device. Another object of one embodiment of the present invention is to provide a semiconductor device manufactured at low cost. Another object of one embodiment of the present invention is to provide a novel semiconductor device.

Note that the description of the above object does not disturb the existence of other objects. In one embodiment of the present invention, there is no need to achieve all the objects. Other objects are apparent from and can be derived from the description of the specification and the like.

One embodiment of the present invention is a semiconductor device including a first transistor and a second transistor over a substrate. The first transistor includes a first oxide semiconductor film, the second transistor includes a second oxide semiconductor film, and the first transistor includes an interlayer film.

The first oxide semiconductor film includes a first metal oxide film including a first crystal part and a second crystal part, the first crystal part has c-axis alignment, and the second crystal part has a lower degree of c-axis alignment than the first crystal part. An electron diffraction pattern of a cross section of the first metal oxide film includes a first region with a diffraction spot derived from the first crystal part and a second region with a diffraction spot derived from the second crystal part. The second oxide semiconductor film includes a second metal oxide film including a third crystal part and a fourth crystal part, the third crystal part has c-axis alignment, and the fourth crystal part has a lower degree of c-axis alignment than the third crystal part. An electron diffraction pattern of a cross section of the second metal oxide film includes a third region with a diffraction spot derived from the third crystal part and a fourth region with a diffraction spot derived from the fourth crystal part.

The ratio of an integrated intensity of luminance in the first region to an integrated intensity of luminance in the second region in the first oxide semiconductor film is higher than the ratio of an integrated intensity of luminance in the third region to an integrated intensity of luminance in the fourth region in the second oxide semiconductor film.

In the above structure, a source electrode or a drain electrode of the first transistor preferably includes a region located between the substrate and the second oxide semiconductor film.

In the above structure, the first oxide semiconductor film preferably includes a region located between the substrate and the second oxide semiconductor film.

In the above structure, the interlayer film preferably includes a region located between the substrate and the second oxide semiconductor film.

In the above structure, the atomic ratio of In to M and Zn of the oxide semiconductor films is [In]:[M]:[Zn]=4:2:3 or the neighborhood thereof, and when [In] is 4, [M] is preferably greater than or equal to 1.5 and less than or equal to 2.5 and [Zn] is preferably greater than or equal to 2 and less than or equal to 4. The atomic ratio of In to M and Zn of the first oxide semiconductor film may be different from that of the second oxide semiconductor film.

In the above structure, the field-effect mobility in a saturation region of the second transistor is preferably higher than the field-effect mobility in a saturation region of the first transistor. In addition, in any of the above structure, it is preferable that the $I_d$-$V_g$ characteristics of the transistor be measured when a voltage applied to the gate electrode is in a range from 3 V to 10 V and a voltage applied to the drain region is in a range from 10 V to 20 V.

Another embodiment of the present invention is a display device including the semiconductor device according to any one of the above structures and a light-emitting element.

Another embodiment of the present invention is a display module including the display device and a touch sensor. Another embodiment of the present invention is an electronic device including the semiconductor device according to any one of the above embodiments, the display device, or the display module; and an operation key or a battery.

According to one embodiment of the present invention, a semiconductor device including stacked transistors can be provided while increase in the number of masks or steps is suppressed. According to one embodiment of the present invention, a highly reliable semiconductor device including stacked transistors including oxide semiconductor films can be provided. According to one embodiment of the present invention, a semiconductor device including stacked transistors including oxide semiconductor films be provided at low manufacturing cost. According to one embodiment of the present invention, a novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 8A to 8C each illustrate $I_d$-$V_g$ characteristics of a transistor.

FIGS. 24A to 24C show SIMS measurement results of oxide semiconductor films.

FIGS. 34A and 34B show an electron diffraction pattern;

FIG. 36 is a conceptual view illustrating luminance profiles of electron diffraction patterns, relative luminance R of luminance profiles, and the half widths of the profiles.

FIGS. 37A1, 37A2, 37B1, 37B2, 37C1, and 37C2 show electron diffraction patterns and luminance profiles.

FIGS. 39A1, 39A2, 39B1, 39B2, 39C1, and 39C2 show cross-sectional TEM images of oxide semiconductor films and cross-sectional TEM images obtained through analysis thereof.

DETAILED DESCRIPTION OF THE INVENTION

Figure 1A:
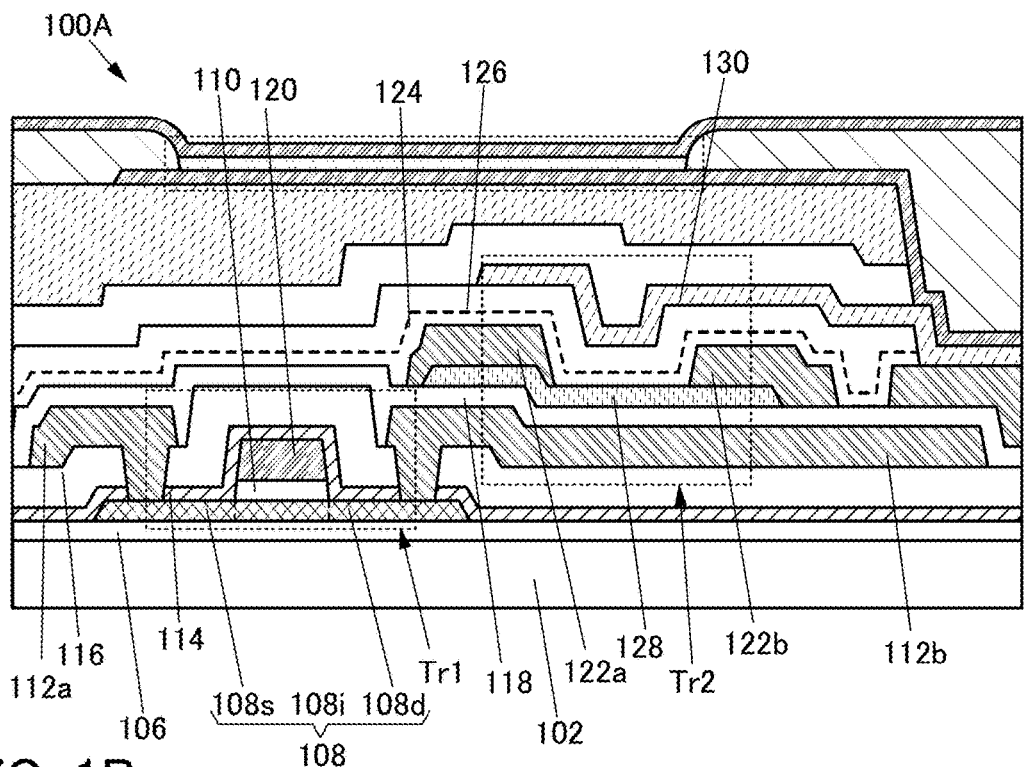
FIGS. 1A and 1B are cross-sectional views of semiconductor devices.
Figure 1B:
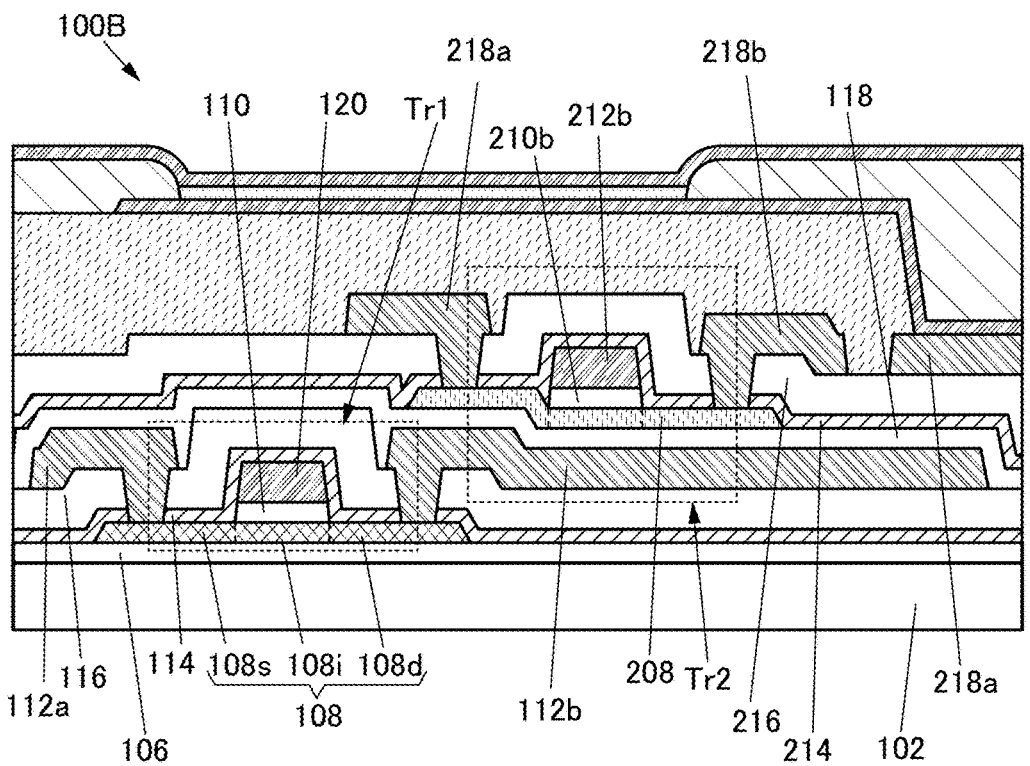
Figure 2A:
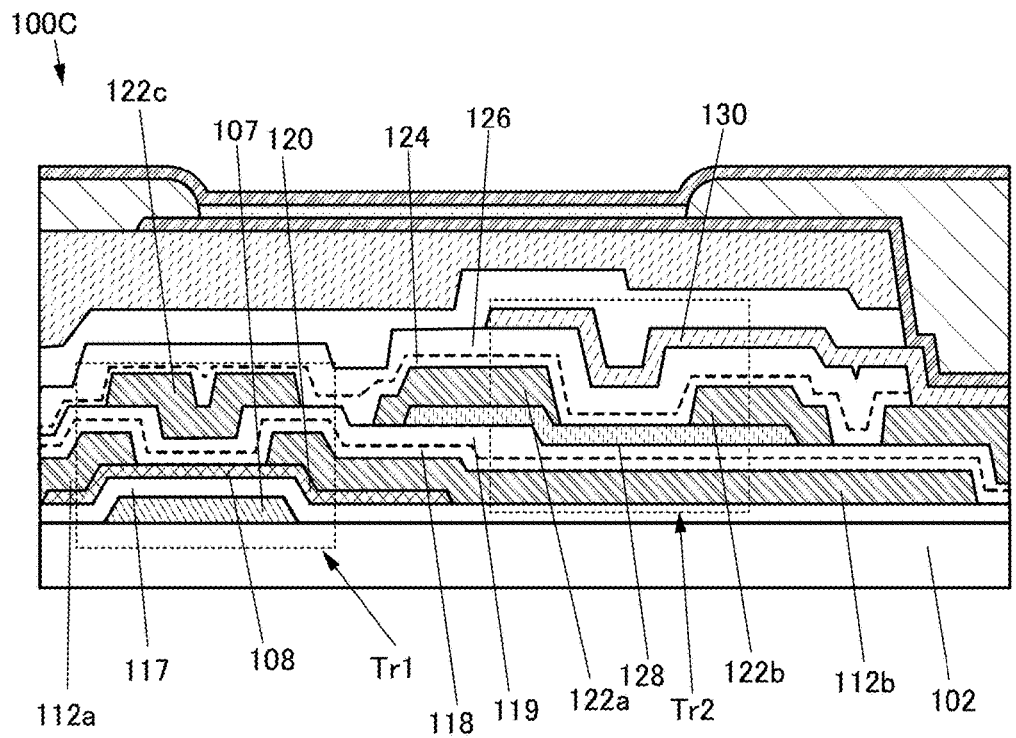
FIGS. 2A and 2B are cross-sectional views of semiconductor devices.
Figure 2B:
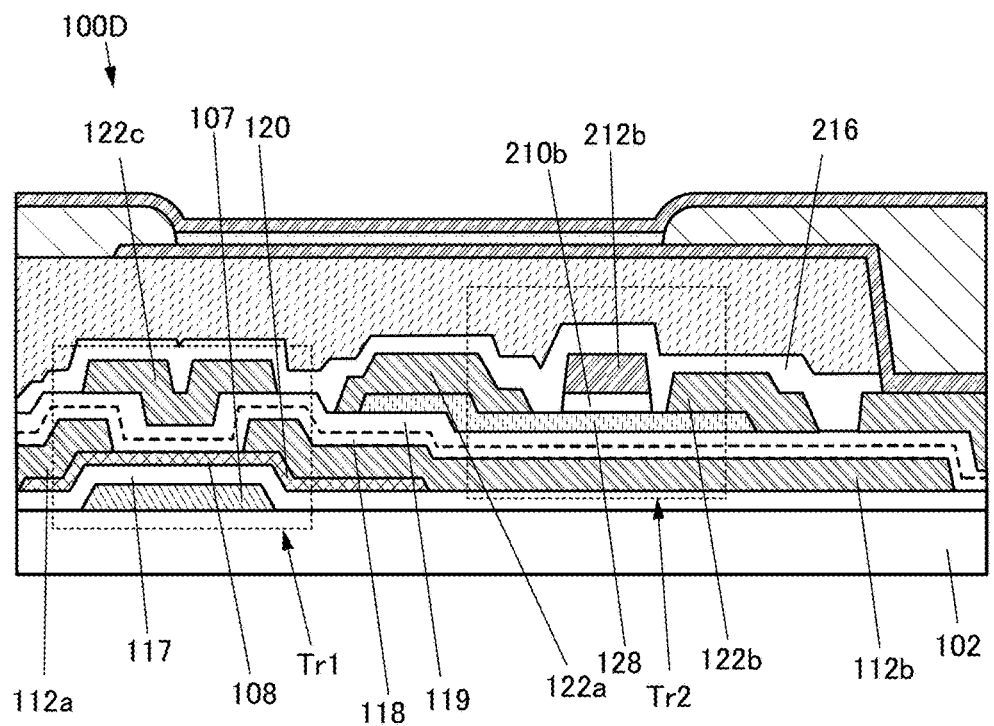

Hereinafter, embodiments will be described with reference to drawings. However, the embodiments can be implemented with various modes. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings schematically show ideal examples, and shapes or values are not limited to those shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. The positional relation between components is changed as appropriate in accordance with the direction in which each component is described. Thus, there is no limitation on terms used in this specification, and description can be made appropriately depending on the situation.

In this specification and the like, a transistor is an element having at least three terminals of a gate, a drain, and a source. The transistor has a channel region between the drain (a drain terminal, a drain region, or a drain electrode) and the source (a source terminal, a source region, or a source electrode), and current can flow between the source and the drain through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be interchanged with each other in this specification and the like.

Note that in this specification and the like, the term "electrically connected" includes the case where components are connected through an object having any electric function. There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°. Thus, the case where the angle is greater than or equal to 85° and less than or equal to 95° is also included.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Unless otherwise specified, off-state current in this specification and the like refers to drain current of a transistor in an off state (also referred to as a non-conducting state and a cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is $1\times10^{-9}$ A at a voltage $V_{gs}$ of 0.5 V, $1\times10^{-13}$ A at a voltage $V_{gs}$ of 0.1 V, $1\times10^{-19}$ A at a voltage $V_{gs}$ of −0.5 V, and $1\times10^{-22}$ A at a voltage $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to I" may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which the required reliability of a semiconductor device or the like including the transistor is ensured, or $V_{ds}$ at which the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$-$\sqrt{I_d}$ characteristics). Alternatively, the threshold voltage of a transistor may refer to a gate voltage ($V_g$) at which the value of $I_d$ [A]×L [μm]/W [μm] is $1\times10^{-9}$ [A] where L is channel length and W is channel width.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification and the like can be called a "semiconductor" in some cases.

In this specification and the like, an impurity in a semiconductor refers to an element that is not a main component of the semiconductor film. For example, an element with a concentration of lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of an impurity which changes the characteristics of the semiconductor include Group 1 elements, Group 2 elements, Group 14 elements, Group 15 elements, and transition metals other than the main components; specific examples are hydrogen (included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor includes silicon, examples of an impurity which changes the characteristics of the semiconductor include oxygen, Group 1 elements except hydrogen, Group 2 elements, Group 13 elements, and Group 15 elements.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated. CAAC refers to an example of a crystal structure, and CAC refers to an example of a function or a material composition.

An example of a crystal structure of an oxide semiconductor or a metal oxide is described. Note that an oxide semiconductor formed by a sputtering method using an In—Ga—Zn oxide target (In:Ga:Zn=4:2:4.1 [atomic ratio]) is described below as an example. An oxide semiconductor formed by a sputtering method using the above-mentioned target at a substrate temperature of higher than or equal to 100° C. and lower than or equal to 130° C. is referred to as sIGZO, and an oxide semiconductor formed by a sputtering method using the above-mentioned target with the substrate temperature set at room temperature (R.T.) is referred to as tIGZO. For example, sIGZO has one or both crystal structures of nano crystal (nc) and CAAC. Furthermore, tIGZO has a crystal structure of nc. Note that room temperature (R.T.) herein also refers to a temperature of the time when a substrate is not heated intentionally.

In this specification and the like, CAC-OS or CAC-metal oxide has a function of a conductor in a part of the material and has a function of a dielectric (or insulator) in another part of the material; as a whole, CAC-OS or CAC-metal oxide has a function of a semiconductor. In the case where CAC-OS or CAC-metal oxide is used in an active layer of a transistor, the conductor has a function of letting electrons (or holes) serving as carriers flow, and the dielectric has a function of not letting electrons serving as carriers flow. By the complementary action of the function as a conductor and the function as a dielectric, CAC-OS or CAC-metal oxide can have a switching function (on/off function). In the CAC-OS or CAC-metal oxide, separation of the functions can maximize each function.

In this specification and the like, CAC-OS or CAC-metal oxide includes conductor regions and dielectric regions. The conductor regions have the above-described function of the conductor, and the dielectric regions have the above-described function of the dielectric. In some cases, the conductor regions and the dielectric regions in the material are separated at the nanoparticle level. In some cases, the conductor regions and the dielectric regions are unevenly distributed in the material. When observed, the conductor regions are coupled in a cloud-like manner with their boundaries blurred, in some cases.

In other words, CAC-OS or CAC-metal oxide can be called a matrix composite or a metal matrix composite.

Furthermore, in the CAC-OS or CAC-metal oxide, the conductor regions and the dielectric regions each have a size of more than or equal to 0.5 nm and less than or equal to 10 nm, preferably more than or equal to 0.5 nm and less than or equal to 3 nm and are dispersed in the material, in some cases.

Embodiment 1

In this embodiment, a semiconductor device that is one embodiment of the present invention and a method of manufacturing the semiconductor device are described with reference to FIGS. 1A and 1B, FIGS. 2A and 2B, FIGS. 3A and 3B, FIGS. 4A and 4B, FIGS. 5A and 5B, FIG. 6, FIG. 7, FIGS. 8A to 8C, FIG. 9, FIG. 10, FIG. 11, FIGS. 12A and 12B, FIGS. 13A and 13B, FIGS. 14A and 14B, FIGS. 15A and 15B, FIGS. 16A and 16B, FIGS. 17A and 17B, FIGS. 18A and 18B, FIGS. 19A and 19B, FIGS. 20A and 20B, FIGS. 21A and 21B, FIGS. 22A and 22B, and FIGS. 23A and 23B.

<1-1. Structure Example 1 of Semiconductor Device>

Cross-sectional views of semiconductor devices 100A, 100B, 100C, and 100D of one embodiment of the present invention are shown (see FIGS. 1A and 1B and FIGS. 2A and 2B). The semiconductor devices 100A, 100B, 100C, and 100D each include a transistor Tr1 and a transistor Tr2.

The transistor Tr1 and the transistor Tr2 of the semiconductor device 100A are a top-gate transistor and a bottom-gate transistor, respectively. The transistor Tr1 and the transistor Tr2 of the semiconductor device 100B are top-gate transistors. The transistor Tr1 and the transistor Tr2 of the semiconductor device 100C are bottom-gate transistors. The transistor Tr1 and the transistor Tr2 of the semiconductor device 100D are a bottom-gate transistor and a top-gate transistor, respectively.

In the semiconductor devices 100A, 100B, 100C, and 100D, the transistors Tr1 and Tr2 each include an oxide semiconductor film. The oxide semiconductor films each include a metal oxide including In, M (M is Al, Ga, Y, or Sn), and Zn. The proportion of crystal parts with c-axis alignment in the oxide semiconductor film of the transistor Tr1 is larger than that in the oxide semiconductor film of the transistor Tr2, which will be described later. In other words, regardless of the transistor shape, the oxide semiconductor film of the transistor Tr1 has different crystallinity from the oxide semiconductor film of the transistor Tr2 in the semiconductor device of one embodiment of the present invention. Alternatively, part of the oxide semiconductor film in which a channel region is formed in the transistor Tr1 has different crystallinity from part of the oxide semiconductor film in which a channel region is formed in the transistor Tr2.

In the semiconductor devices 100A and 100B, the transistor Tr1 includes an insulating film 106 over a substrate 102, an oxide semiconductor film 108 over the insulating film 106, an insulating film 110 over the oxide semiconductor film 108, a conductive film 120 over the insulating film 110, and an insulating film 114 over the insulating film 106, the oxide semiconductor film 108, and the conductive film 120. The oxide semiconductor film 108 includes a channel region 108$i$ overlapping with the conductive film 120 and in contact with the insulating film 110, a source region 108$s$ in contact with the insulating film 114, and a drain region 108$d$ in contact with the insulating film 114.

In addition, the transistor Tr1 includes an insulating film 116 over the insulating film 114, a conductive film 112$a$ electrically connected to the source region 108$s$ of the oxide semiconductor film 108 via an opening provided in the insulating films 114 and 116, a conductive film 112$b$ electrically connected to the drain region 108$d$ of the oxide semiconductor film 108 via an opening provided in the insulating films 114 and 116, and an insulating film 118 over the insulating film 116 and the conductive films 112$a$ and 112$b$.

The transistor Tr2 of the semiconductor device 100A includes the conductive film 112$b$, the insulating film 118 over the conductive film 112$b$, an oxide semiconductor film 128 over the insulating film 118, a conductive film 122$a$ over the oxide semiconductor film 128, a conductive film 122$b$ over the oxide semiconductor film 128, an insulating film 124 over the oxide semiconductor film 128 and the conductive films 122$a$ and 122$b$, an insulating film 126 over the insulating film 124, and a conductive film 130 over the insulating film 126. Thus, the conductive film 112$b$ and the conductive film 130 can serve as gate electrodes of the transistor Tr2. In that case, the conductive film 112$b$ can serve as a back gate electrode.

The transistor Tr2 of the semiconductor device 100B includes the conductive film 112b, the insulating film 118 over the conductive film 112b, an oxide semiconductor film 208 over the insulating film 118, an insulating film 210b over the oxide semiconductor film 208, a conductive film 212b over the insulating film 210b, an insulating film 214 over the oxide semiconductor film 208, the conductive film 212b, and the insulating film 118, an insulating film 216, and conductive films 218a and 218b. Thus, the conductive film 112b and the conductive film 212b can serve as gate electrodes of the transistor Tr2. In that case, the conductive film 112b can serve as back gate electrode.

In the semiconductor devices 100C and 100D, the transistor Tr1 includes a conductive film 107 over the substrate 102, an insulating film 117 over the conductive film 107, the oxide semiconductor film 108 over the insulating film 117, the conductive films 112a and 112b electrically connected to the oxide semiconductor film 108, the insulating film 118, and an insulating film 119.

The transistor Tr2 of the semiconductor device 100C includes the conductive film 112b, the insulating films 118 and 119 over the conductive film 112b, the oxide semiconductor film 128 over the insulating film 119, the conductive film 122a over the oxide semiconductor film 128, the conductive film 122b over the oxide semiconductor film 128, the insulating film 124, the insulating film 126 over the insulating film 124, and the conductive film 130 over the insulating film 126. Thus, the conductive film 112b and the conductive film 130 can serve as gate electrodes of the transistor Tr2. In that case, the conductive film 112b can serve as a back gate electrode.

The transistor Tr2 of the semiconductor device 100D includes the conductive film 112b, the insulating films 118 and 119 over the conductive film 112b, the oxide semiconductor film 128 over the insulating film 119, the conductive film 122a over the oxide semiconductor film 128, the insulating film 210b over the oxide semiconductor film 128, the conductive film 212b over the insulating film 210b, and the insulating film 216. Thus, the conductive film 112b and the conductive film 212b can serve as gate electrodes of the transistor Tr2. In that case, the conductive film 112b can serve as a back gate electrode.

In the semiconductor devices 100C and 100D, a conductive film 122c which is formed at the same time as the conductive film 122a overlaps with the oxide semiconductor film 108 of the transistor Tr1. Thus, the conductive film 107 and the conductive film 122c can serve as gate electrodes of the transistor Tr1. In that case, the conductive film 122c can serve as a back gate electrode.

In the semiconductor devices 100A, 100B, 100C, and 100D, the oxide semiconductor film of the transistor Tr1 and the oxide semiconductor film of the transistor Tr2 partly overlap with each other. Since the transistor Tr1 and the transistor Tr2 at least partly overlap with each other, the layout area of the transistors can be reduced. Note that it is preferable that the channel region formed in the oxide semiconductor film of the transistor Tr1 and the channel region formed in the oxide semiconductor film of the transistor Tr2 not overlap with each other.

Figure 3A:
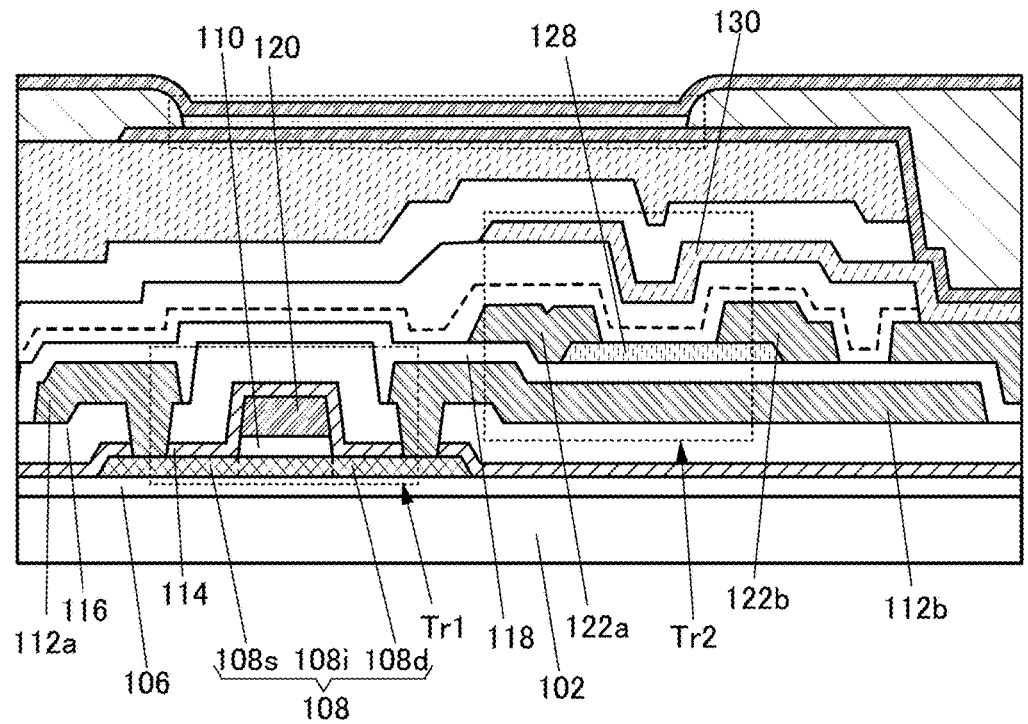
FIGS. 3A and 3B are cross-sectional views of semiconductor devices.
Figure 3B:
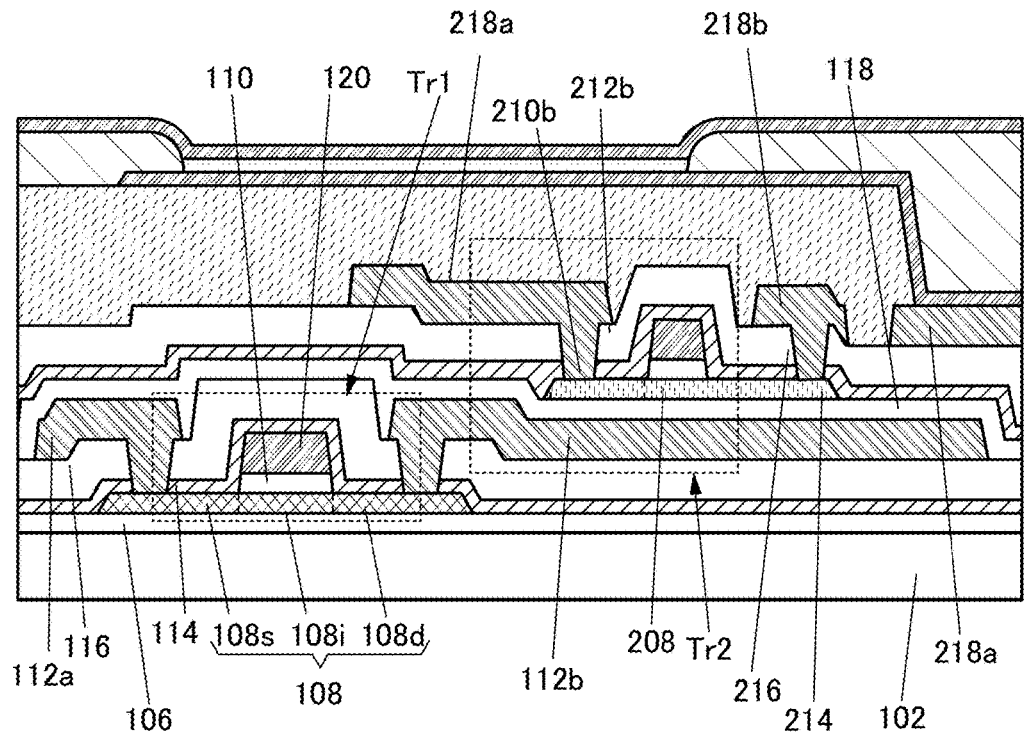

FIG. 3A illustrates a semiconductor device 100E which includes the transistor Tr1 and the transistor Tr2, like the semiconductor device 100A. Note that the semiconductor device 100E is different from the semiconductor device 100A in that the oxide semiconductor films of the transistors Tr1 and Tr2 do not overlap with each other. Part of the conductive film 112b and the oxide semiconductor film of the transistor Tr2 overlap with each other. In addition, part of the conductive film 112b and part of the conductive film 122a overlap with each other. The same goes for the transistors Tr1 and Tr2 of a semiconductor device 100F with respect to the transistors Tr1 and Tr2 of the semiconductor device 100B (see FIG. 3B). The semiconductor devices 100C and 100D may each have a structure in which the oxide semiconductor film of the transistor Tr1 and the oxide semiconductor film of the transistor Tr2 do not overlap with each other. When the limit of reduction in the line width with light exposure is taken into consideration, the transistor area in such a layout is small as compared to that in the case where a distance between wirings is secured in the plan view.

Assuming that the insulating films 116 and 118 in the semiconductor devices 100A and 100B and the insulating films 117, 118, and 119 in the semiconductor devices 100C and 100D include films which are less permeable to hydrogen, when the substrate 102 is formed of a material which is likely to release hydrogen, the amount of hydrogen diffusing into the oxide semiconductor film of the transistor Tr2 can be smaller than the amount of hydrogen diffusing into the oxide semiconductor film of the transistor Tr1. That is, even a transistor whose threshold voltage is more likely to change owing to diffusion of hydrogen than that of the transistor Tr1 can be used as the transistor Tr2.

Figure 4A:
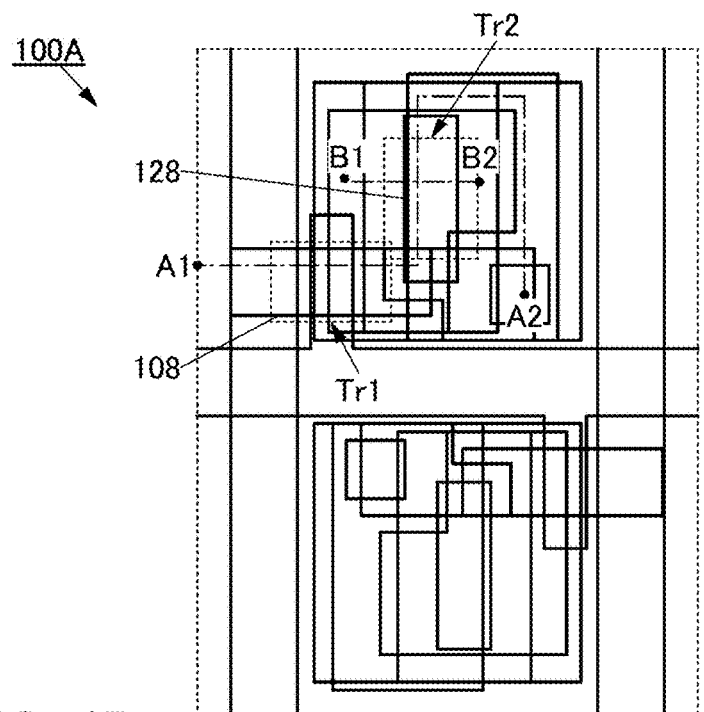
FIGS. 4A and 4B are a top view and a cross-sectional view of a semiconductor device.
Figure 4B:
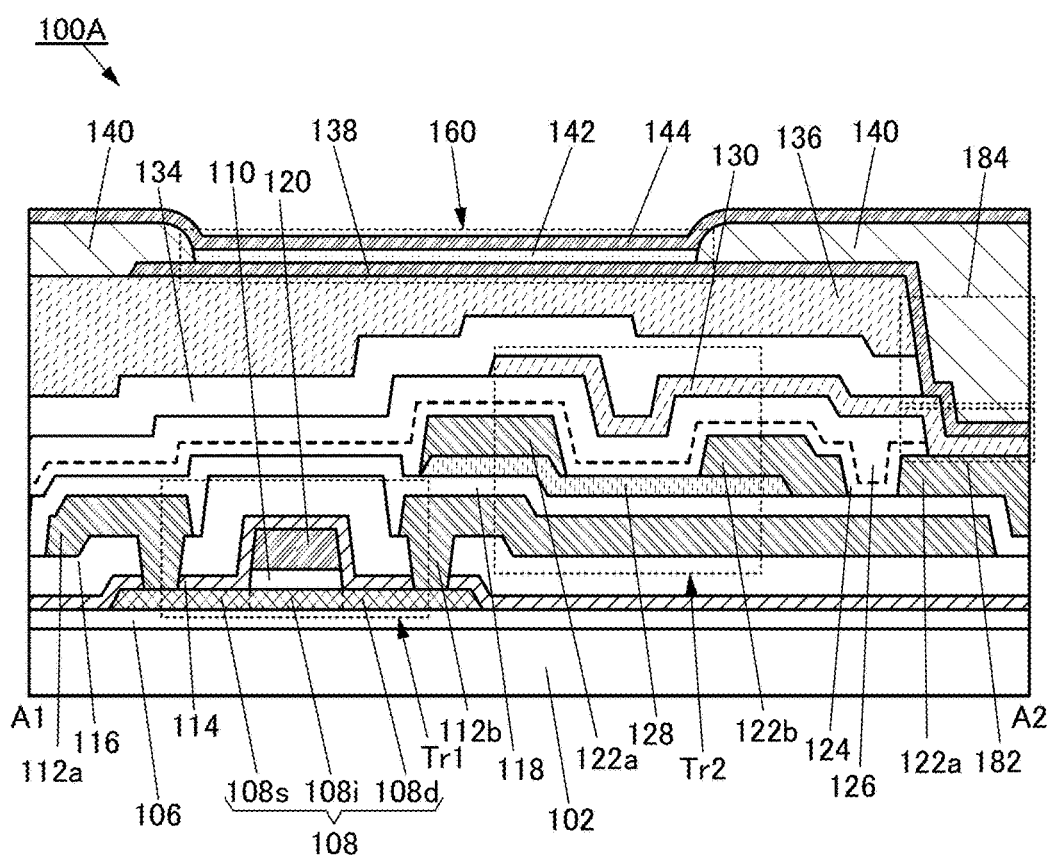

FIG. 4A is a top view of the semiconductor device 100A of one embodiment of the present invention. FIG. 4B is a cross-sectional view of the semiconductor device 100A taken along a dashed dotted line A1-A2 in FIG. 4A. Note that cross sections in a channel length (L) direction of the transistor Tr1 and in a channel length (L) direction of the transistor Tr2 are included in FIG. 4B.

Note that some components (e.g., an insulating film serving as a gate insulating film) of the semiconductor device 100A and some reference numerals of components are not illustrated in FIG. 4A to avoid complexity. Note that some components and some reference numerals of components are not illustrated as in FIG. 4A in some cases in top views of semiconductor devices described below.

The semiconductor devices 100B, 100C, 100D, 100E, and 100F, which have different structures from the semiconductor device 100A, can also have a layout shown in FIG. 4A like the semiconductor device 100A.

In one embodiment of the present invention, the field-effect mobility of the transistor Tr1 is different from that of the transistor Tr2. In $I_d$-$V_g$ measurement, the field-effect mobility in a saturation region of the transistor Tr2 is higher than that of the transistor Tr1. In addition, the deposition temperature for the oxide semiconductor film of the transistor Tr1 is higher than the deposition temperature for the oxide semiconductor film of the transistor Tr2, details of which will be described later. A difference between a minimum value and a maximum value of the field-effect mobility in the saturation region of the transistor Tr2 is preferably less than or equal to 15 cm$^2$/Vs in the $I_d$-$V_g$ measurement.

In any of the semiconductor devices 100A, 100B, 100C, 100D, 100E, and 100F in this embodiment, the field-effect mobility in the saturation region of the transistor Tr2 is higher than that of the transistor Tr1. That is, one embodiment of the present invention can employ any of the structures of the semiconductor devices 100A, 100B, 100C, and 100D. Alternatively, one embodiment of the present invention can employ the structure of the semiconductor device 100E or 100F, in which the oxide semiconductor film of the transistor Tr1 and the oxide semiconductor film of the transistor Tr2 do not overlap with each other.

If the channel region of the transistor Tr1 and the channel region of the transistor Tr2 overlap with each other, when one of the transistors is active, it might adversely affect the other. In order to avoid the adverse effect, a structure in which the distance between the transistor Tr1 and the transistor Tr2 is increased, a structure in which a conductive film is provided between the transistor Tr1 and the transistor Tr2, or the like can be used. However, the thickness of the semiconductor device is increased when the former structure is used. Thus, for example, when the semiconductor device 100A is formed over a flexible substrate or the like, a problem might arise in the bendability and the like. When the latter structure is used, there is a problem in that a step of forming the conductive film is needed and the thickness of the semiconductor device is increased.

When each of the oxide semiconductor films 108 and 128 includes a region in which the atomic proportion of In is larger than the atomic proportion of M, the field-effect mobilities of the transistor Tr1 and the transistor Tr2 can be increased.

For example, the use of the transistor with high field-effect mobility in a gate driver that is included in a display device and generates a gate signal allows the display device to have a narrow frame. When the transistor with high field-effect mobility is used for a source driver (specifically, a demultiplexer connected to an output terminal of a shift register included in the source driver) that supplies a signal from a signal line included in a display device, the number of wirings connected to the display device can be reduced. In addition, when the transistor with high field-effect mobility is used as one or both of a selection transistor and a driver transistor of a pixel circuit included in the display device, the display quality of the display device can be increased.

The semiconductor device 100A shown in FIGS. 4A and 4B can be favorably used for a pixel circuit of a display device. The layout shown in FIGS. 4A and 4B can increase the pixel density of the display device. For example, even when the pixel density of a display device exceeds 1000 ppi (pixel per inch) or 2000 ppi, the aperture ratio of pixels can be high owing to the structure shown in FIGS. 4A and 4B. Note that ppi is a unit for describing the number of pixels per inch.

A difference between the oxide semiconductor films 108 and 128 is described below using the structure of the semiconductor device 100A as an example. In particular, the field-effect mobility in a saturation region of the transistor in $I_d$-$V_g$ measurement is described.

<1-2. Field-Effect Mobility in Saturation Region>

First, general characteristics of a transistor are described with reference to FIGS. 5A and 5B and FIG. 6.

[$I_d$-$V_g$ Characteristics of Transistor]

Drain current-gate voltage characteristics ($I_d$-$V_g$ characteristics) of a transistor are described. FIG. 5A illustrates an example of $I_d$-$V_g$ characteristics of the transistor. FIG. 5A shows the case where polycrystalline silicon is used for an active layer of the transistor for easy understanding. In FIG. 5A, the vertical axis and the horizontal axis represent $I_d$ and $V_g$, respectively.

Figure 5A:
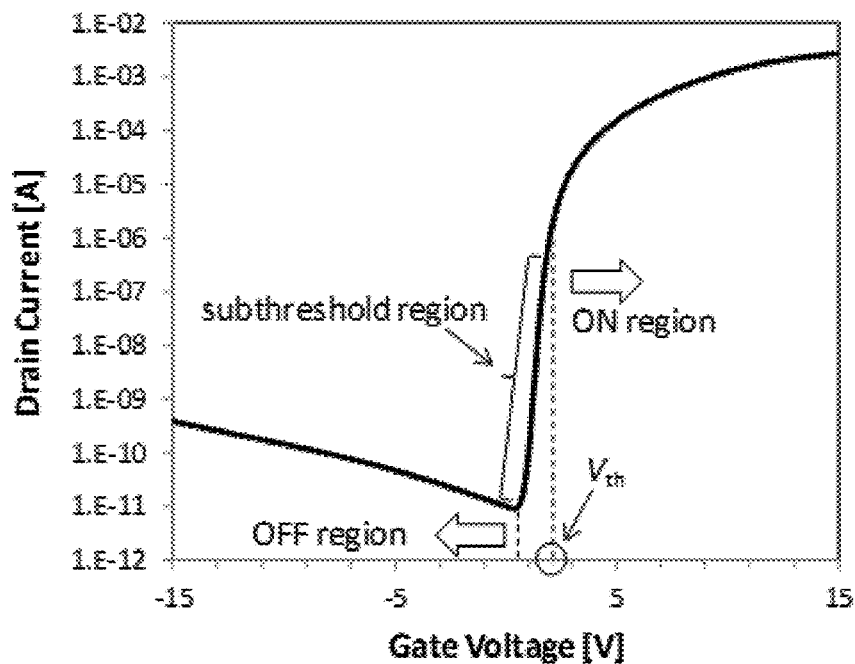
FIGS. 5A and 5B show $I_d$-$V_g$ characteristics and $I_d$-$V_d$ characteristics of a transistor.

As illustrated in FIG. 5A, $I_d$-$V_g$ characteristics are broadly divided into three regions. A first region, a second region, and a third region are referred to as an off region (OFF region), a subthreshold region, and an on region (ON region), respectively. A gate voltage at a boundary between the subthreshold region and the on region is referred to as a threshold voltage ($V_{th}$).

To obtain favorable characteristics of the transistor, it is preferable that the drain current in the off region (also referred to as off-state current or $I_{off}$) be low and the drain current in the on region (also referred to as on-state current or $I_{on}$) be high. As an index of the on-state current of the transistor, the field-effect mobility is often used. The details of the field-effect mobility are described later.

To drive the transistor at a low voltage, the slope of the $I_d$-$V_g$ characteristics in the subthreshold region is preferably steep. An index of the degree of change in the $I_d$-$V_g$ characteristics in the subthreshold region is referred to as subthreshold swing (SS) or an S value. The S value is represented by the following formula (1).

[Formula 1]

$$SS = \min\left(\frac{\partial V_g}{\partial \log_{10}(I_d)}\right) \quad (1)$$

The S value is a minimum value of the amount of change in gate voltage which is needed for changing a drain current by an order of magnitude in the subthreshold region. As the S value is smaller, switching operation between on and off states can be performed rapidly.

[$I_d$-$V_d$ Characteristics of Transistor]

Next, drain current-drain voltage characteristics ($I_d$-$V_d$ characteristics) of a transistor are described. FIG. 5B illustrates an example of $I_d$-$V_d$ characteristics of the transistor. In FIG. 5B, the vertical axis and the horizontal axis represent $I_d$ and $V_d$, respectively.

Figure 5B:
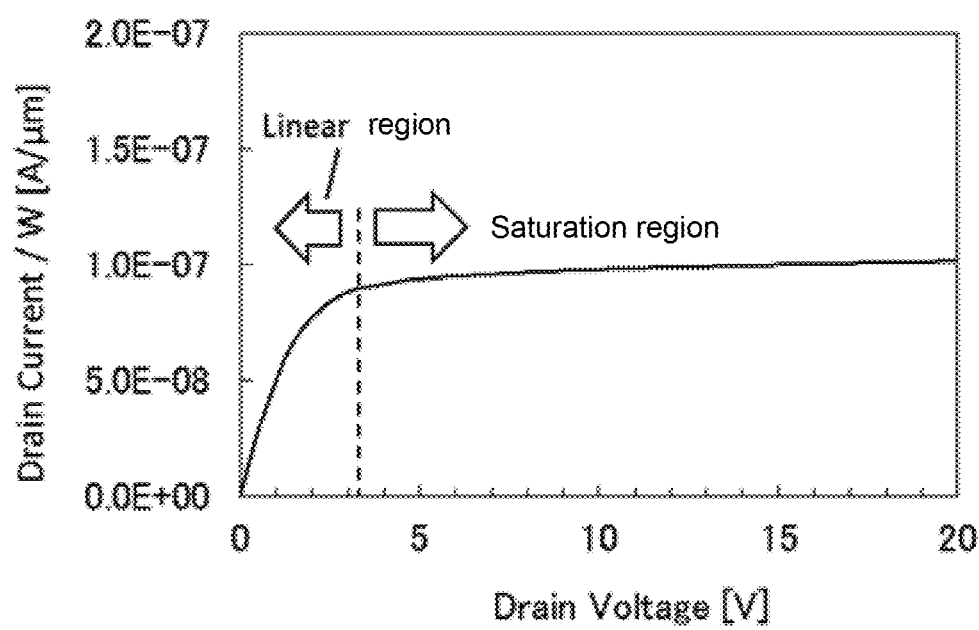

As illustrated in FIG. 5B, the on region is further divided into two regions. A first region and a second region are referred to as a linear region and a saturation region, respectively. In the linear region, drain current increases in a parabola shape in accordance with the increase in drain voltage. On the other hand, in the saturation region, drain current does not greatly change even when drain voltage changes. According to a vacuum tube, the linear region and the saturation region are referred to as a triode region and a pentode region in some cases.

The linear region indicates the state where $V_g$ is higher than $V_d$ ($V_d<V_g$) in some cases. The saturation region indicates the state where $V_d$ is higher than $V_g$ ($V_g<V_d$) in some cases. However, in practice, the threshold voltage of the transistor needs to be considered. Thus, the state where a value obtained by subtracting the threshold voltage of the transistor from the gate voltage is higher than the drain voltage ($V_d<V_g-V_{th}$) is referred to as the linear region in some cases. Similarly, the state where a value obtained by subtracting the threshold voltage of the transistor from the gate voltage is lower than the drain voltage ($V_g-V_{th}<V_d$) is referred to as the saturation region in some cases.

The $I_d$-$V_d$ characteristics of the transistor with which current in the saturation region is constant are expressed as "favorable saturation" in some cases. The favorable saturation of the transistor is important particularly when the transistor is used in an organic EL display. For example, a transistor with favorable saturation is used as a transistor of a pixel of an organic EL display, whereby a change in luminance of the pixel can be suppressed even when the drain voltage is changed.

[Analysis Model of Drain Current]

Next, an analysis model of the drain current is described. As the analysis model of the drain current, analytic formulae of drain current based on gradual channel approximation (GCA) is known. On the basis of GCA, the drain current of the transistor is represented by the following formula (2).

[Formula 2]

$$I_d = \begin{cases} \mu \frac{W}{L} C_{OX} \left[ (V_g - V_{th})V_d - \frac{1}{2}V_d^2 \right] & \ldots (V_g - V_{th} > V_d) \\ \mu \frac{W}{2L} C_{OX} (V_g - V_{th})^2 & \ldots (V_g - V_{th} \leq V_d) \end{cases} \quad (2)$$

In the formula (2), the upper formula is a formula for drain current in a linear region and the lower formula is a formula for drain current in a saturation region.

[Field-Effect Mobility]

Next, field-effect mobility is described. As an index of current drive capability of a transistor, the field-effect mobility is used. As described above, the on region of the transistor is divided into the linear region and the saturation region. From the characteristics in the regions, the field-effect mobility of the transistor can be calculated on the basis of the analytic formulae of the drain current based on GCA. The field-effect mobility in the linear region and the field-effect mobility in the saturation region are referred to as linear mobility and saturation mobility, respectively, when they need to be distinguished from each other. The linear mobility is represented by the following formula (3) and the saturation mobility is represented by the following formula (4).

[Formula 3]

$$\mu_{FE}^{lin} = \frac{L}{WC_{OX}} \frac{\partial I_d}{\partial V_g} \frac{1}{V_d} \quad (3)$$

[Formula 4]

$$\mu_{FE}^{sat} = \frac{2L}{WC_{OX}} \left( \frac{\partial \sqrt{I_d}}{\partial V_g} \right)^2 \quad (4)$$

In this specification and the like, curves calculated from the formula (3) and the formula (4) are referred to as mobility curves. FIG. 6 shows mobility curves calculated from the analytic formulae of drain current based on GCA. In FIG. 6, the $I_d$-$V_g$ characteristics of the transistor and the mobility curves of the linear mobility and the saturation mobility overlap with each other.

Figure 6:
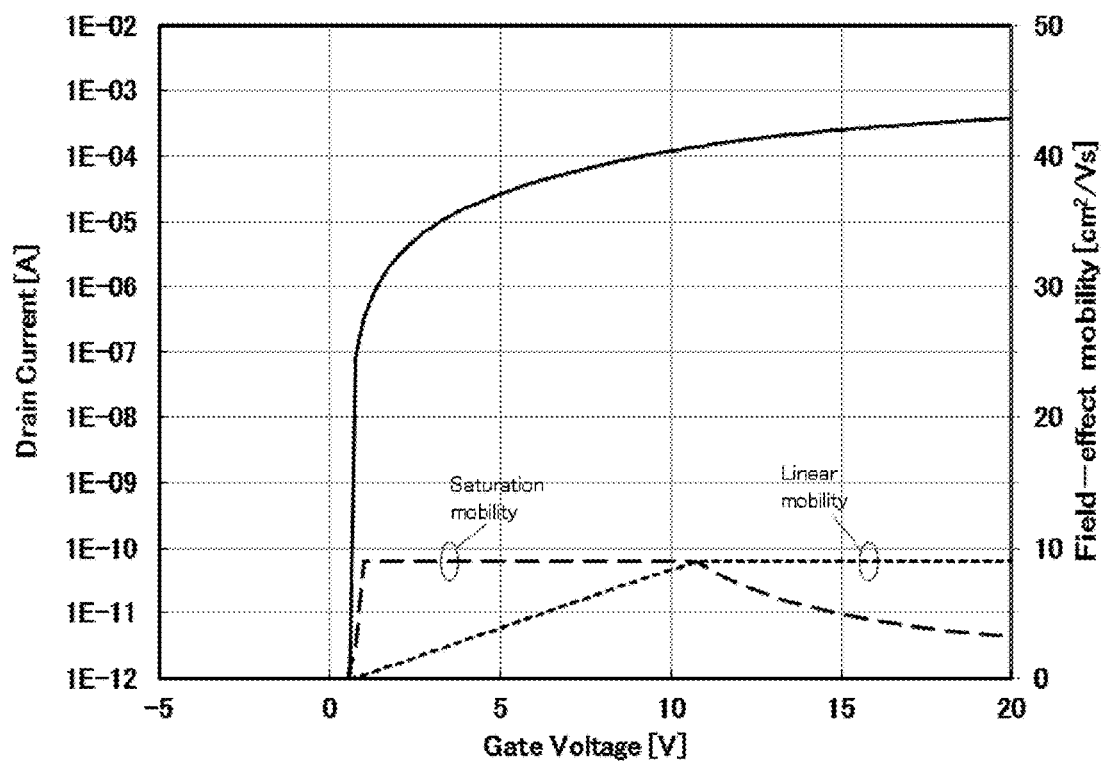
FIG. 6 shows $I_d$-$V_g$ characteristics and linear and saturation mobility curves which are calculated with GCA.

In FIG. 6, the $I_d$-$V_g$ characteristics are calculated from the analytic formulae of drain current based on GCA. The shapes of the mobility curves can be a lead to understanding the state of the inside of the transistor.

For example, the shape of the curve of the saturation mobility in FIG. 6 is focused on. When the gate voltage increases, carriers (electrons or holes) of the transistor are accelerated by an electric field to gain energy. Thus, the carriers gain certain speed by an electric field, and the saturation mobility is increased. However, the carriers are not accelerated limitlessly, and collide with thermally vibrating interstitial atoms, ionized impurity atoms, or the like to lose energy; as a result, the saturation mobility is gradually decreased.

[Formation of Transistors]

Next, transistors each including an oxide semiconductor film were formed, and the electrical characteristics of the transistors were evaluated.

Figure 7:
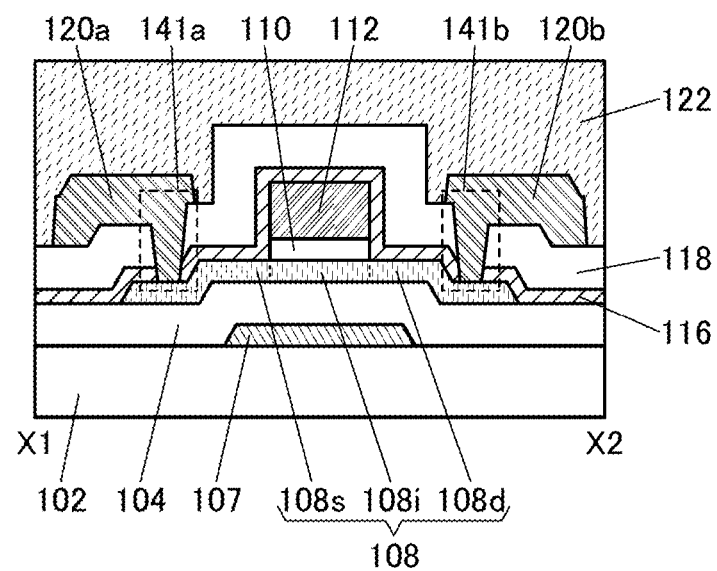
FIG. 7 is a cross-sectional view illustrating a transistor.

A transistor illustrated in FIG. 7 includes the conductive film 107 over the substrate 102, an insulating film 104 over the conductive film 107; the oxide semiconductor film 108 over the insulating film 104; the insulating film 110 over the oxide semiconductor film 108; a conductive film 112 over the insulating film 110; and the insulating film 116 over the insulating film 104, the oxide semiconductor film 108, and the conductive film 112. Note that the oxide semiconductor film 108 includes the channel region 108i which overlaps with the conductive film 112, the source region 108s in contact with the insulating film 116, and the drain region 108d in contact with the insulating film 116.

In this embodiment, Samples A1 to A3 each including the transistor structure shown in FIG. 7 were formed as described below.

Samples A1 to A3 are each a sample in which a transistor with a channel length L of 2 μm and a channel width W of 3 μm is formed. Samples A1 and A2 are each a sample in which a transistor for comparison is formed and Sample A3 is a sample in which the transistor of one embodiment of the present invention is formed. Samples A1 to A3 were formed in the following manner: the deposition conditions of the oxide semiconductor films are different from each other and the other steps are the same.

[Formation Methods of Samples A1 to A3]

First, a 10-nm-thick titanium film and a 100-nm-thick copper film were formed over a glass substrate with a sputtering apparatus. Next, the conductive film was processed by a photolithography method.

A stack including four insulating films was formed over the substrate and the conductive film. The insulating films were formed in succession in a vacuum with a plasma-enhanced chemical deposition (PECVD) apparatus. As the insulating films, a 50-nm-thick silicon nitride film, a 300-nm-thick silicon nitride film, a 50-nm-thick silicon nitride film, and a 50-nm-thick silicon oxynitride film were used and stacked in this order.

Next, an oxide semiconductor film was formed over the insulating film and was processed into an island shape, whereby a semiconductor layer was formed. A 40-nm-thick oxide semiconductor film was formed as the oxide semiconductor film 108. Samples A1 to A3 are different from each other in the deposition condition of the oxide semiconductor film.

The oxide semiconductor film used for Sample A1 was formed under the following conditions: the substrate temperature was 170° C.; an argon gas with a flow rate of 140 sccm and an oxygen gas with a flow rate of 60 sccm were introduced into a chamber of the sputtering apparatus; the pressure was set to 0.6 Pa; and an AC power of 2.5 kW was applied to a metal oxide target containing indium, gallium, and zinc (In:Ga:Zn=4:2:4.1 [atomic ratio]). The proportion of oxygen in the whole deposition gas is referred to as an oxygen flow rate percentage in some cases. The oxygen flow rate percentage in deposition of Sample A1 was 30%.

The oxide semiconductor film used for Sample A2 was formed under the following conditions: the substrate temperature was 130° C.; an argon gas with a flow rate of 180 sccm and an oxygen gas with a flow rate of 20 sccm were introduced into a chamber of the sputtering apparatus; the pressure was set to 0.6 Pa; and an AC power of 2.5 kW was applied to a metal oxide target containing indium, gallium, and zinc (In:Ga:Zn=4:2:4.1 [atomic ratio]). The oxygen flow rate percentage in deposition of Sample A2 was 10%.

The formation conditions of a metal oxide film used for the oxide semiconductor film for Sample A3 were similar to those for Sample A6. That is, the oxide semiconductor film used for Sample A3 was formed under the following conditions: the substrate temperature was room temperature (R.T.); an argon gas with a flow rate of 180 sccm and an oxygen gas with a flow rate of 20 sccm were introduced into a chamber of the sputtering apparatus; the pressure was set to 0.6 Pa; and an AC power of 2.5 kW was applied to a metal oxide target containing indium, gallium, and zinc (In:Ga:Zn=4:2:4.1 [atomic ratio]). The oxygen flow rate percentage in deposition of Sample A3 was 10%.

Next, an insulating film was formed over the insulating film and the oxide semiconductor layer. As the insulating film, a 150-nm-thick silicon oxynitride film was formed with a PECVD apparatus.

Next, heat treatment was performed. The heat treatment was performed at 350° C. for one hour in a mixed gas atmosphere of nitrogen and oxygen.

An opening was formed in a desired region of the insulating film. The opening was formed by a dry etching method.

Then, a 100-nm-thick oxide semiconductor film was formed over the insulating film and in the opening and the oxide semiconductor film was processed into an island shape, whereby a conductive film was formed. In addition, the insulating film in contact with the bottom surface of the conductive film was processed in succession after the formation of the conductive film, whereby the insulating film was formed.

As the conductive film, a 10-nm-thick oxide semiconductor film, a 50-nm-thick titanium nitride film, and a 100-nm-thick copper film were formed in this order. The oxide semiconductor film was formed under the following conditions: the substrate temperature was 170° C.; an oxygen gas with a flow rate of 200 sccm was introduced into a chamber of the sputtering apparatus; the pressure was set to 0.6 Pa; and an AC power of 2.5 kW was applied to a metal oxide target containing indium, gallium, and zinc (In:Ga:Zn=4:2:4.1 [atomic ratio]). The titanium nitride film and the copper film were each formed using a sputtering apparatus.

Next, plasma treatment was performed from above the oxide semiconductor film, the insulating film, and the conductive film. The plasma treatment was performed with a PECVD apparatus at a substrate temperature 220° C. in a mixed gas atmosphere containing an argon gas and a nitrogen gas.

Next, an insulating film was formed over the oxide semiconductor film, the insulating film, and the conductive film. The insulating film was formed by stacking a 100-nm-thick silicon nitride film and a 300-nm-thick silicon oxynitride film with a PECVD apparatus.

Then, a mask was formed over the formed insulating film and an opening was formed in the insulating film with use of the mask.

A conductive film was formed to fill the opening and was processed into an island shape, whereby the conductive film serving as a source electrode and a drain electrode was formed. For the conductive films, a 10-nm-thick titanium film and a 100-nm-thick copper film were formed with a sputtering apparatus.

After that, an insulating film was formed over the insulating film and the conductive film. A 1.5-μm-thick acrylic-based photosensitive resin was used for the insulating film.

In the above manner, Samples A1 to A3 were formed.

[$I_d$-$V_g$ Characteristics of Transistors]

Next, $I_d$-$V_g$ characteristics of the fabricated transistors of Samples A1 to A3 were measured. As conditions for measuring the $I_d$-$V_g$ characteristics of each transistor, a voltage applied to the conductive film serving as a first gate electrode (hereinafter the voltage is also referred to as gate voltage ($V_g$)) and a voltage applied to the conductive film serving as the second gate electrode (hereinafter the voltage is also referred to as $V_{bg}$) were changed from −10 V to +10 V in increments of 0.25 V. A voltage applied to the conductive film serving as a source electrode (hereinafter the voltage is also referred to as source voltage ($V_s$)) was 0 V (comm) and voltages applied to the conductive film serving as a drain electrode (hereinafter the voltages are also referred to as drain voltage ($V_d$)) were 0.1 V and 20 V.

FIGS. 8A, 8B, and 8C show the results of $I_d$-$V_g$ characteristics of Samples A1, A2, and A3, respectively. In FIGS. 8A to 8C, the first vertical axis represents $I_d$ (A), the second vertical axis represents field-effect mobility (μFE) (cm$^2$/Vs), and the horizontal axis represents $V_g$ (V). Note that the field-effect mobility was measured when $V_d$ was 20 V.

As shown in FIGS. 8A to 8C, when the deposition condition of the oxide semiconductor film is varied, $I_d$-$V_g$ characteristics of the transistors have different tendencies. In particular, there are differences between the shapes of the mobility curves of the field-effect mobilities of the transistors.

From the shapes of the mobility curves of Samples A1 to A3 shown in FIGS. 8A to 8C, the minimum values and the maximum values of the field-effect mobilities in the saturation regions of the transistors and the values each obtained by subtracting the minimum value from the maximum value were calculated. Here, the saturation region of the transistor was in a range where $V_g$ is greater than or equal to 3 V and less than or equal to 10 V. A gate voltage in this range is generally used for applications such as display.

In Sample A1, the minimum value of the field-effect mobility in the saturation region of the transistor was 9.8 cm$^2$/Vs and the maximum value thereof was 28.3 cm$^2$/Vs. That is, a difference between the minimum value and the maximum value of the field-effect mobility in the saturation region of the transistor of Sample A1 was 18.5 cm$^2$/Vs. In Sample A2, the minimum value of the field-effect mobility in the saturation region of the transistor was 23.3 cm$^2$/Vs and the maximum value thereof was 51.1 cm$^2$/Vs. That is, a difference between the minimum value and the maximum value of the field-effect mobility in the saturation region of the transistor of Sample A2 was 27.8 cm$^2$/Vs. In Sample A3, the minimum value of the field-effect mobility in the saturation region of the transistor was 55.8 cm$^2$/Vs and the maximum value thereof was 67.0 cm$^2$/Vs. That is, a difference between the minimum value and the maximum value of the field-effect mobility in the saturation region of the transistor of Sample A3 was 11.2 cm$^2$/Vs.

In other words, in Sample A1, the minimum value of the field-effect mobility in the saturation region of the transistor is lower than the maximum value of the field-effect mobility by approximately 65.3%. In Sample A2, the minimum value of the field-effect mobility in the saturation region of the transistor is lower than the maximum value of the field-effect mobility by approximately 54.4%. In Sample A3, the minimum value of the field-effect mobility in the saturation region of the transistor is lower than the maximum value of the field-effect mobility by approximately 16.7%. As described above, Sample A3 in which the transistor of one embodiment of the present invention is formed has characteristics that the minimum value of the field-effect mobility in the saturation region of the transistor is lower than the maximum value of the field-effect mobility by 30% or lower, preferably 20% or lower.

In this manner, Sample A3 in which the transistor of one embodiment of the present invention is formed has characteristics that a difference between the minimum value and the maximum value of the field-effect mobility in the saturation region of the transistor is less than or equal to 15 cm$^2$/Vs, which is extremely small. In addition, Sample A3 has high field-effect mobility in a low $V_g$ region (e.g., a region where $V_g$ is greater than 0 V and less than or equal to 5 V). When transistors having such characteristics are used as transistors for pixels of an organic EL display, for example, high current drive capability and high reliability can be obtained.

<1-3. Pixel Circuit of Display Device>

An example in which the semiconductor device 100A shown in FIGS. 4A and 4B is used for a pixel circuit of a display device is described with reference to FIG. 9.

Figure 9:
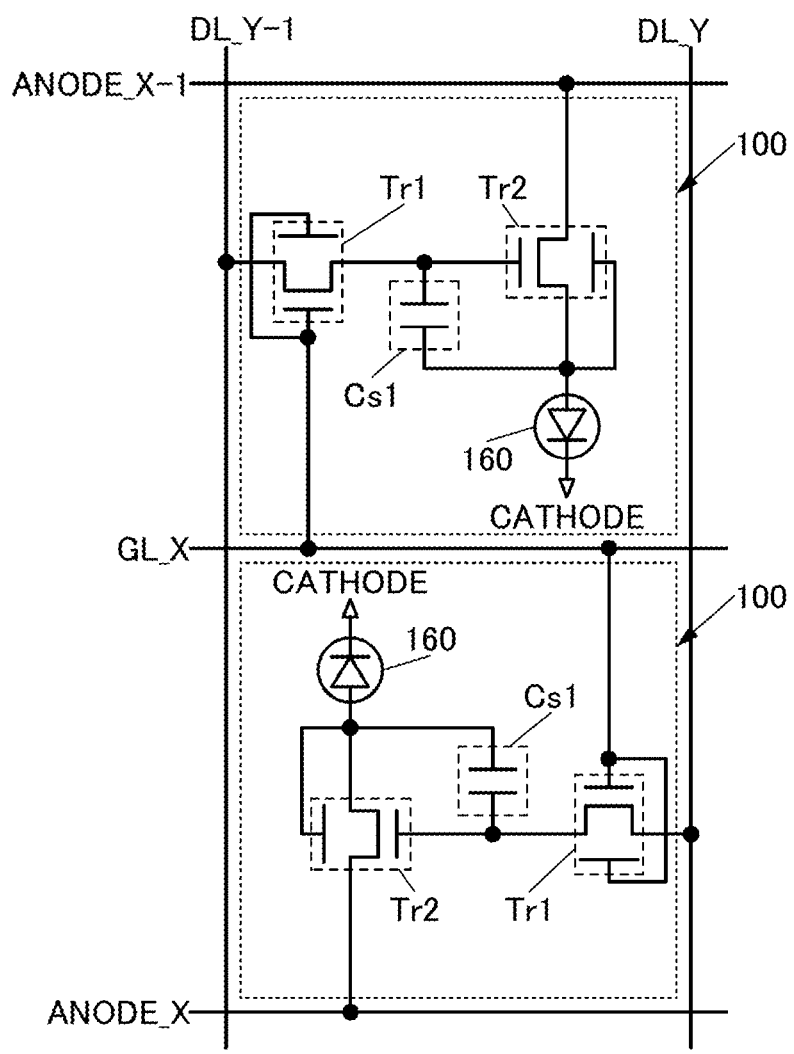
FIG. 9 shows a circuit of a semiconductor device.

FIG. 9 is a circuit diagram showing the example in which the semiconductor device 100A is used for a pixel circuit of a display device.

The semiconductor device 100A shown in FIG. 9 includes the transistor Tr1, the transistor Tr2, a capacitor Cs1, and a light-emitting element 160. Note that the example of FIG. 9 shows two semiconductor devices 100A adjacent to each other in a column direction. The semiconductor device 100A serves as a pixel (also referred to as a subpixel). Although not illustrated in FIGS. 4A and 4B, the capacitor Cs1 can be formed with a capacitance between the conductive film 120 and the conductive film 122a or a capacitance between the conductive film 112b and the conductive film 122a. Note that the transistor Tr1 is also referred to as a selection transistor. The transistor Tr2 is also referred to as a driving transistor. The transistor Tr2 operates mainly in a saturation region.

The circuit diagram of FIG. 9 includes a data line DL_Y-1 which writes a data signal to a pixel, a data line DL_Y which writes a data signal to the adjacent pixel, an anode line ANODE_X-1 which supplies a potential to a light-emitting element, an anode line ANODE_X which supplies a potential to the adjacent light-emitting element, and a scan line GL_X which supplies a scan signal to a pixel.

One of a source electrode and a drain electrode of the transistor Tr1 is electrically connected to the data line DL_Y-1. A first gate electrode and a second gate electrode of the transistor Tr1 are electrically connected to the scan line GL_X. The transistor Tr1 has a function of controlling whether to write a data signal.

One of a pair of electrodes of the capacitor Cs1 is electrically connected to the other of the source electrode and the drain electrode of the transistor Tr1. The other of the pair of electrodes of the capacitor Cs1 is electrically connected to a second gate electrode (also referred to as a back gate electrode) of the transistor Tr2. The capacitor Cs1 functions as a storage capacitor which stores written data.

One of a source electrode and a drain electrode of the transistor Tr2 is electrically connected to the anode line ANODE_X-1.

One of a pair of electrodes of the light-emitting element 160 is electrically connected to the other of the source electrode and the drain electrode of the transistor Tr2, and the other electrode of the light-emitting element 160 is electrically connected to a cathode line CATHODE. Note that the other of the pair of electrodes of the capacitor Cs1 is electrically connected to the one of the pair of electrodes of the light-emitting element 160.

The above structure is the example in which the semiconductor device 100A shown in FIGS. 4A and 4B is used for a pixel of a display device.

<1-4. Structure of Semiconductor Device>

The semiconductor device 100A shown in FIGS. 4A and 4B is described again. When the semiconductor device 100A shown in FIGS. 4A and 4B is used for a pixel of a display device, the channel length (L) and the channel width (W) of a transistor, the line widths of a wiring and an electrode connected to the transistor, and the like can be relatively large. The line width and the like can be large when the transistor Tr1 and the transistor Tr2 overlap with each other at least partly as shown in FIGS. 4A and 4B as compared to the case where the transistor Tr1 and the transistor Tr2 are provided over the same plane, for example; thus, variations in processing size can be reduced.

In addition, one or both of a conductive film and an insulating film can be shared by the transistor Tr1 and the transistor Tr2; thus, the number of masks or steps can be reduced.

For example, in the transistor Tr1, the conductive film 120 serves as the gate electrode, the conductive film 112a serves as the source electrode, and the conductive film 112b serves as the drain electrode. In addition, in the transistor Tr1, the insulating film 110 serves as a gate insulating film. In the transistor Tr2, the conductive film 112b serves as the first gate electrode, the conductive film 122a serves as the source electrode, the conductive film 122b serves as the drain electrode, and the conductive film 130 serves as the second gate electrode. In addition, in the transistor Tr2, the insulating film 118 serves as a first gate insulating film and the insulating films 124 and 126 serve as second gate insulating films.

In this specification and the like, the insulating film 110 may be referred to as a first insulating film, the insulating film 118 may be referred to as a second insulating film, and the insulating films 124 and 126 may be referred to as third insulating films.

An insulating film 134 is provided over the conductive film 130. An insulating film 136 is provided over the insulating film 134. An opening 184 is provided in the insulating films 134 and 136 so as to reach the conductive film 130. In addition, a conductive film 138 is provided over the insulating film 136. Note that the conductive film 138 is connected to the conductive film 130 in the opening 184.

In addition, an insulating film 140, an EL layer 142, and a conductive film 144 are provided over the conductive film 138. The insulating film 140 covers part of a side end portion of the conductive film 138 to prevent a short circuit of the conductive films 138 between adjacent pixels. The EL layer 142 emits light. The light-emitting element 160 is composed of the conductive film 138, the EL layer 142, and the conductive film 144. The conductive film 138 serves as one electrode of the light-emitting element 160. The conductive film 144 serves as the other electrode of the light-emitting element 160.

As described above, a top-gate transistor can be combined with a bottom-gate transistor in this embodiment.

As described above, in the semiconductor device of one embodiment of the present invention, a plurality of transistors are stacked to be reduced in the transistor area. In addition, since one or both of an insulating film and a conductive film are shared by the plurality of transistors, the number of masks or steps can be reduced.

<1-5. Structure of Gate Electrode>

As illustrated in FIGS. 4A and 4B, the transistor Tr2 includes two gate electrodes.

Here, the effect of two gate electrodes is described with reference to FIGS. 4A and 4B and FIG. 10.

Figure 10:
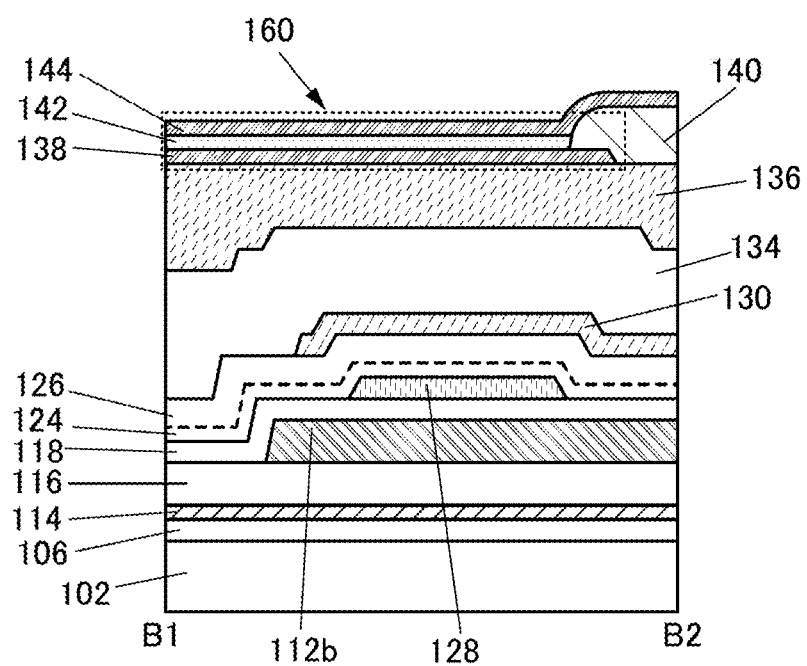
FIG. 10 is a cross-sectional view of a semiconductor device.

Note that FIG. 10 is a cross-sectional view taken along dashed dotted line B1-B2 in FIG. 4A. A cross section in a channel width (W) direction of the transistor Tr2 is included in FIG. 10.

As illustrated in FIG. 10, the oxide semiconductor film 128 is positioned so as to face the conductive film 112b and the conductive film 130, and is sandwiched between the two conductive films functioning as the gate electrodes. The length in the channel width direction of each of the conductive film 112b and the conductive film 130 is greater than the length in the channel width direction of the oxide semiconductor film 128. The entire oxide semiconductor film 128 is covered with the conductive film 112b and the conductive film 130 with the insulating films 118, 124, and 126 positioned therebetween.

In other words, the conductive film 112b and the conductive film 130 each include a region positioned outside the side end portion of the oxide semiconductor film 128.

With such a structure, the oxide semiconductor film 128 included in the transistor Tr2 can be electrically surrounded by electric fields of the conductive films 112b and 130. A device structure of a transistor, like that of the transistor Tr2, in which electric fields of a first gate electrode and a second gate electrode electrically surround an oxide semiconductor film where a channel region is formed can be referred to as a surrounded-channel (S-channel) structure.

Since the transistor Tr2 has the S-channel structure, an electric field for inducing a channel can be effectively applied to the oxide semiconductor film 128 by the conductive film 112b functioning as a first gate electrode; therefore, the current drive capability of the transistor Tr2 can be improved and high on-state current characteristics can be obtained. In addition, since the on-state current can be high, it is possible to reduce the size of the transistor Tr2. In addition, since the transistor Tr2 has a structure in which the oxide semiconductor film 128 is surrounded by the conductive film 112b functioning as the first gate electrode and the conductive film 130 functioning as the second gate electrode, the mechanical strength of the transistor Tr2 can be increased.

Although in the transistor Tr2 illustrated in FIG. 4B, the conductive film 130 functioning as the second gate electrode is electrically connected to the conductive film 122a functioning as the source electrode or the drain electrode of the transistor Tr2, one embodiment of the present invention is not limited thereto. For example, the first gate electrode may be electrically connected to the second gate electrode. In that case, an opening is formed in the insulating films 118, 124, and 126, so that the conductive film 130 functioning as the second gate electrode can be electrically connected to the conductive film 112b functioning as the first gate electrode in the opening. Therefore, the same potential is applied to the conductive film 112b and the conductive film 130.

At this time, although not illustrated in FIG. 10, the capacitor Cs1 can be formed with a capacitance between a film formed at the same time as the conductive film 112b and a film formed at the same time as the conductive film 122a, for example. The parasitic capacitance of the transistor Tr2 corresponds to the sum of a capacitance between the conductive film 112b and the oxide semiconductor film 128 and a capacitance between the conductive film 130 and the oxide semiconductor film 128.

In the case where the storage capacitance of the capacitor Cs1 is small, the gate voltage value of the transistor Tr2 changes significantly because of the influence of the parasitic capacitance of the transistor Tr2. This results in variations in the display among the light-emitting elements 160. In the case where it is difficult to increase the storage capacitance of the capacitor Cs1 because the layout area of the transistors is to be reduced, reduction in the parasitic capacitance of the transistor Tr2 is effective in stabilizing the gate voltage value of the transistor Tr2. To achieve this, the thickness of the insulating film 126 is preferably increased, in which case, however, the on-state current of the transistor Tr2 is reduced.

The transistor Tr2 is driven mainly in the saturation region. When the on-state currents in the saturation region shown in FIGS. 8A to 8C are compared with one another, the on-state in FIG. 8C is the highest, that in FIG. 8B is the second, and that in FIG. 8A is the lowest. When a certain on-state current is to be obtained in a saturation region, the thickness of the insulating film 126 can be made larger in the case where the oxide semiconductor film of the transistor in FIG. 8B or FIG. 8C is used than in the case where the oxide semiconductor film of the transistor in FIG. 8A is used.

In other words, in one embodiment of the present invention, the storage capacitance of the capacitor Cs1 can be reduced when the oxide semiconductor film of the transistor in FIG. 8B or FIG. 8C is used in the transistor Tr2, which results in reduction in the area where the transistors are provided.

<1-6. Components of Semiconductor Device>

Next, components of the semiconductor device of this embodiment are described in detail.

<Substrate>

There is no particular limitation on a material and the like of the substrate 102 as long as the material has heat resistance enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

A flexible substrate may be used as the substrate 102, and the semiconductor device 100A may be provided directly on the flexible substrate. A separation layer may be provided between the substrate 102 and the semiconductor device 100A. The separation layer can be used when part or the whole of a semiconductor device formed over the separation layer is separated from the substrate 102 and transferred onto another substrate. In such a case, the semiconductor device 100A can be transferred to a substrate having low heat resistance or a flexible substrate as well.

<Conductive Film>

The conductive films 112a, 112b, 120, 122a, 122b, 130, 138, and 144 can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these elements; or the like.

The conductive films 112a, 112b, 120, 122a, 122b, 130, 138, and 144 can each be formed using an oxide conductor such as an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide including indium, gallium, and zinc.

The above-listed oxide conductors are particularly favorable as the conductive films 120 and 130. Here, an oxide conductor is described. In this specification and the like, an oxide conductor may be referred to as OC. Oxygen vacancies are formed in an oxide semiconductor, and then hydrogen is added to the oxygen vacancies, so that a donor level is formed in the vicinity of the conduction band. This increases the conductivity of the oxide semiconductor; accordingly, the oxide semiconductor becomes a conductor. The oxide semiconductor having become a conductor can be referred to as an oxide conductor. Oxide semiconductors generally transmit visible light because of their large energy gap. An oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

A Cu—X alloy film (X is Mn, Ni, Cr, Fe, Co, Mo, Ta, or Ti) may be used as each of the conductive films 112a, 112b, 122a, 122b, 130, 138, and 144. The use of a Cu—X alloy film results in lower fabrication costs because the film can be processed by wet etching.

The Cu—X alloy film can be favorably used as one or more of the conductive films 112a, 112b, 122a, 122b, and 130, in particular. Specifically, the Cu—X alloy film is preferably a Cu—Mn alloy film.

Among the above-described metal elements, one or more of aluminum, copper, titanium, tungsten, tantalum, and molybdenum is particularly favorable as a constituent of one or more of the conductive films 112a, 112b, 120, 122a, 122b, and 130.

A tantalum nitride film, which contains nitride and tantalum, is favorably used as one or more of the conductive films 112a, 112b, 120, 122a, 122b, and 130. A tantalum nitride film has conductivity and a high barrier property against copper or hydrogen. The tantalum nitride film can be used most preferably as a metal film in contact with the oxide semiconductor film 108 or a metal film in the vicinity of the oxide semiconductor film 108 because the amount of hydrogen released from the tantalum nitride film is small.

<Insulating Film>

As each of the insulating films 106, 114, 116, 118, 124, 126, 134, 136, and 140, an insulating layer including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating film 106 functions as a blocking film which inhibits penetration of oxygen. For example, when one or more of the insulating film 114, the insulating film 116, the oxide semiconductor film 108, the oxide semiconductor film 128, the insulating film 124, and the insulating film 126 include an oxygen-excess region, the insulating film 106 can inhibit penetration of oxygen.

Note that an insulating film that is in contact with one or both of the oxide semiconductor film 108 and the oxide semiconductor film 128 is preferably an oxide insulating film and preferably includes a region containing oxygen in excess of that in the stoichiometric composition (an oxygen-excess region). In other words, the oxide insulating film including the oxygen-excess region is an insulating film capable of releasing oxygen.

The oxygen-excess region of the oxide insulating film can be formed by any of the following methods, for example: an insulating film is formed in an oxygen atmosphere; an insulating film is formed and then subjected to heat treatment in an oxygen atmosphere; or an insulating film is formed, and then oxygen is added to the insulating film. Plasma treatment is preferable for adding oxygen into the formed insulating film.

The insulating film serving as the gate insulating film of each of the transistor Tr1 and the transistor Tr2 may be formed using hafnium oxide. When hafnium oxide is used for the insulating film serving as the gate insulating film, the following effects are obtained.

Hafnium oxide has higher dielectric constant than silicon oxide and silicon oxynitride. Thus, the thickness of the insulating film formed using hafnium oxide can be larger than that of an insulating film formed using silicon oxide, so that leakage current due to tunnel current can be low. That is, it is possible to provide a transistor with a low off-state current. Moreover, hafnium oxide with a crystal structure has a higher dielectric constant than hafnium oxide with an amorphous structure. Therefore, it is preferable to use hafnium oxide with a crystal structure in order to provide a transistor with low off-state current. Examples of the crystal structure include a monoclinic crystal structure and a cubic crystal structure. Note that one embodiment of the present invention is not limited to the above examples.

The insulating film functioning as the gate insulating film of each of the transistor Tr1 and the transistor Tr2 may be formed using silicon nitride. When silicon nitride is used for the insulating film serving as the insulating film functioning as the gate insulating film, the following effects are obtained. Silicon nitride has a higher dielectric constant than silicon oxide and needs a larger thickness to obtain capacitance equivalent to that of silicon oxide. Thus, the thickness of the insulating film can be increased. This makes it possible to prevent a decrease in withstand voltage of the transistor Tr1 and the transistor Tr2 and to increase the withstand voltage, thereby preventing electrostatic discharge of the transistor Tr1 and the transistor Tr2.

The insulating films 110, 116, 118, 124, and 126 have a function of supplying oxygen to the oxide semiconductor film 108 and/or the oxide semiconductor film 128. That is, the insulating films 110, 116, 118, 124, and 126 contain oxygen. The insulating films 110 and 124 are insulating films which allow passage of oxygen. Note that the insulating film 110 also functions as a film for relieving damage to the oxide semiconductor film 108 at the time of forming the conductive film 120 in a later step. The insulating film 124 also functions as a film for relieving damage to the oxide semiconductor film 128 at the time of forming the insulating film 126 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating films 110 and 124.

In addition, it is preferable that the number of defects in the insulating films 110 and 124 be small, and typically, the spin density of a signal that appears at g=2.001 due to a dangling bond of silicon be lower than or equal to $3 \times 10^{17}$ spins/cm$^3$ when measured by ESR measurement. This is because if the density of defects in each of the insulating films 114 and 124 is high, oxygen is bonded to the defects, and the amount of oxygen that passes through the insulating film 114 is decreased.

The insulating films 110 and 124 can each be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the release amount of ammonia is larger than the release amount of nitrogen oxide in thermal desorption spectroscopy (TDS); the release amount of ammonia is typically greater than or equal to $1 \times 10^{18}$ cm$^{-3}$ and less than or equal to $5 \times 10^{19}$ cm$^{-3}$. Note that the released amount of ammonia is the total amount of ammonia released by heat treatment in a range from 50° C. to 650° C. or a range from 50° C. to 550° C. in TDS. The release amount of ammonia is the total release amount of ammonia converted into ammonia molecules in TDS.

Nitrogen oxide (NO$_x$; x is greater than 0 and less than or equal to 2, preferably greater than or equal to 1 and less than or equal to 2), typically NO$_2$ or NO, forms levels in the insulating films 110 and 124, for example. The level is located in the energy gap of the oxide semiconductor films 108 and 128. Therefore, when nitrogen oxide is diffused to the interface between the insulating film 110 and the oxide semiconductor film 108 or the interface between the insulating film 124 and the oxide semiconductor film 128, an electron might be trapped by the level on the insulating films 110 and 124 side. As a result, the trapped electron remains in the vicinity of the interface between the insulating film 110 and the oxide semiconductor film 108 or the interface between the insulating film 124 and the oxide semiconductor film 128; thus, the threshold voltage of the transistor is shifted in the positive direction.

Nitrogen oxide reacts with ammonia and oxygen in heat treatment. Since nitrogen oxide contained in the insulating film 124 reacts with ammonia contained in the insulating film 126 in heat treatment, nitrogen oxide contained in the insulating film 124 is reduced. Therefore, an electron is hardly trapped at the interface between the insulating film 124 and the oxide semiconductor film 128.

By using the oxide insulating film, the insulating films 110 and 124 can reduce the shift in the threshold voltage of the transistor, which leads to a smaller change in the electrical characteristics of the transistor.

Note that in ESR spectra at 100 K or lower of the insulating films 110 and 124, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 corresponds to the sum of the spin densities of signals attributed to nitrogen oxide (NO$_x$; x is greater than 0 and less than or equal to 2, preferably greater than or equal to 1 and less than or equal to 2). Typical examples of the nitrogen oxide include nitrogen monoxide and nitrogen dioxide. Accordingly, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The nitrogen concentration of the above-described oxide insulating film measured by SIMS is lower than or equal to $6 \times 10^{20}$ atoms/cm$^3$.

The above oxide insulating film is formed by a PECVD method at a substrate temperature higher than or equal to 220° C. and lower than or equal to 350° C. with the use of silane and dinitrogen monoxide, whereby a dense and hard film can be formed.

The insulating film 114 contains at least one of nitrogen and hydrogen. As the insulating film 114, for example, a nitride insulating film can be used. The nitride insulating film can be formed using silicon nitride, silicon nitride oxide, aluminum nitride, aluminum nitride oxide, or the like. The hydrogen concentration in the insulating film 114 is preferably higher than or equal to $1 \times 10^{22}$ atoms/cm$^3$. Furthermore, the insulating film 114 is in contact with the source region 108s and the drain region 108d of the oxide semiconductor film 108. In addition, the insulating film 114 includes a region in contact with the conductive film 120. Therefore, the hydrogen concentrations in the source region 108s, the drain region 108d, and the conductive film 120 in contact with the insulating film 114 are increased; thus, the carrier densities in the source region 108s, the drain region 108d, and the conductive film 120 can be increased. Since the source region 108s, the drain region 108d, and the conductive film 120 are in contact with the insulating film 114, they have regions with the same hydrogen concentration in some cases.

The insulating films 116, 118, and 126 are formed using an oxide insulating film which contains oxygen in excess of that in the stoichiometric composition. Part of oxygen is released by heating from the oxide insulating film containing oxygen in excess of that in the stoichiometric composition. The oxide insulating film containing oxygen in excess of that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in TDS. Note that the release amount of oxygen is the total amount of oxygen released by heat treatment in a range of 50° C. to 650° C. or a range of 50° C. to 550° C. in TDS.

In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used as each of the insulating films 116, 118, and 126.

In addition, it is preferable that the number of defects in the insulating films 116, 118, and 126 be small, and typically, the spin density of a signal that appears at g=2.001 due to a dangling bond of silicon be lower than $1.5 \times 10^{18}$ spins/cm$^3$, preferably lower than or equal to $1 \times 10^{18}$ spins/cm$^3$ when measured by ESR measurement.

Since the insulating films 124 and 126 can be formed using insulating films including the same kinds of materials, a boundary between the insulating films 124 and 126 cannot be clearly observed in some cases. Thus, in this embodiment, the boundary between the insulating films 124 and 126 is shown by a dashed line.

The insulating film 134 functions as a protective insulating film for the transistors Tr1 and Tr2.

The insulating film 134 contains one or both of hydrogen and nitrogen. Alternatively, the insulating film 134 includes nitrogen and silicon. The insulating film 134 has a function of blocking oxygen, hydrogen, water, an alkali metal, an alkaline earth metal, or the like. It is possible to prevent outward diffusion of oxygen from the oxide semiconductor film 108 and the oxide semiconductor film 128, outward diffusion of oxygen included in the insulating films 110, 116, 124, and 126, and entry of hydrogen, water, or the like into the oxide semiconductor films 108 and 128 from the outside by providing the insulating film 134.

The insulating film 134 can be formed using a nitride insulating film, for example. The nitride insulating film is formed using silicon nitride, silicon nitride oxide, aluminum nitride, aluminum nitride oxide, or the like.

<Oxide Semiconductor Film>

The oxide semiconductor films 108 and 128 can be formed using the materials described above.

In the case where the oxide semiconductor films 108 and 128 each include In-M-Zn oxide, it is preferable that the atomic ratio of metal elements of a sputtering target used for forming the In-M-Zn oxide satisfy In>M. The atomic ratio of metal elements in such a sputtering target is, for example, In:M:Zn=2:1:3, In:M:Zn=3:1:2, or In:M:Zn=4:2:4.1.

In the case where the oxide semiconductor films 108 and 128 each include an In-M-Zn oxide, the atomic ratio of metal elements in a sputtering target used for forming the In-M-Zn oxide may satisfy InM. The atomic ratio of metal elements in such a sputtering target is, for example, In:M:Zn=1:1:1, In:M:Zn=1:1:1.2, In:M:Zn=1:3:2, In:M:Zn=1:3:4, or In:M:Zn=1:3:6. The oxide semiconductor films 108 and 128 may be formed using different sputtering targets which differ in atomic ratio of metal elements.

The energy gap of the oxide semiconductor films 108 and 128 is 2 eV or more, preferably 2.5 eV or more and further preferably 3 eV or more. With the use of oxide semiconductors having such a wide energy gap, the off-state current of the transistors Tr1 and Tr2 can be reduced.

Each thickness of the oxide semiconductor films 108 and 128 is greater than or equal to 3 nm and less than or equal to 200 nm, preferably greater than or equal to 3 nm and less than or equal to 100 nm, further preferably greater than or equal to 3 nm and less than or equal to 50 nm.

Hydrogen contained in the oxide semiconductor films 108 and 128 reacts with oxygen bonded to a metal atom to be water and also causes an oxygen vacancy in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally on. Accordingly, it is preferable that hydrogen in the oxide semiconductor films 108 and 128 be reduced as much as possible.

Specifically, in each of the oxide semiconductor films 108 and 128, the hydrogen concentration which is measured by SIMS is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, further preferably lower than or equal to $5 \times 10^{18}$ atoms/cm$^3$, further preferably lower than or equal to $1 \times 10^{18}$ atoms/cm$^3$, further preferably lower than or equal to $5 \times 10^{17}$ atoms/cm$^3$, and still further preferably lower than or equal to $1 \times 10^{16}$ atoms/cm$^3$.

When silicon or carbon, which is one of the elements belonging to Group 14, is contained in the oxide semiconductor films 108 and 128, oxygen vacancies are increased in the oxide semiconductor films 108 and 128, so that the oxide semiconductor films 108 and 128 become n-type films. Thus, the silicon concentrations of the oxide semiconductor films 108 and 128 that are measured by SIMS are each set to lower than or equal to $2 \times 10^{18}$ atoms/cm$^3$, preferably lower than or equal to $2 \times 10^{17}$ atoms/cm$^3$. The carbon concentrations of the oxide semiconductor films 108 and 128 that are measured by SIMS are each set to lower than or equal to $2 \times 10^{18}$ atoms/cm$^3$, preferably lower than or equal to $2 \times 10^{17}$ atoms/cm$^3$.

In addition, the concentrations of alkali metal or alkaline earth metal of the oxide semiconductor films 108 and 128 that are measured by SIMS are each set to lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal in the oxide semiconductor films 108 and 128.

Note that the above-described films such as conductive films and insulating films can be formed by a sputtering method, a plasma-enhanced chemical vapor deposition (PECVD) method, or a thermal CVD method. Examples of thermal CVD methods include a metal organic chemical vapor deposition (MOCVD) method and an atomic layer deposition (ALD) method.

A thermal CVD method has an advantage that no defect due to plasma damage is generated since it does not utilize plasma for forming a film.

Deposition by the thermal CVD method may be performed in such a manner that a source gas and an oxidizer are supplied to a chamber while the pressure in the chamber is set to an atmospheric pressure or a reduced pressure, and the source gas and the oxidizer react with each other in the vicinity of the substrate or over the substrate.

Deposition by an ALD method may be performed under the condition that the pressure in a chamber is set to an atmospheric pressure or a reduced pressure, and a source gas for reaction is used.

For example, in the case where a hafnium oxide film is formed with a deposition apparatus using an ALD method, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide) hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed with a deposition apparatus using an ALD method, a $WF_6$ gas and a $B_2H_6$ gas are used to form an initial tungsten film, and then a $WF_6$ gas and an $H_2$ gas are used to form a tungsten film. Note that an $SiH_4$ gas may be used instead of a $B_2H_6$ gas.

<1-7. Structure Example 2 of Semiconductor Device>

Next, a modification example of the semiconductor device 100A illustrated in FIGS. 4A and 4B is described with reference to FIG. 11.

Figure 11:
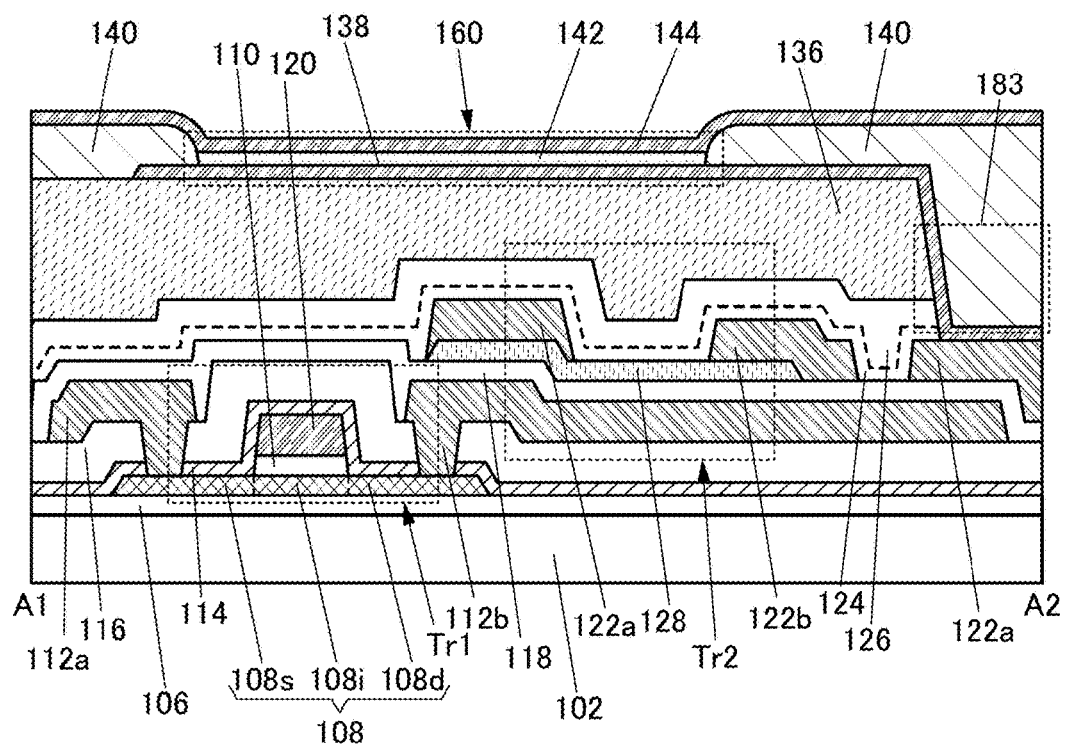
FIG. 11 is a cross-sectional view of a semiconductor device.

FIG. 11 is a cross-sectional view illustrating the modification example of the semiconductor device 100A illustrated in FIG. 4B.

The structure illustrated in FIG. 11 does not include the conductive film 130 functioning as the second gate electrode of the transistor Tr2 and the insulating film 134 provided over the conductive film 130 in the semiconductor device 100A. In addition, in the structure illustrated in FIG. 11, an opening 183 is formed in the insulating films 124, 126, and 136 instead of an opening 182 formed in the insulating films 124 and 126 and the opening 184 formed in the insulating films 134 and 136. Such a structure including one opening is favorable because the manufacturing steps can be reduced.

<1-8. Structure Example 3 of Semiconductor Device>

Next, modification examples of the semiconductor device 100A illustrated in FIGS. 4A and 4B are described with reference to FIGS. 12A and 12B and FIGS. 13A and 13B.

A stacked-layer structure of an oxide semiconductor film is described below.

Figure 12A:
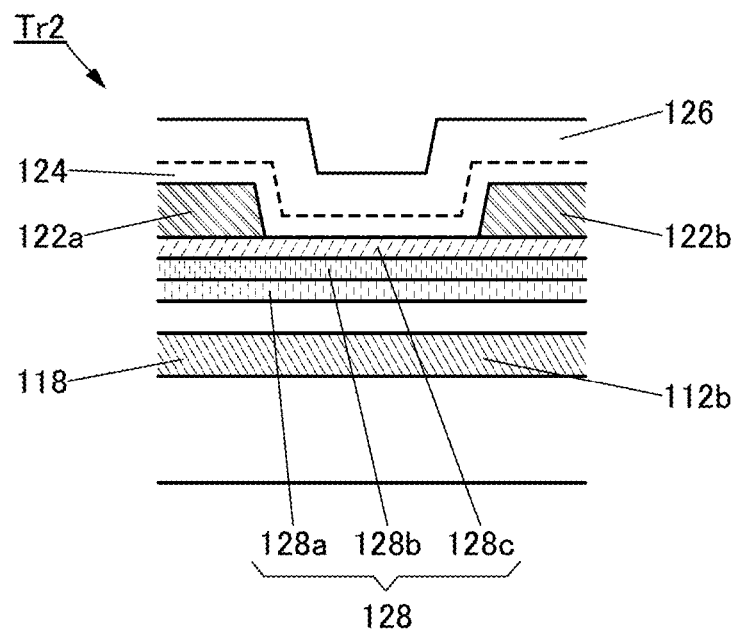
FIGS. 12A and 12B are cross-sectional views of a semiconductor device.
Figure 12B:
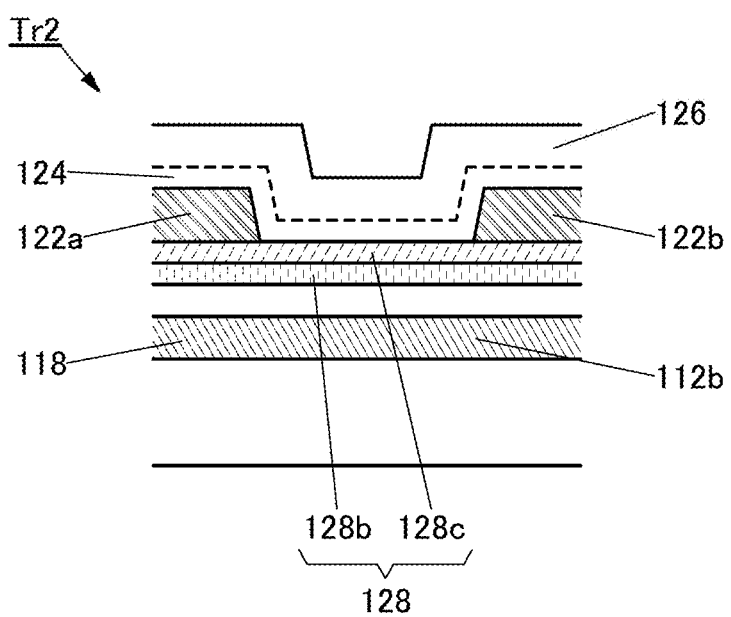

FIGS. 12A and 12B are each a cross-sectional view in the channel length (L) direction of the transistor Tr2 included in the semiconductor device 100A.

FIG. 12A illustrates a structure in which the oxide semiconductor film 128 of the transistor Tr2 includes an oxide semiconductor film 128a, an oxide semiconductor film 128b over the oxide semiconductor film 128a, and an oxide semiconductor film 128c over the oxide semiconductor film 128b. That is, the oxide semiconductor film 128 has a three-layer structure.

FIG. 12B illustrates a structure in which the oxide semiconductor film 128 of the transistor Tr2 includes the oxide semiconductor film 128b and the oxide semiconductor film 128c over the oxide semiconductor film 128b. That is, the oxide semiconductor film 128 has a two-layer structure.

In both cases where the oxide semiconductor film 128 has the three-layer structure and where the oxide semiconductor film 128 has the two-layer structure, the oxide semiconductor film 128b is formed under conditions similar to those of the oxide semiconductor film of Sample A3 that has the transistor structure illustrated in FIG. 7. In $I_d$-$V_g$ measurement, a difference between the minimum and maximum values of the field-effect mobility in a saturation region of the transistor having such a stacked-layer structure is smaller than a difference between the maximum and minimum values of the field-effect mobility of a transistor in which the oxide semiconductor film 128b is formed under conditions similar to those of the oxide semiconductor film of Sample A1.

Figure 13A:
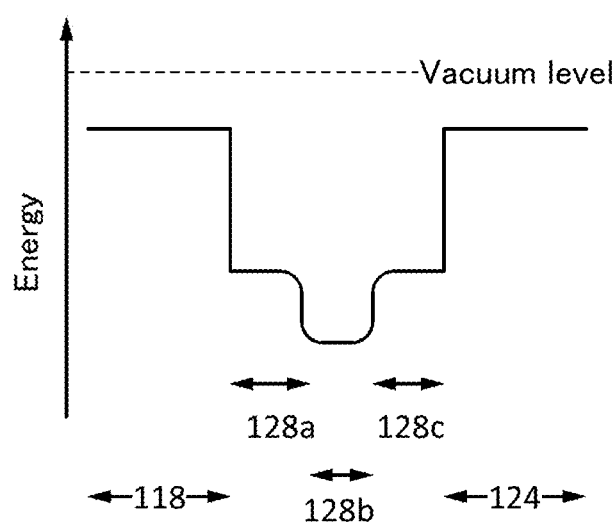
FIGS. 13A and 13B illustrate energy bands.
Figure 13B:
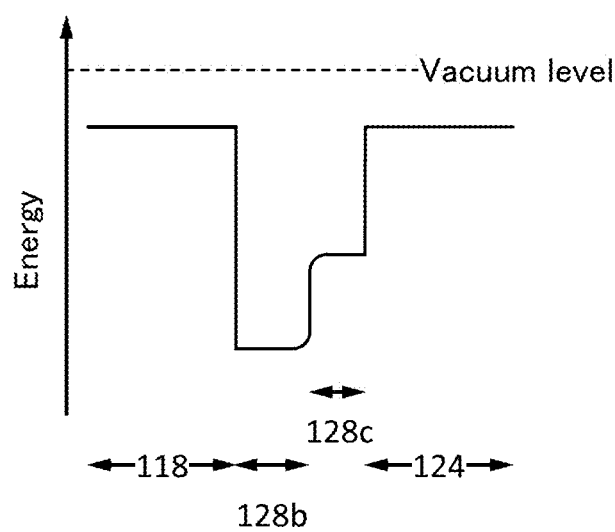
Figure 14A:
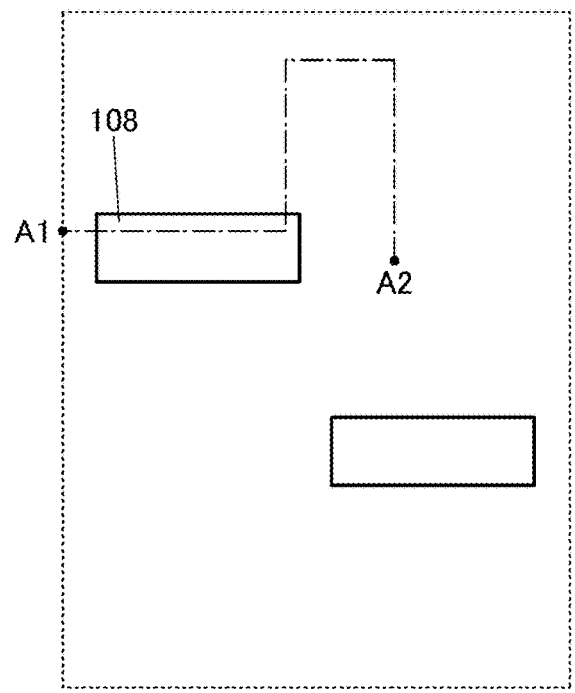
FIGS. 14A and 14B are a top view and a cross-sectional view illustrating a method for manufacturing a semiconductor device.
Figure 14B:
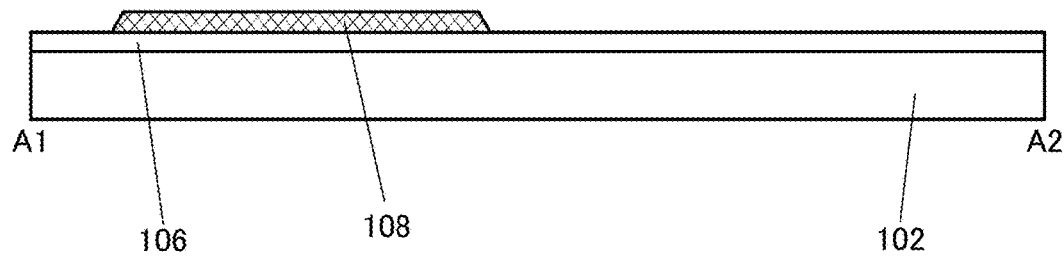

FIGS. 13A and 13B show examples of a band structure of the oxide semiconductor film 128 and insulating films that are in contact with the oxide semiconductor film 128. FIG. 13A shows an example of a band structure in the thickness direction of a stack including the insulating film 118, the oxide semiconductor films 128a, 128b, and 128c, and the insulating film 124. FIG. 13B shows an example of a band structure in the thickness direction of a stack including the insulating film 118, the oxide semiconductor films 128b and 128c, and the insulating film 124. For easy understanding, energy level of the conduction band minimum ($E_c$) of each of the insulating film 118, the oxide semiconductor films 128a, 128b, and 128c, and the insulating film 124 is shown in the band structure.

In the structure shown in the band diagram of FIG. 13A, a silicon oxide film is used as each of the insulating films 118 and 124, an oxide semiconductor film which is formed using a metal oxide target with an atomic ratio of metal elements of In:Ga:Zn=1:3:2 is used as the oxide semiconductor film 128a, an oxide semiconductor film which is formed using a metal oxide target with an atomic ratio of metal elements of In:Ga:Zn=4:2:4.1 is used as the oxide semiconductor film 128b, and an oxide semiconductor film which is formed using a metal oxide target with an atomic ratio of metal elements of In:Ga:Zn=1:3:2 is used as the oxide semiconductor film 128c.

In the structure shown in the band diagram of FIG. 13B, a silicon oxide film is used as each of the insulating films 118 and 124, an oxide semiconductor film formed using a metal oxide target with an atomic ratio of metal elements of In:Ga:Zn=4:2:4.1 is used as the oxide semiconductor film 128b, and a metal oxide film formed using a metal oxide target with an atomic ratio of metal elements of In:Ga:Zn=1:3:2 is used as the oxide semiconductor film 128c.

As illustrated in FIGS. 13A and 13B, the energy level of the conduction band minimum gradually varies between the oxide semiconductor films 128a and 128b and between the oxide semiconductor films 128b and 128c. In other words, the energy level of the conduction band minimum is continuously varied or continuously connected. To obtain such a band structure, there exists no impurity, which forms a defect state such as a trap center or a recombination center, at the interface between the oxide semiconductor film 128a and 128b or at the interface between the oxide semiconductor films 128b and 128c.

In order to form such a continuous junction in the oxide semiconductor films 128a, 128b, and 128c, it is necessary to form the films continuously without being exposed to air, with use of a multi-chamber deposition apparatus (sputtering apparatus) including a load lock chamber.

With the structure of FIG. 13A or FIG. 13B, the oxide semiconductor film 128b serves as a well, and a channel region is formed in the oxide semiconductor film 128b in the transistor with the stacked-layer structure.

By providing the oxide semiconductor film 128a and the oxide semiconductor films 128c, the oxide semiconductor film 128b can be distanced away from trap states.

In addition, in some cases, the trap states are more distant from the vacuum level than the energy level of the conduction band minimum (Ec) of the oxide semiconductor film 128b functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the conduction band minimum ($E_c$) of the oxide semiconductor film 128b. Such a structure inhibits accumulation of electrons in the trap states. As a result, the on-state current and the field-effect mobility of the transistor can be increased.

The energy level of the conduction band minimum of each of the oxide semiconductor films 128a and 128c is closer to the vacuum level than that of the oxide semiconductor film 128b. Typically, a difference in energy level between the conduction band minimum of the oxide semiconductor film 128b and the conduction band minimum of each of the oxide semiconductor films 128a and 128c is 0.15 eV or more or 0.5 eV or more and 2 eV or less or 1 eV or less. That is, the difference between the electron affinity of each of the oxide semiconductor films 128a and 128c and the electron affinity of the oxide semiconductor film 128b is 0.15 eV or more or 0.5 eV or more and 2 eV or less or 1 eV or less.

In such a structure, the oxide semiconductor film 128b serves as a main path of current and functions as a channel region. In addition, since the oxide semiconductor films 128a and 128c contain one or more metal elements contained in the oxide semiconductor film 128b in which the channel region is formed, interface scattering is less likely to occur at the interface between the oxide semiconductor films 128a and 128b or the interface between the oxide semiconductor films 128b and 128c. Thus, the transistor can have high field-effect mobility because the transfer of carriers is not hindered at the interface.

To prevent each of the oxide semiconductor films 128a and 128c from functioning as part of a channel region, a material having sufficiently low conductivity is used for the oxide semiconductor films 128a and 128c. Alternatively, a material which has a smaller electron affinity (a difference in energy level between the vacuum level and the conduction band minimum) than the oxide semiconductor film 128b and has a difference in energy level in the conduction band minimum from the oxide semiconductor film 128b (band offset) is used for the oxide semiconductor films 128a and 128c. Furthermore, to inhibit generation of a difference between threshold voltages due to the value of the drain voltage, it is preferable to form the oxide semiconductor films 128a and 128c using a material whose energy level of the conduction band minimum is closer to the vacuum level than that of the oxide semiconductor film 128b. For example, a difference in energy level between the conduction band minimum of the oxide semiconductor film 128b and the conduction band minimum of each of the oxide semiconductor films 128a and 128c is preferably 0.2 eV or more and further preferably 0.5 eV or more.

The thickness of each of the oxide semiconductor films 128a and 128c is greater than or equal to a thickness that is capable of inhibiting diffusion of the constituent elements of the conductive films 122a and 122b to the oxide semiconductor film 128b, and less than a thickness that inhibits supply of oxygen from the insulating film 124 to the oxide semiconductor film 128b. For example, when the thickness of each of the oxide semiconductor films 128a and 128c is greater than or equal to 10 nm, the constituent element of the conductive films 122a and 122b can be prevented from diffusing into the oxide semiconductor film 128b. When the thickness of each of the oxide semiconductor films 128a and 128c is less than or equal to 100 nm, oxygen can be effectively supplied from the insulating film 124 to the oxide semiconductor film 128b.

When the oxide semiconductor films 128a and 128c are each an In-M-Zn oxide in which the atomic proportion of M (M is Al, Ga, Y, or Sn) is higher than that of In, the energy gap of each of the oxide semiconductor films 128a and 128c can be large and the electron affinity thereof can be small. Therefore, a difference in electron affinity between the oxide semiconductor film 128b and each of the oxide semiconductor films 128a and 128c may be controlled by the proportion of the element M. Furthermore, an oxygen vacancy is less likely to be generated in the oxide semiconductor film in which the atomic proportion of M is higher than that of In because M is a metal element that is strongly bonded to oxygen.

When the oxide semiconductor films 128a and 128c are each an In-M-Zn oxide, the proportions of In and M, not taking Zn and O into consideration, are preferably as follows: the atomic percentage of In is less than 50 atomic % and the atomic percentage of M is greater than 50 atomic %; and further preferably, the atomic percentage of In is less than 25 atomic % and the atomic percentage of M is greater than 75 atomic %. Alternatively, a gallium oxide film may be used as each of the oxide semiconductor films 128a and 128c.

Furthermore, when the oxide semiconductor films 128a, 128b, and 128c are each an In-M-Zn oxide, the proportion of M atoms in each of the oxide semiconductor films 128a and 128c is higher than that in the oxide semiconductor film 128b. Typically, the proportion of M in each of the oxide semiconductor films 128a and 128c is 1.5 or more times, preferably twice or more, further preferably three or more times that in the oxide semiconductor film 128b.

Furthermore, when the oxide semiconductor films 128a, 128b, and 128c are each an In-M-Zn oxide, when the oxide semiconductor film 128b has an atomic ratio of In:M:Zn=$x_1$:$y_1$:$z_1$ and the oxide semiconductor films 128a and 128c each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, and still further preferably $y_2/x_2$ is three or more times or four or more times as large as $y_1/x_1$. At this time, $y_1$ is preferably greater than or equal to $x_1$ in the oxide semiconductor film 128b, because stable electrical characteristics of a transistor including the oxide semiconductor film 128b can be achieved. However, when $y_1$ is three or more times as large as $x_1$, the field-effect mobility of the transistor including the oxide semiconductor film 128b is reduced. Accordingly, $y_1$ is preferably smaller than three times $x_1$.

In the case where the oxide semiconductor film 128b is an In-M-Zn oxide and a target with an atomic ratio of metal elements of In:M:Zn=$x_1$:$y_1$:$z_1$ is used for depositing the oxide semiconductor film 128b, $x_1/y_1$ is preferably greater than or equal to $\frac{1}{3}$ and less than or equal to 6, and further preferably greater than or equal to 1 and less than or equal to 6, and $z_1/y_1$ is preferably greater than or equal to $\frac{1}{3}$ and less than or equal to 6, and further preferably greater than or equal to 1 and less than or equal to 6. Note that when $z_1/y_1$ is greater than or equal to 1 and less than or equal to 6, a CAAC-OS to be described later is easily formed as the oxide semiconductor film 128b. Typical examples of the atomic ratio of the metal elements of the target include In:M:Zn=4: 2:4.1, In:M:Zn=1:1:1.2, and In:M:Zn=3:1:2.

When the oxide semiconductor films 128a and 128c are each an In-M-Zn oxide and a target with an atomic ratio of metal elements of In:M:Zn=$x_2$:$y_2$:$z_2$ is used for forming the oxide semiconductor films 128a and 128c, $x_2/y_2$ is preferably less than $x_1/y_1$, and $z_2/y_2$ is preferably greater than or equal to ⅓ and less than or equal to 6, further preferably greater than or equal to 1 and less than or equal to 6. When the atomic ratio of M with respect to indium is high, the energy gap of the oxide semiconductor films 128a and 128c can be large and the electron affinity thereof can be small; therefore, $y_2/x_2$ is preferably higher than or equal to 3 or higher than or equal to 4. Typical examples of the atomic ratio of the metal elements of the target include In:M:Zn=1: 3:2, In:M:Zn=1:3:4, In:M:Zn=1:3:5, In:M:Zn=1:3:6, In:M: Zn=1:4:2, In:M:Zn=1:4:4, In:M:Zn=1:4:5, and In:M:Zn=1: 5:5.

In each of the oxide semiconductor films 128a, 128b, and 128c, the proportions of the atoms in the above atomic proportion vary within a range of ±40% as an error.

The oxide semiconductor film 128 of the transistor Tr2 has a stacked-layer structure of two layers and a stacked-layer structure of three layers in FIGS. 12A and 12B, and the oxide semiconductor film 108 of the transistor Tr1 may have a similar structure.

As described above, in the semiconductor device of the present invention, the presence of the second gate electrode or the stacked-layer structures of the oxide semiconductor films can be changed. The structures of the transistors of this embodiment can be freely combined with each other.

<1-9. Method for Manufacturing Semiconductor Device>

Next, a method for manufacturing the semiconductor device 100A of one embodiment of the present invention is described with reference to FIGS. 14A and 14B, FIGS. 15A and 15B, FIGS. 16A and 16B, FIGS. 17A and 17B, FIGS. 18A and 18B, FIGS. 19A and 19B, FIGS. 20A and 20B, FIGS. 21A and 21B, FIGS. 22A and 22B, and FIGS. 23A and 23B.

Note that FIG. 14A, FIG. 15A, FIG. 16A, FIG. 17A, FIG. 18A, FIG. 19A, FIG. 20A, FIG. 21A, FIG. 22A, and FIG. 23A are top views illustrating the method for manufacturing the semiconductor device 100A. FIG. 14B, FIG. 15B, FIG. 16B, FIG. 17B, FIG. 18B, FIG. 19B, FIG. 20B, FIG. 21B, FIG. 22B, and FIG. 23B are cross-sectional views illustrating the method for manufacturing the semiconductor device 100A.

First, the insulating film 106 is formed over the substrate 102, and an oxide semiconductor film is formed over the insulating film 106. Then, the oxide semiconductor film is processed into an island shape, whereby the oxide semiconductor film 108 is formed (see FIGS. 14A and 14B).

In this embodiment, a glass substrate can be used as the substrate 102.

The insulating film 106 can be formed by a sputtering method, a CVD method, an evaporation method, a pulsed laser deposition (PLD) method, a printing method, a coating method, or the like as appropriate. In this embodiment, as the insulating film 106, a 400-nm-thick silicon nitride film and a 50-nm-thick silicon oxynitride film are formed with a PECVD apparatus.

After the insulating film 106 is formed, oxygen may be added to the insulating film 106. As oxygen added to the insulating film 106, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 106, and then, oxygen may be added to the insulating film 106 through the film.

The above film that suppresses oxygen release can be formed using the following conductive material: a metal element selected from indium, zinc, gallium, tin, aluminum, chromium, tantalum, titanium, molybdenum, nickel, iron, cobalt, and tungsten; an alloy containing the metal element as a component; an alloy containing any of the metal elements in combination; a metal nitride containing the metal element; a metal oxide containing the metal element; a metal nitride oxide containing the metal element; or the like.

In the case where oxygen is added by plasma treatment in which oxygen is excited by a microwave to generate high-density oxygen plasma, the amount of oxygen added to the insulating film 106 can be increased.

The oxide semiconductor film 108 can be formed by a sputtering method, a coating method, a pulsed laser deposition method, a laser ablation method, a thermal CVD method, or the like. Note that processing into the oxide semiconductor film 108 can be performed in the following manner: a mask is formed over the oxide semiconductor film by a lithography process, and then, the oxide semiconductor film is partly etched using the mask. Alternatively, the isolated oxide semiconductor film 108 may be directly formed by a printing method.

In the case of forming the oxide semiconductor film by a sputtering method, an RF power supply device, an AC power supply device, a DC power supply device, or the like can be used as appropriate as a power supply device for generating plasma. As a sputtering gas for forming the oxide semiconductor film, a rare gas (typically argon), oxygen, or a mixed gas of a rare gas and oxygen is used as appropriate. In the case of using the mixed gas of a rare gas and oxygen, the proportion of oxygen to a rare gas is preferably increased.

In this embodiment, as the oxide semiconductor film 108, a 40-nm-thick oxide semiconductor film is formed with a sputtering apparatus using an In—Ga—Zn metal oxide (In:Ga:Zn=4:2:4.1 [atomic ratio]) as a sputtering target. At that time, the substrate is heated to 170° C., and an argon gas at a flow rate of 140 sccm and an oxygen gas at a flow rate of 60 sccm are introduced to a deposition chamber of the sputtering apparatus.

After the oxide semiconductor film 108 is formed, the oxide semiconductor film 108 may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Furthermore, the heat treatment may be performed in an inert gas atmosphere first, and then in an oxygen atmosphere. It is preferable that the above inert gas atmosphere and the above oxygen atmosphere do not contain hydrogen, water, and the like. The treatment time may be longer than or equal to 3 minutes and shorter than or equal to 24 hours.

An electric furnace, an RTA apparatus, or the like can be used for the heat treatment. The use of an RTA apparatus allows the heat treatment to be performed at a temperature higher than or equal to the strain point of the substrate if the heating time is short. Therefore, the heat treatment time can be shortened.

By depositing the oxide semiconductor film while it is heated or by performing heat treatment after the formation of the oxide semiconductor film, the hydrogen concentration in the oxide semiconductor film, which is measured by secondary ion mass spectrometry, can be lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$.

Figure 15A:
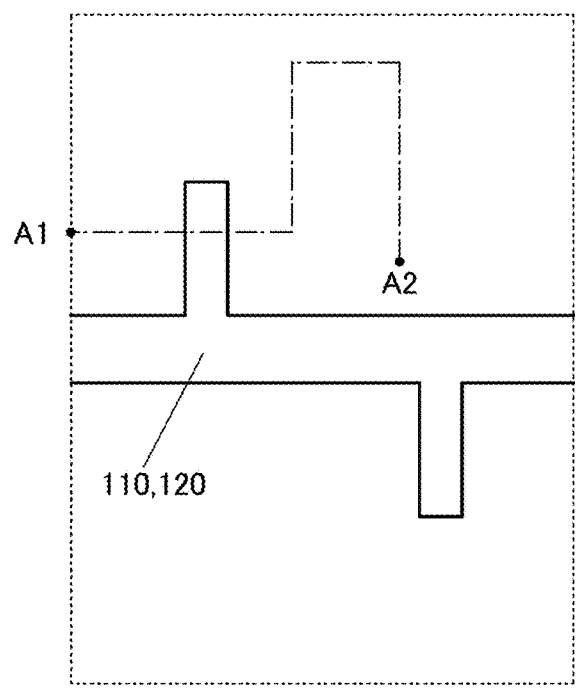
FIGS. 15A and 15B are a top view and a cross-sectional view illustrating a method for manufacturing a semiconductor device.
Figure 15B:
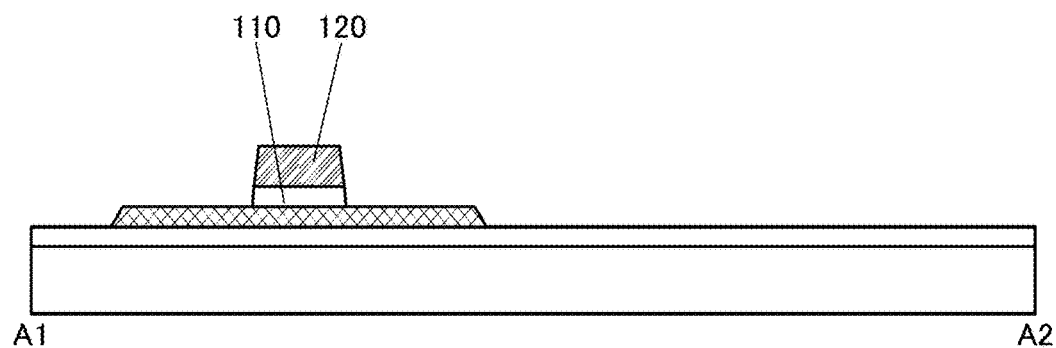

Next, an insulating film and a conductive film are formed over the insulating film 106 and the oxide semiconductor film 108 and are processed into an island shape, whereby the insulating film 110 and the conductive film 120 are formed (see FIGS. 15A and 15B).

As the insulating film 110, a silicon oxide film or a silicon oxynitride film can be formed by a PECVD method. In this case, a deposition gas including silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having few defects can be formed as the insulating film 110 by a PECVD method in which the flow rate of the oxidizing gas is higher than 20 times and less than 100 times, or higher than or equal to 40 times and less than or equal to 80 times the flow rate of the deposition gas and the pressure in a treatment chamber is lower than 100 Pa or lower than or equal to 50 Pa.

As the insulating film 110, a dense silicon oxide film or a dense silicon oxynitride film can be formed under the following conditions: the substrate placed in a vacuum-evacuated treatment chamber of a PECVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating film 110 may be formed by a plasma CVD method using a microwave. A microwave refers to a wave in the frequency range of 300 MHz to 300 GHz. In a microwave, electron temperature is low and electron energy is low. Furthermore, the proportion of power used for acceleration of electrons in supplied power is low, and therefore, power can be used for dissociation and ionization of more molecules. Thus, plasma with high density (high-density plasma) can be excited. This method causes little plasma damage to the deposition surface or a deposit, so that the insulating film 110 having few defects can be formed.

Alternatively, the insulating film 110 can also be formed by a CVD method using an organosilane gas. As the organosilane gas, any of the following silicon-containing compound can be used: tetraethyl orthosilicate (TEOS) (chemical formula: Si(OC$_2$H$_5$)$_4$); tetramethylsilane (TMS) (chemical formula: Si(CH$_3$)$_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); or the like. The insulating film 110 having high coverage can be formed by a CVD method using an organosilane gas.

In this embodiment, as the insulating film 110, a 150-nm-thick silicon oxynitride film is formed with a PECVD apparatus.

An oxide conductor (OC) is preferably used for the conductive film 120. When the conductive film 120 is formed, oxygen is transferred from the conductive film 120 to the insulating film 110.

The conductive film 120 is formed preferably by a sputtering method in an atmosphere containing an oxygen gas. Since the atmosphere in which the conductive film 120 is formed contains an oxygen gas, oxygen can be favorably added to the insulating film 110.

Note that the conductive film 120 can be formed using a material similar to that of the oxide semiconductor film 108 described above.

In this embodiment, as the conductive film 120, a 20-nm-thick conductive film is formed with a sputtering apparatus using an In—Ga—Zn metal oxide (In:Ga:Zn=5:1:7 [atomic ratio]) as a sputtering target.

In this embodiment, processing for the conductive film 120 and the insulating film 110 is performed by a dry etching method.

In the processing for the conductive film 120 and the insulating film 110, part of the thickness of the oxide semiconductor film 108 in a region not overlapping with the conductive film 120 is decreased in some cases.

Next, an impurity element is added from above the insulating film 106, the oxide semiconductor film 108, and the conductive film 120.

The impurity element can be added by, for example, an ion doping method, an ion implantation method, or plasma treatment. In the case of plasma treatment, an impurity element can be added using plasma generated in a gas atmosphere containing the impurity element. A dry etching apparatus, an ashing apparatus, a plasma CVD apparatus, a high-density plasma CVD apparatus, or the like can be used to generate the plasma.

As a source gas of the impurity element, at least one of B$_2$H$_6$, PH$_3$, CH$_4$, N$_2$, NH$_3$, AlH$_3$, AlCl$_3$, SiH$_4$, Si$_2$H$_6$, F$_2$, HF, H$_2$, and a rare gas can be used. Alternatively, at least one of B$_2$H$_6$, PH$_3$, N$_2$, NH$_3$, AlH$_3$, AlCl$_3$, F$_2$, HF, and H$_2$ which are diluted with a rare gas can be used. When at least one of B$_2$H$_6$, PH$_3$, N$_2$, NH$_3$, AlH$_3$, AlCl$_3$, F$_2$, HF, and H$_2$ which are diluted with a rare gas is used to add the impurity element to the oxide semiconductor film 108 and the conductive film 120, at least one of a rare gas, hydrogen, boron, carbon, nitrogen, fluorine, phosphorus, sulfur, and chlorine can be added to the oxide semiconductor film 108 and the conductive film 120.

Alternatively, after a rare gas is added to the oxide semiconductor film 108 and the conductive film 120, at least one of B$_2$H$_6$, PH$_3$, CH$_4$, N$_2$, NH$_3$, AlH$_3$, AlCl$_3$, SiH$_4$, Si$_2$H$_6$, F$_2$, HF, and H$_2$ may be added thereto.

Alternatively, after at least one of B$_2$H$_6$, PH$_3$, CH$_4$, N$_2$, NH$_3$, AlH$_3$, AlCl$_3$, SiH$_4$, Si$_2$H$_6$, F$_2$, HF, and H$_2$ is added to the oxide semiconductor film 108 and the conductive film 120, a rare gas may be added thereto.

The addition of an impurity element may be controlled by appropriately setting the implantation conditions such as the accelerating voltage and the dose. For example, in the case where argon is added by an ion implantation method, the accelerating voltage may be higher than or equal to 10 kV and lower than or equal to 100 kV and the dose may be greater than or equal to $1\times10^{13}$ ions/cm$^2$ and less than or equal to $1\times10^{16}$ ions/cm$^2$, for example, $1\times10^{14}$ ions/cm$^2$. In the case where phosphorus ions are added by an ion implantation method, the accelerating voltage may be 30 kV and the dose may be greater than or equal to $1\times10^{13}$ ions/cm$^2$ and less than or equal to $5\times10^{16}$ ions/cm$^2$, for example, $1\times10^{15}$ ions/cm$^2$.

In this embodiment, argon is added to the oxide semiconductor film 108 and the conductive film 120 as an impurity element with a doping apparatus. Note that one embodiment of the present invention is not limited to the example described in this embodiment, in which argon is added as the impurity element; for example, nitrogen may be added or the step of adding the impurity element is not necessarily performed.

Next, the insulating film 114 is formed over the insulating film 106, the oxide semiconductor film 108, and the conductive film 120. Note that regions of the oxide semiconductor film 108 which are in contact with the formed insulating film 114 serve as the source and drain regions 108s and 108d. A region of the oxide semiconductor film 108 which is not in contact with the insulating film 114, i.e., a region of the oxide semiconductor film 108 which is in contact with the insulating film 110 serves as the channel region 108i. Accordingly, the oxide semiconductor film 108 including the channel region 108i, the source region 108s, and the drain region 108d is formed (see FIGS. 16A and 16B).

In this embodiment, a 100-nm-thick silicon nitride film is formed as the insulating film 114 with a PECVD apparatus.

With the use of a silicon nitride film as the insulating film 114, hydrogen and/or nitrogen in the silicon nitride film enters the conductive film 120, the source region 108s, and the drain region 108d that are in contact with the insulating film 114; consequently, the carrier densities of the conductive film 120, the source region 108s, and the drain region 108d can be increased.

Next, the insulating film 116 is formed over the insulating film 114.

In this embodiment, a 300-nm-thick silicon oxynitride film is formed with a PECVD apparatus as the insulating film 116.

Figure 16A:
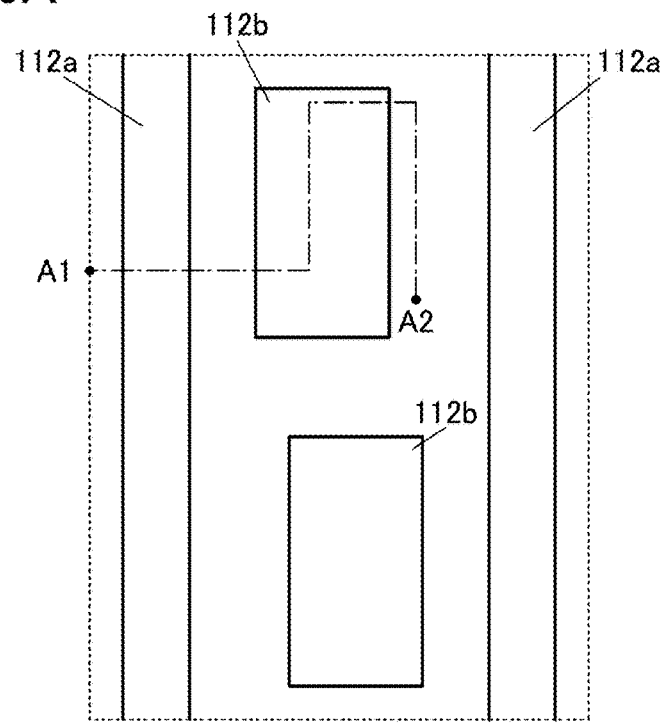
FIGS. 16A and 16B are a top view and a cross-sectional view illustrating a method for manufacturing a semiconductor device.
Figure 16B:
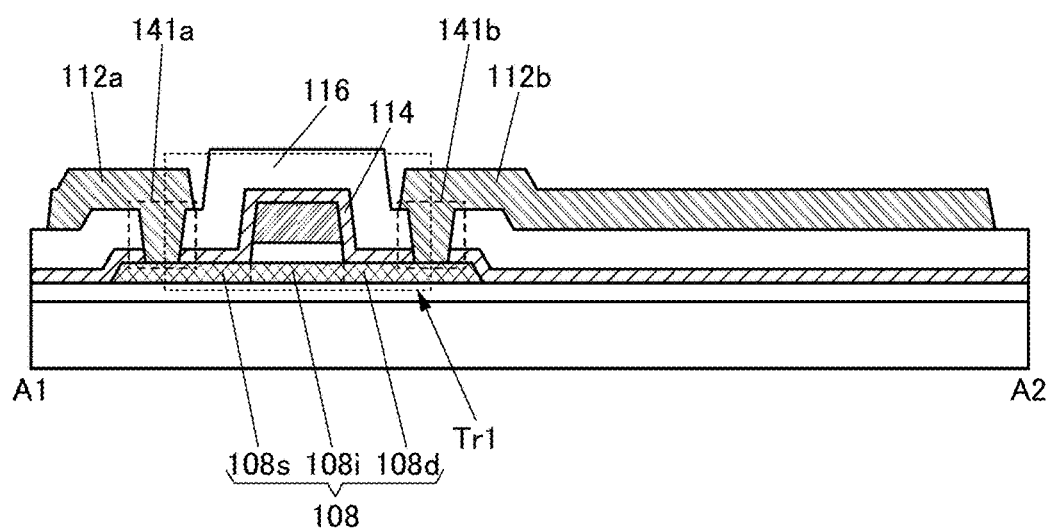

Subsequently, a mask is formed by lithography in a desired region over the insulating film 116, and then, the insulating film 116 and the insulating film 114 are partly etched, so that an opening 141a reaching the source region 108s and an opening 141b reaching the drain region 108d are formed (see FIGS. 16A and 16B).

As a method for etching the insulating film 116 and the insulating film 114, a wet etching method and/or a dry etching method can be used as appropriate. In this embodiment, the insulating film 116 and the insulating film 114 are processed by a dry etching method.

Next, a conductive film is formed over the insulating film 116 so as to fill the openings 141a and 141b, and masks are formed in desired regions by a lithography process. Then, part of the conductive film is etched to form the conductive films 112a and 112b (see FIGS. 16A and 16B).

In this embodiment, as the conductive films 112a and 112b, a stack including a 50-nm-thick titanium film, a 400-nm-thick aluminum film, and a 100-nm-thick titanium film is formed with a sputtering apparatus.

As a processing method for forming the conductive films 112a and 112b, a wet etching method and/or a dry etching method can be used as appropriate. In this embodiment, the conductive film is processed into the conductive films 112a and 112b by a dry etching method.

Through the above steps, the transistor Tr1 can be manufactured.

Note that a film or a layer included in the transistor Tr1 (e.g., an insulating film, an oxide semiconductor film, or a conductive film) can be formed by a sputtering method, a chemical vapor deposition (CVD) method, a vacuum evaporation method, a pulsed laser deposition (PLD) method, or an atomic layer deposition (ALD) method. Alternatively, a coating method or a printing method can be used. Although the sputtering method and a PECVD method are typical examples of the film formation method, a thermal CVD method may be used. As an example of a thermal CVD method, a metal organic chemical vapor deposition (MOCVD) method can be given.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by an ALD method is performed in such a manner that the pressure in a chamber is set to an atmospheric pressure or a reduced pressure, source gases for reaction are introduced into the chamber and reacted, and then the sequence of the gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of the gas introduction is controlled and repeated plural times until a desired thickness is obtained, whereby a thin film with excellent step coverage can be formed. The thickness of the thin film can be adjusted by the number of repetition times of the gas introduction; therefore, an ALD method makes it possible to accurately adjust a thickness and thus is suitable for manufacturing a minute FET.

The films such as the conductive films, the insulating films, the oxide semiconductor films, and the metal oxide films which are described above can be formed by a thermal CVD method such as an MOCVD method. For example, in the case where an In—Ga—Zn—O film is formed, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can be used instead of trimethylgallium and diethylzinc (Zn(C$_2$H$_5$)$_2$) can be used instead of dimethylzinc.

For example, in the case where a hafnium oxide film is formed by a deposition apparatus using ALD, two kinds of gases, i.e., ozone (O$_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, Hf[N(CH$_3$)$_2$]$_4$) and tetrakis(ethylmethylamide) hafnium) are used.

For example, in the case where an aluminum oxide film is formed by a deposition apparatus using ALD, two kinds of gases, i.e., H$_2$O as an oxidizer and a source gas which is obtained by vaporizing liquid containing a solvent and an aluminum precursor (e.g., trimethylaluminum (TMA, Al(CH$_3$)$_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., O$_2$ or dinitrogen monoxide) are supplied to react with an adsorbate.

For example, in the case where a tungsten film is formed using a deposition apparatus using an ALD method, a WF$_6$ gas and a B$_2$H$_6$ gas are sequentially introduced to form an initial tungsten film, and then a tungsten film is formed using a WF$_6$ gas and an H$_2$ gas. Note that an SiH$_4$ gas may be used instead of a B$_2$H$_6$ gas.

For example, in the case where an oxide semiconductor film such as an In—Ga—Zn—O film is formed with a deposition apparatus employing an ALD method, an In(CH$_3$)$_3$ gas and an O$_3$ gas are used to form an In—O layer, a Ga(CH$_3$)$_3$ gas and an O$_3$ gas are used to form a Ga—O layer, and then, a Zn(CH$_3$)$_2$ gas and an O$_3$ gas are used to form a Zn—O layer. Note that the order of these layers is not limited to this example. A mixed compound layer such as an In—Ga—O layer, an In—Zn—O layer, or a Ga—Zn—O layer may be formed by using these gases. Note that although an H$_2$O gas that is obtained by bubbling water with an inert gas such as Ar may be used instead of an O$_3$ gas, it is preferable to use an O$_3$ gas, which does not contain H.

Next, the insulating film 118 is formed over the insulating film 116 and the conductive films 112a and 112b.

The insulating film 118 can be formed by a sputtering method, a CVD method, an evaporation method, a pulsed laser deposition (PLD) method, a printing method, a coating method, or the like as appropriate. In this embodiment, as the insulating film 118, a 400-nm-thick silicon nitride film and a 50-nm-thick silicon oxynitride film are formed with a PECVD apparatus.

After the insulating film 118 is formed, oxygen may be added to the insulating film 118. Examples of the oxygen that is added to the insulating film 118 include an oxygen radical, an oxygen atom, an oxygen atomic ion, an oxygen molecular ion, and the like. Oxygen can be added by an ion doping method, an ion implantation method, a plasma treatment method, or the like. Alternatively, after a film which suppresses release of oxygen is formed over the insulating film, oxygen may be added to the insulating film 118 through the film.

The above film that suppresses oxygen release can be formed using the following conductive material: a metal element selected from indium, zinc, gallium, tin, aluminum, chromium, tantalum, titanium, molybdenum, nickel, iron, cobalt, and tungsten; an alloy containing the metal element as a component; an alloy containing any of the metal elements in combination; a metal nitride containing the metal element; a metal oxide containing the metal element; a metal nitride oxide containing the metal element; or the like.

In the case where oxygen is added by plasma treatment in which oxygen is excited by a microwave to generate high-density oxygen plasma, the amount of oxygen added to the insulating film 118 can be increased.

Note that the insulating film 118 can have a stacked-layer structure of silicon nitride films. Specifically, the silicon nitride film can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of lower than or equal to 350° C.

When the insulating film 118 has the three-layer structure of silicon nitride films, for example, in the case where a conductive film including Cu is used as the conductive films 112a and 112b, the following effect can be obtained.

The first silicon nitride film can inhibit diffusion of a copper (Cu) element from the conductive films 112a and 112b. The second silicon nitride film has a function of releasing hydrogen and can improve withstand voltage of the insulating film that functions as a gate insulating film. The third silicon nitride film releases a small amount of hydrogen and can inhibit diffusion of hydrogen released from the second silicon nitride film.

Figure 17A:
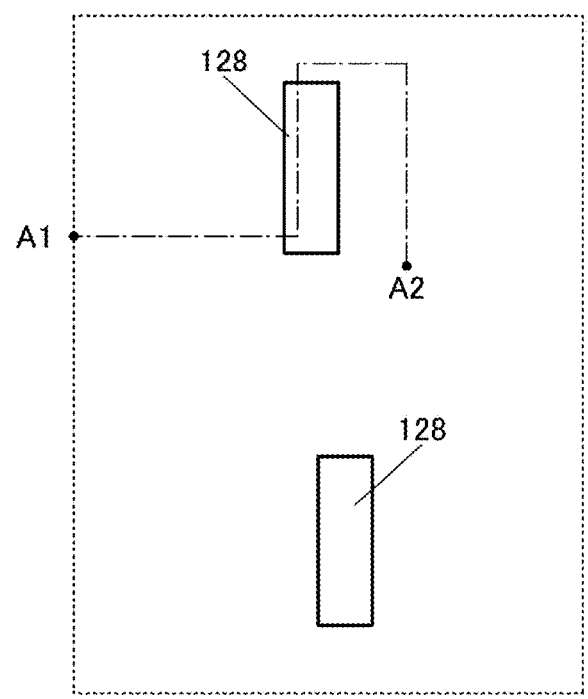
FIGS. 17A and 17B are a top view and a cross-sectional view illustrating a method for manufacturing a semiconductor device.
Figure 17B:
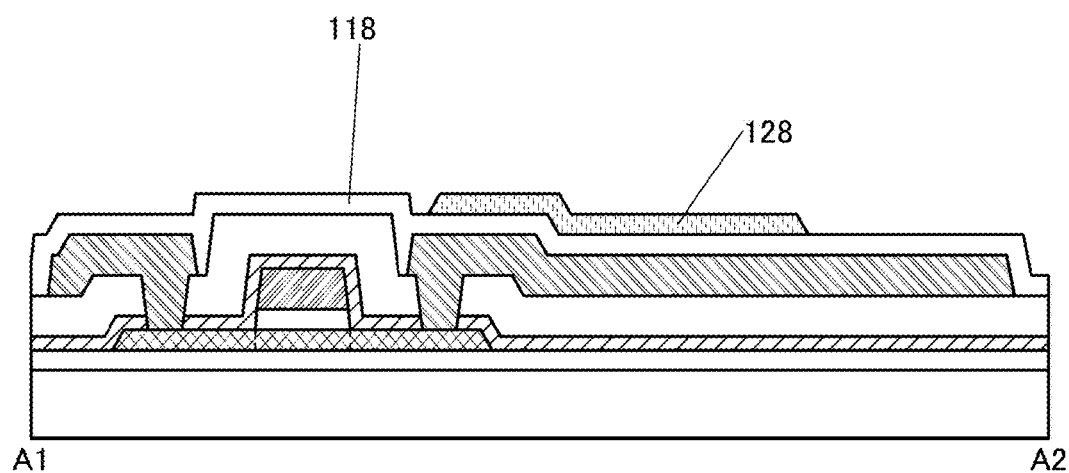

Next, the oxide semiconductor film 128 is formed over the insulating film 118 (see FIGS. 17A and 17B).

In this embodiment, an oxide semiconductor film is formed by a sputtering method using an In—Ga—Zn metal oxide target (In:Ga:Zn=4:2:4.1 [atomic ratio]). When the oxide semiconductor film is formed, the substrate temperature is room temperature (R.T.), and an argon gas at a flow rate of 180 sccm and an oxygen gas at a flow rate of 20 sccm are used. Then, the oxide semiconductor film is processed into a desired shape, whereby the oxide semiconductor film 128 having an island shape is formed. Note that a wet-etching apparatus is used to form the oxide semiconductor film.

Figure 18A:
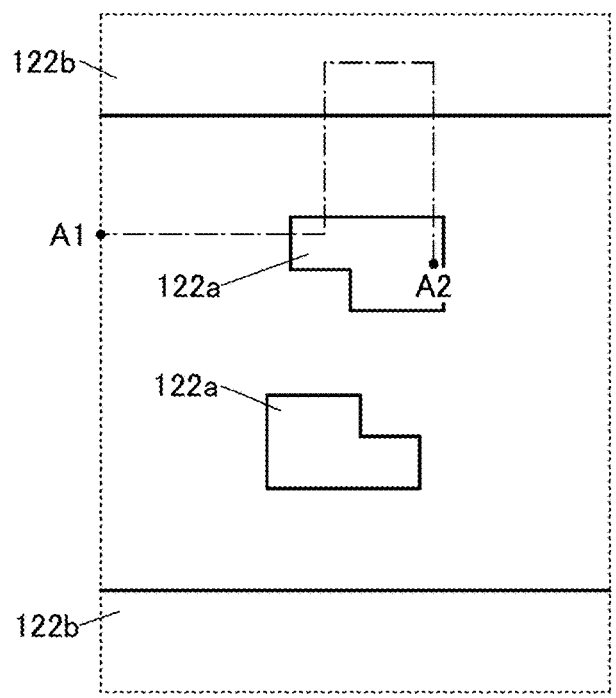
FIGS. 18A and 18B are a top view and a cross-sectional view illustrating a method for manufacturing a semiconductor devices.
Figure 18B:
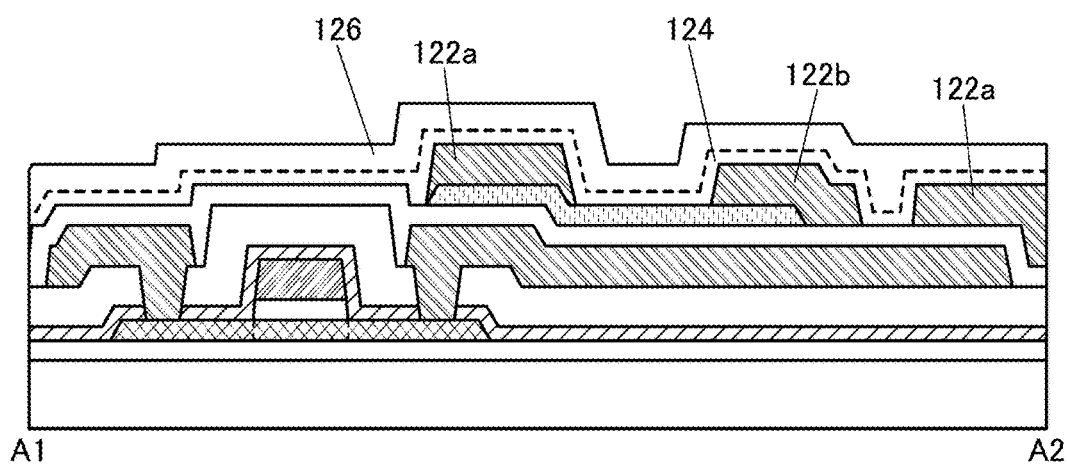
Figure 19A:
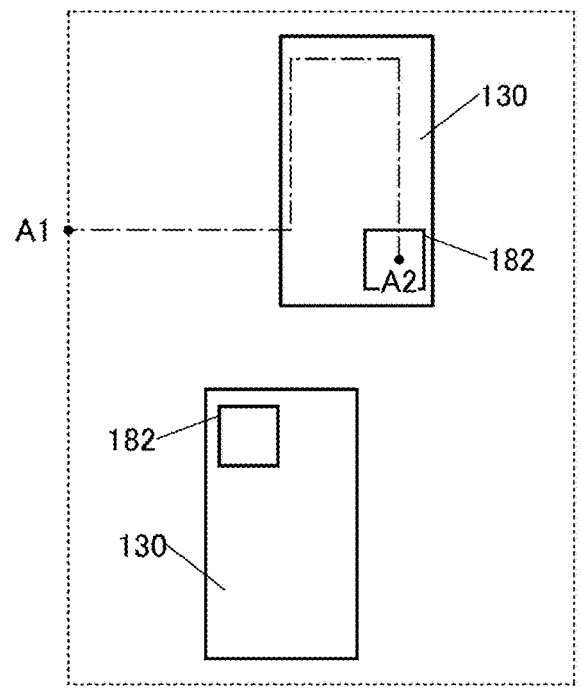
FIGS. 19A and 19B are a top view and a cross-sectional view illustrating a method for manufacturing a semiconductor device.
Figure 19B:
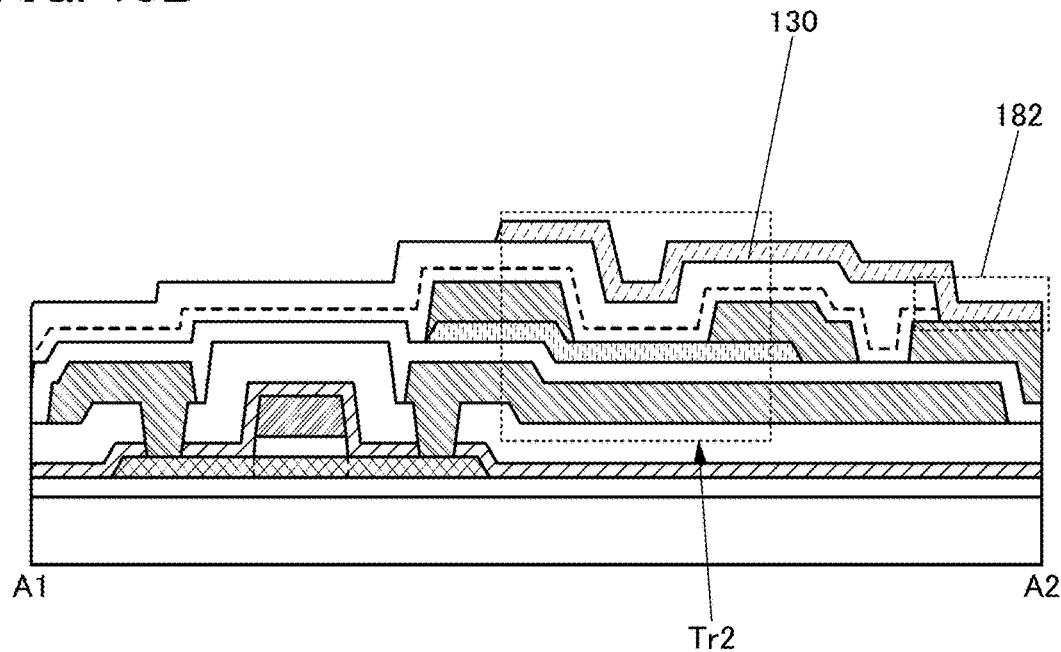
Figure 20A:
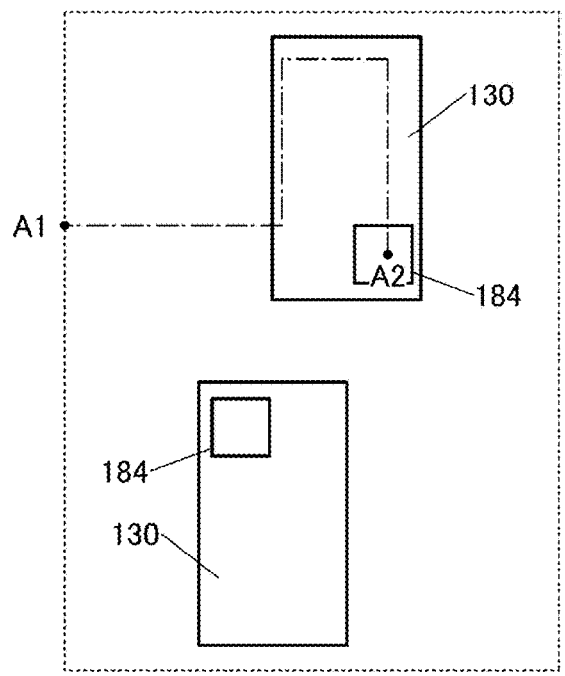
FIGS. 20A and 20B are a top view and a cross-sectional view illustrating a method for manufacturing a semiconductor device.
Figure 20B:
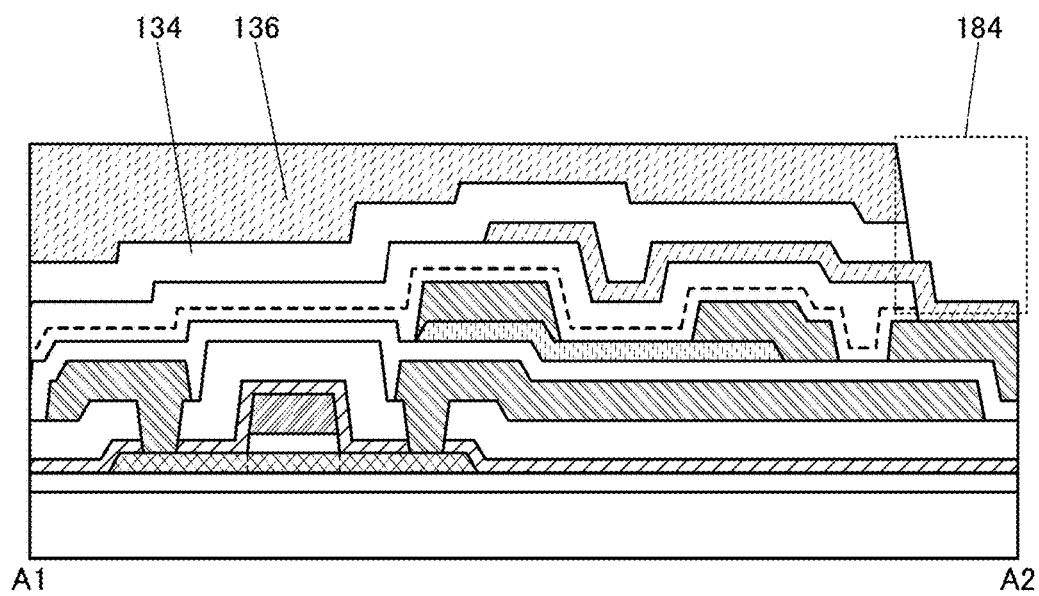

Next, a conductive film is formed over the insulating film 118 and the oxide semiconductor film 128 and processed into a desired shape, whereby the conductive films 122a and 122b are formed. After that, the insulating films 124 and 126 are formed over the insulating film 118, the oxide semiconductor film 128, and the conductive films 122a and 122b (FIGS. 18A and 18B).

In this embodiment, as the conductive films 122a and 122b, a stacked film in which a 50-nm-thick tungsten film, a 100-nm-thick aluminum film, and a 50-nm-thick titanium film are sequentially stacked is formed by a sputtering method.

After the conductive films 122a and 122b are formed, a surface of the oxide semiconductor film 128 (on the back channel side) may be cleaned. The cleaning may be performed, for example, using an etchant such as a phosphoric acid solution. The cleaning can remove impurities (e.g., an element included in the conductive films 122a and 122b) attached to the surface of the oxide semiconductor film 128. Note that the cleaning is not necessarily performed, and the cleaning is unnecessary in some cases.

In the step of forming the conductive films 122a and 122b and/or the cleaning step, the thickness of a region of the oxide semiconductor film 128 which is not covered with the conductive films 122a and 122b might be reduced.

In this embodiment, a 20-nm-thick silicon oxynitride film and a 200-nm-thick silicon oxynitride film are formed as the insulating film 124 and the insulating film 126, respectively, by a PECVD method.

Note that after the insulating film 124 is formed, the insulating film 126 is preferably formed in succession without exposure to the air. After the insulating film 124 is formed, the insulating film 126 is formed in succession without exposure to the air while at least one of the flow rate of a source gas, pressure, a high-frequency power, and a substrate temperature is adjusted, whereby the concentration of impurities attributed to the atmospheric component at the interface between the insulating film 124 and the insulating film 126 can be reduced and oxygen in the insulating films 124 and 126 can be moved to the oxide semiconductor film 128; accordingly, the amount of oxygen vacancies in the oxide semiconductor film 128 can be reduced.

In this embodiment, a silicon oxynitride film is formed as the insulating film 124 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 126, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 350° C.; the pressure is greater than or equal to 100 Pa and less than or equal to 250 Pa, preferably greater than or equal to 100 Pa and less than or equal to 200 Pa with introduction of a source gas into the treatment chamber; and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to the electrode provided in the treatment chamber.

As the formation conditions of the insulating film 126, the high-frequency power having the above power density is supplied to a reaction chamber under the above pressure, whereby the degradation efficiency of the source gas in plasma is increased, oxygen radicals are increased, and oxidation of the source gas is promoted; thus, the oxygen content in the insulating film 126 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film which contains oxygen in excess of that in the stoichiometric composition and from which part of oxygen is released by heating.

Note that, in the step of forming the insulating film 126, the insulating film 124 serves as a protective film for the oxide semiconductor film 128. Therefore, the insulating film 126 can be formed using the high-frequency power having a high power density while damage to the oxide semiconductor film 128 is reduced.

Note that in the formation conditions of the insulating film 126, when the flow rate of the deposition gas containing silicon with respect to the oxidizing gas is increased, the amount of defects in the insulating film 126 can be reduced. Typically, it is possible to form an oxide insulating film in which the number of defects is small, that is, the spin density corresponding to a signal which appears at g=2.001 due to a dangling bond of silicon is lower than $6 \times 10^{17}$ spins/cm$^3$, preferably lower than or equal to $3 \times 10^{17}$ spins/cm$^3$, and further preferably lower than or equal to $1.5 \times 10^{17}$ spins/cm$^3$, by ESR measurement. As a result, the reliability of the transistor Tr2 can be improved.

Heat treatment (hereinafter referred to as first heat treatment) is preferably performed after the insulating films 124 and 126 are formed. The first heat treatment can reduce nitrogen oxide contained in the insulating films 124 and 126. By the first heat treatment, part of oxygen included in the insulating films 124 and 126 can be moved to the oxide semiconductor film 128, so that the amount of oxygen vacancies included in the oxide semiconductor film 128 can be reduced.

The temperature of the first heat treatment is typically lower than 400° C., preferably lower than 375° C., further preferably higher than or equal to 150° C. and lower than or equal to 350° C. The first heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, and the like). Note that an electric furnace, rapid thermal anneal (RTA), or the like can be used for the heat treatment, in which it is preferable that hydrogen, water, and the like not be contained in the nitrogen, oxygen, ultra-dry air, or a rare gas.

Next, the opening 182 reaching the conductive film 122a is formed in a desired region of the insulating films 124 and 126. Then, the conductive film 130 is formed over the insulating film 126 and the conductive film 122a (see FIGS. 19A and 19B).

The opening 182 can be formed with a dry-etching apparatus or a wet-etching apparatus. A 100-nm-thick ITSO film is formed using a target of an oxide containing indium, tin, and silicon (also referred to as ITSO) (In$_2$O$_3$:SnO$_2$:SiO$_2$=85:10:5 [wt %]) and is processed into an island shape, whereby the conductive film 130 is obtained.

Through the above steps, the transistor Tr2 can be manufactured.

Next, a stacked film of insulating films to be the insulating films 134 and 136 is formed over the insulating film 126 and the conductive film 130. Then, the opening 184 reaching the conductive film 130 is formed in a desired region of the stacked film (see FIGS. 20A and 20B).

As the insulating film 134, a 200-nm-thick silicon oxynitride film is formed by a PECVD method. As the insulating film 136, a 1.5-μm-thick acrylic-based photosensitive resin film is formed.

The opening 184 is formed with a dry-etching apparatus or a wet-etching apparatus.

Figure 21A:
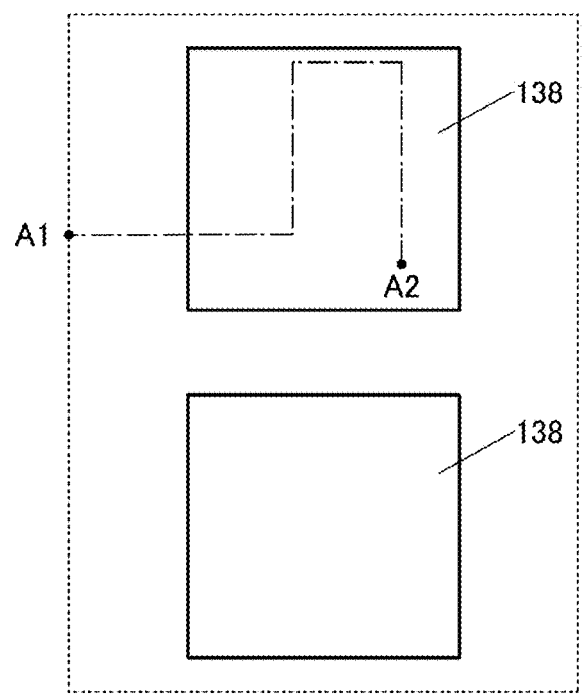
FIGS. 21A and 21B are a top view and a cross-sectional view illustrating a method for manufacturing a semiconductor device.
Figure 21B:
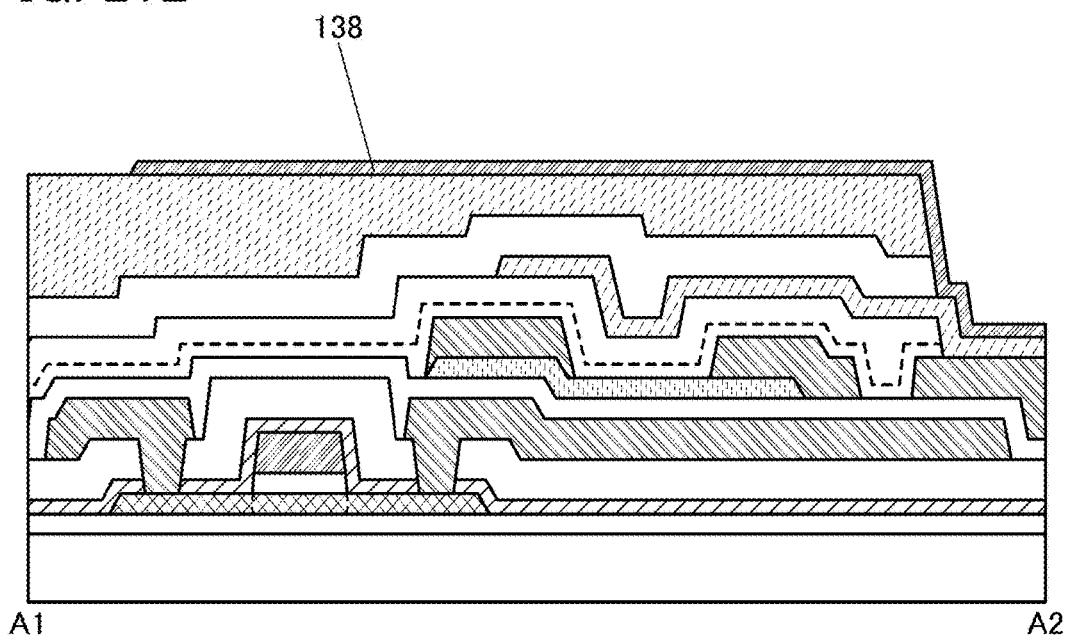

Next, a conductive film is formed over the insulating film 136 and the conductive film 130 and is processed into an island shape, whereby the conductive film 138 is formed (see FIGS. 21A and 21B).

As the conductive film 138 in this embodiment, a stacked film including a 10-nm-thick ITSO film, a 200-nm-thick reflective metal film (a metal film containing silver, palladium, and copper is used here), and a 10-nm-thick ITSO film is used. The stacked film is processed into the conductive film 138 with a wet-etching apparatus.

Figure 22A:
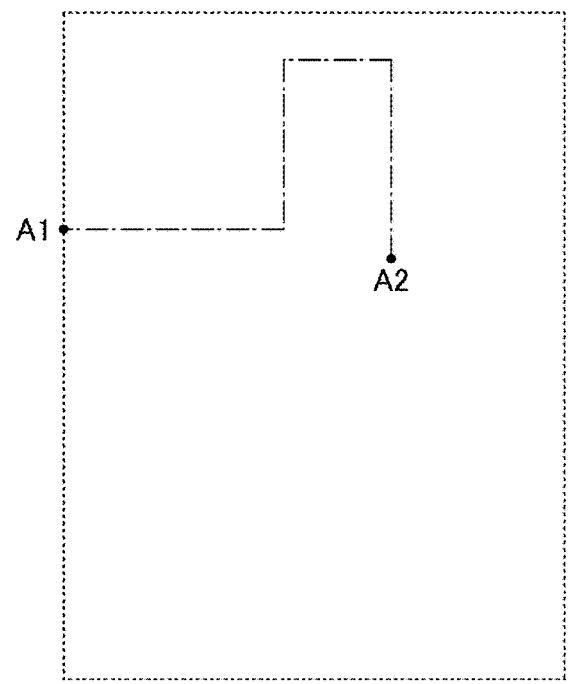
FIGS. 22A and 22B are a top view and a cross-sectional view illustrating a method for manufacturing a semiconductor device.
Figure 22B:
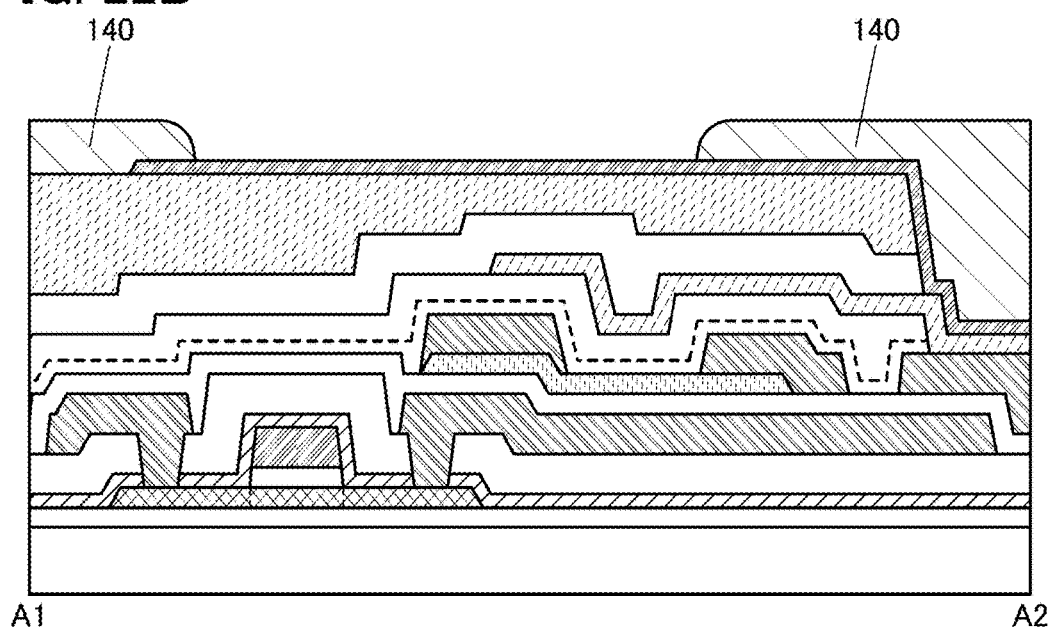

Next, the insulating film 140 having an island shape is formed over the insulating film 136 and the conductive film 138 (see FIGS. 22A and 22B).

As the insulating film 140, a 1.5-μm-thick polyimide-based photosensitive resin film is used.

Figure 23A:
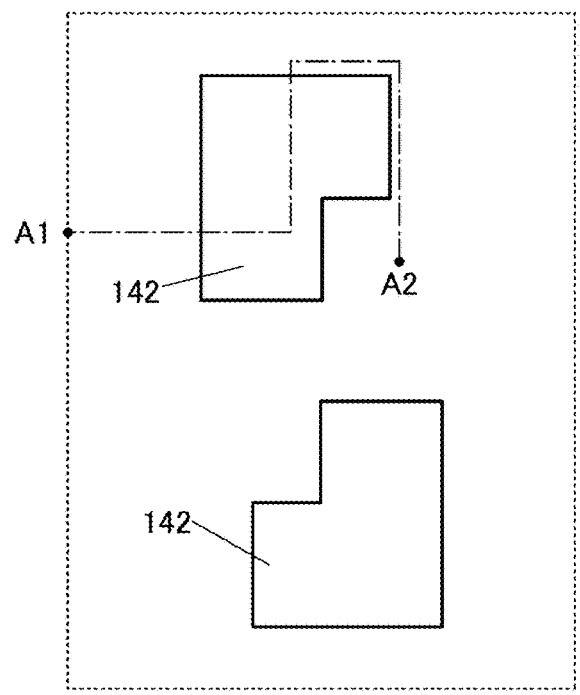
FIGS. 23A and 23B are a top view and a cross-sectional view illustrating a method for manufacturing a semiconductor device.
Figure 23B:
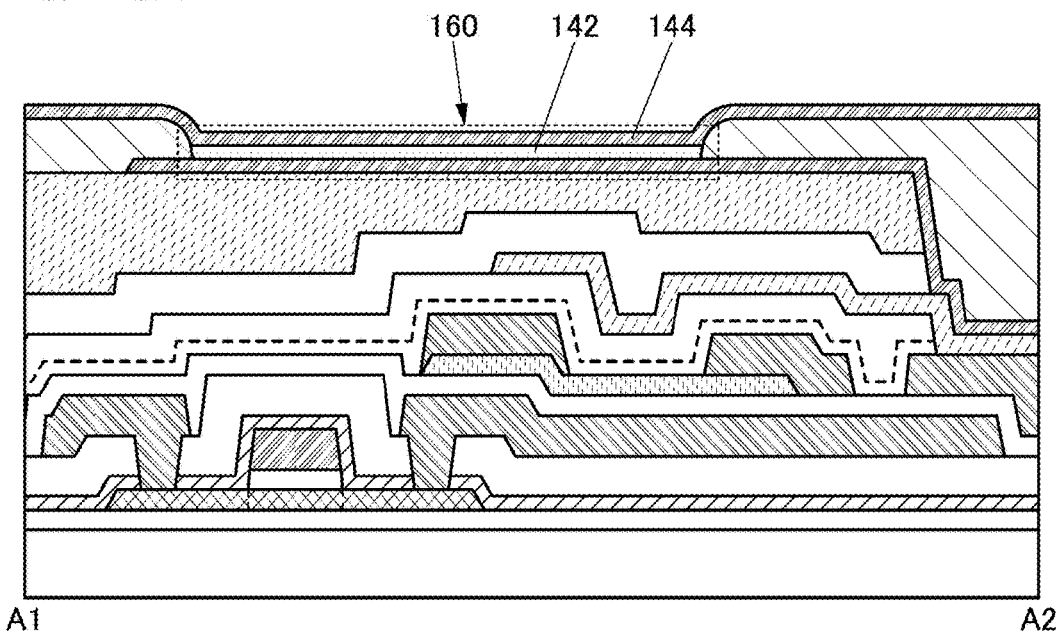

Next, the EL layer 142 is formed over the conductive film 138, and then the conductive film 144 is formed over the insulating film 140 and the EL layer 142, whereby the light-emitting element 160 is obtained (see FIGS. 23A and 23B).

Note that a method for forming the light-emitting element 160 will be described in detail in Embodiment 4.

Through the above steps, the semiconductor device 100A illustrated in FIGS. 4A and 4B can be formed.

When the oxide semiconductor film 108 and the oxide semiconductor film 128 are compared to each other in terms of thermal budget after they are formed, the thermal budget of the oxide semiconductor film 108 is larger than that of the oxide semiconductor film 128, as shown in the above. This is because at least substrate heating for forming the insulating film 110, the insulating film 118, and the like is performed in a period from the end of formation of the oxide semiconductor film 108 to the start of formation of the oxide semiconductor film 128.

The time for heat treatment for reducing the amount of oxygen vacancies in the oxide semiconductor film should be sufficiently long in order to improve the reliability of the transistor; however, minimizing heat treatment temperature and heat treatment time is effective in reducing the manufacturing cost. Oxygen is more likely to diffuse into the oxide semiconductor film 128 than into the oxide semiconductor film 108 in this embodiment as shown in FIGS. 24A to 24C, which will be described later. In other words, the temperature or the time for the heat treatment for reducing the amount of oxygen vacancies in the oxide semiconductor film 128 can be lower or shorter than that for heat treatment for reducing the amount of oxygen vacancies in the oxide semiconductor film 108. That is, using a film into which oxygen is likely to diffuse as the oxide semiconductor film 128 as described in one embodiment of the present invention is effective in reducing the manufacturing cost.

Assuming that the substrate 102 or the insulating film 106 releases a large amount of hydrogen, when hydrogen diffuses into the transistor, hydrogen is bonded to oxygen vacancies and carriers are increased to change the characteristics as described later. Accordingly, to avoid change in the characteristics, the transistor Tr1, which is positioned near a hydrogen source, preferably has a structure which exhibits excellent reliability even when hydrogen diffuses thereinto. An oxide semiconductor film in which hydrogen and oxygen are unlikely to diffuse because of the high film density is used in the transistor Tr1, and an oxide semiconductor film in which hydrogen and oxygen are likely to diffuse is used in the transistor Tr2, which is effective in preventing deterioration due to hydrogen which diffuses from the substrate. In that case, it is preferable that a film in which hydrogen is unlikely to diffuse, e.g., a silicon nitride film, a silicon nitride oxide film, or an aluminum oxide film, be provided below the transistor Tr2.

When the line widths of the conductive films 112a, 112b, 122a, and 122b are reduced for the purpose of reducing the layout area of the transistors, these conductive films might have low resistance to thermomigration depending on their materials. In that case, it is preferable to lower the upper limit of process temperature and shorten the heat treatment time in a thermal budget after formation of the conductive films 112a, 112b, 122a, and 122b. Using the film into which oxygen is likely to diffuse as the oxide semiconductor film 128 as described in one embodiment of the present invention is effective in improving the reliability in the case where the material with low resistance to thermomigration is used.

Thus, in this embodiment, the transistor that has high field-effect mobility but has low resistance to thermomigration and in which the threshold voltage is likely to be changed by hydrogen diffuse is used as an element which is required to have high field-effect mobility in design, whereas the transistor that has low field-effect mobility and high resistance to thermomigration is used as an element which is required to have high reliability in design; accordingly, the layout area of the transistors can be favorably reduced and the deterioration can be inhibited.

Note that the structure and method described in this embodiment can be used in appropriate combination with the structure and method described in any of the other embodiments.

Embodiment 2

<2-1. Composition of Oxide Semiconductor Film>

The composition of an oxide semiconductor film relating to the present invention is described below.

An oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M in some cases.

First, preferred ranges of the atomic ratio of indium, the element M, and zinc contained in an oxide according to an embodiment of the present invention are described with reference to FIGS. 25A to 25C. Note that the proportion of oxygen atoms is not shown in FIGS. 25A to 25C. The terms of the atomic ratio of indium, the element M, and zinc contained in the oxide are denoted by [In], [M], and [Zn], respectively.

Figure 25A:
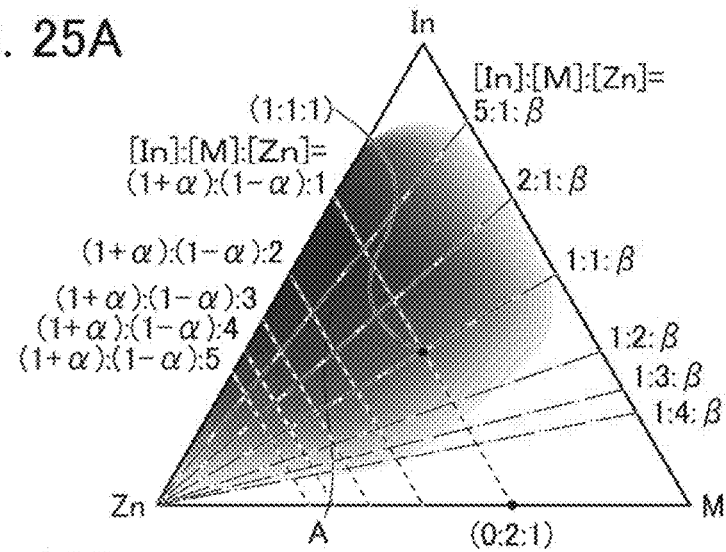
FIGS. 25A to 25C each show the range of the atomic ratio of an oxide semiconductor.
Figure 25B:
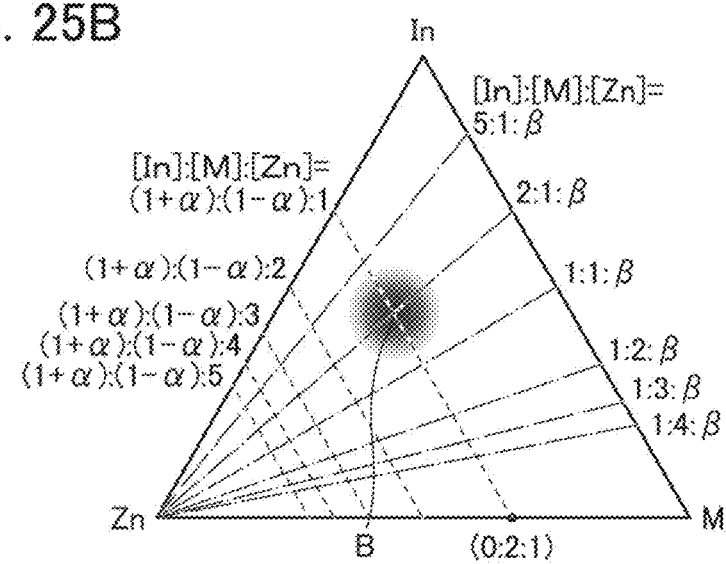
Figure 25C:
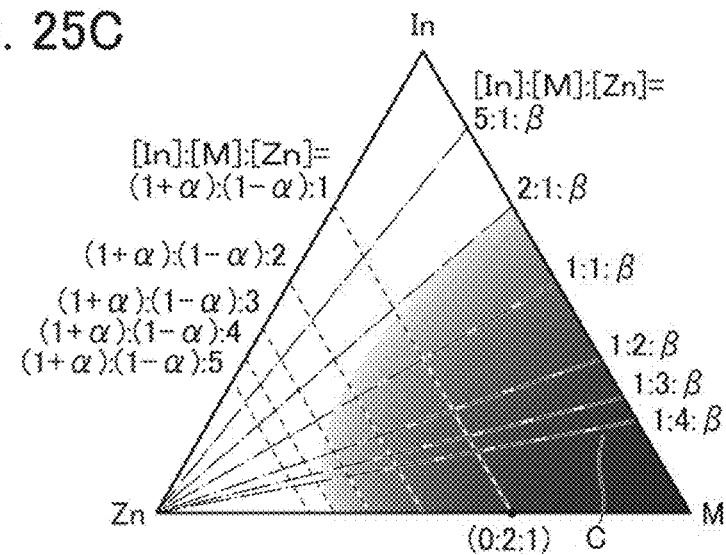

In FIGS. 25A to 25C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Dashed-double dotted lines is a line indicating the atomic ratio $[In]:[M]:[Zn]=(1+\gamma):2:(1-\gamma)$, where $-1 \leq \gamma \leq 1$. The oxides shown in FIGS. 25A to 25C with an atomic ratio of $[In]:[M]:[Zn]=0:2:1$ and the vicinity thereof are likely to have a spinel crystal structure.

FIGS. 25A and 25B show examples of the preferred ranges of the atomic ratio of indium, the element M, and zinc contained in an oxide in one embodiment of the present invention.

Figure 26:
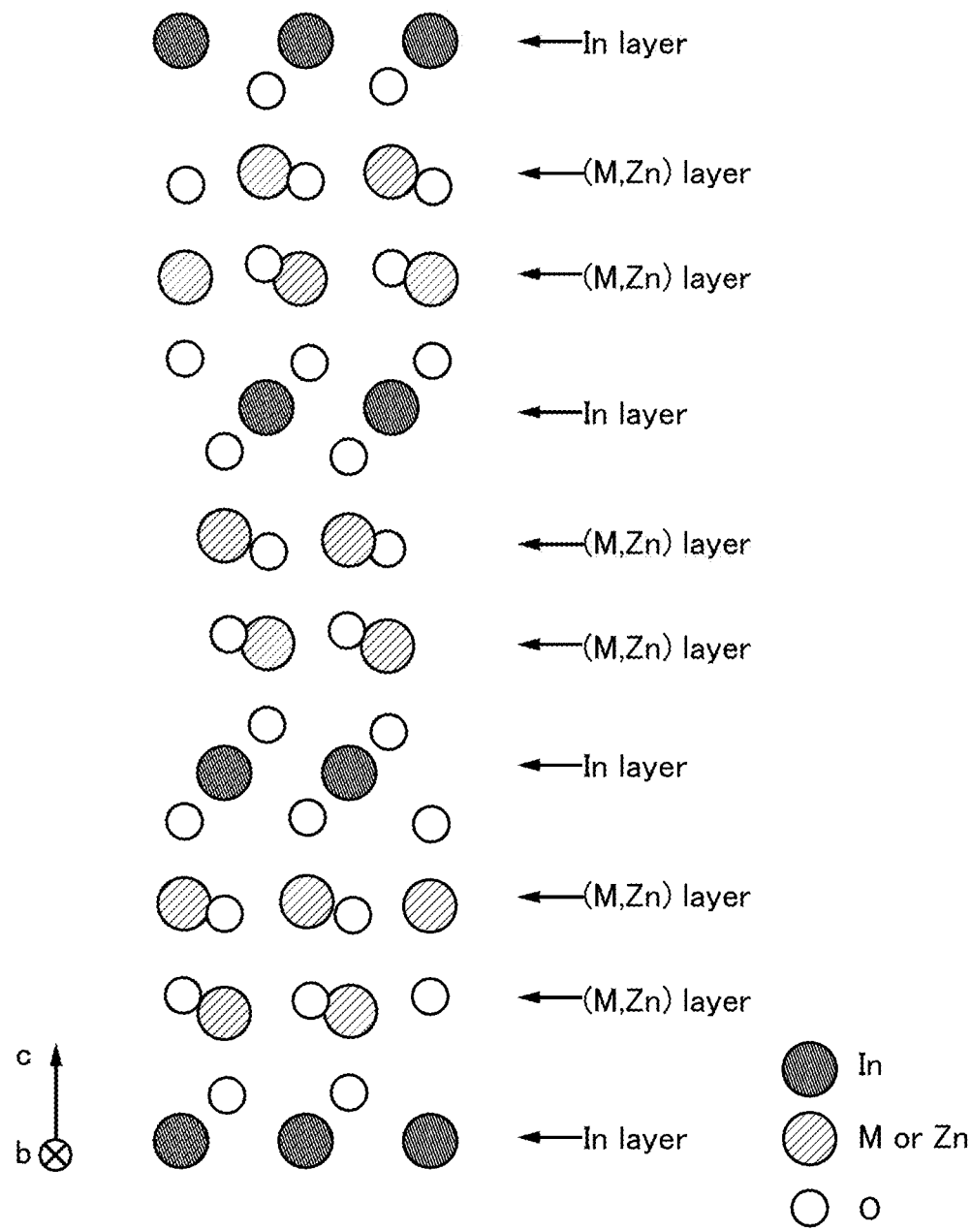
FIG. 26 illustrates a crystal structure of $InMZnO_4$.

FIG. 26 shows an example of the crystal structure of $InMZnO_4$ whose atomic ratio $[In]:[M]:[Zn]$ is 1:1:1. The crystal structure shown in FIG. 26 is $InMZnO_4$ observed from a direction parallel to a b-axis. Note that a metal element in a layer that contains M, Zn, and oxygen (hereinafter, this layer is referred to as an "(M,Zn) layer") in FIG. 26 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 26.

Indium and the element M can be replaced with each other. Thus, when the element M in the (M,Zn) layer is replaced with indium, the layer can also be referred to as an (In,M,Zn) layer. In that case, a layered structure that contains one In layer for every two (In,M,Zn) layers is obtained.

An oxide whose atomic ratio $[In]:[M]:[Zn]$ is 1:1:2 has a layered structure that contains one In layer for every three (M,Zn) layers. In other words, if [Zn] is higher than [In] and [M], the proportion of the (M,Zn) layer to the In layer becomes higher when the oxide is crystallized.

Note that in the case where the number of (M,Zn) layers with respect to one In layer is not an integer in the oxide, the oxide might have a plurality of kinds of layered structures where the number of (M,Zn) layers with respect to one In layer is an integer. For example, in the case of $[In]:[M]:[Zn]=1:1:1.5$, the oxide may have a mix of a layered structure including one In layer for every two (M,Zn) layers and a layered structure including one In layer for every three (M,Zn) layers.

For example, in the case where the oxide is formed with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio $[In]:[M]:[Zn]$ that is close to 0:2:1, two phases of a spinel crystal structure and a layered crystal structure are likely to exist. In addition, with an atomic ratio $[In]:[M]:[Zn]$ that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have high carrier mobility (electron mobility). Therefore, an oxide having a high content of indium has higher carrier mobility than that of an oxide having a low content of indium.

In contrast, when the indium content and the zinc content in an oxide become lower, carrier mobility becomes lower.

Thus, with atomic ratios of $[In]:[M]:[Zn]=0:1:0$ and in the vicinity thereof (e.g., a region C in FIG. 25C), insulation performance becomes better.

Accordingly, an oxide in one embodiment of the present invention preferably has an atomic ratio represented by a region A in FIG. 25A. With the atomic ratio, a layered structure with high carrier mobility and a few grain boundaries is easily obtained.

A region B in FIG. 25B represents an atomic ratio of $[In]:[M]:[Zn]=4:2:3$ to 4:2:4.1 and the vicinity thereof. The vicinity includes an atomic ratio of $[In]:[M]:[Zn]=5:3:4$. An oxide with an atomic ratio represented by the region B is an excellent oxide that has particularly high crystallinity and high carrier mobility.

Note that a condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with a low carrier density is preferably used for the transistor. For example, an oxide whose carrier density is lower than $8 \times 10^{11}$ cm$^{-3}$, preferably lower than $1 \times 10^{11}$ cm$^{-3}$, further preferably lower than $1 \times 10^{10}$ cm$^{-3}$, and greater than or equal to $1 \times 10^9$ cm$^{-3}$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. As examples of the impurities, hydrogen, nitrogen, alkali metal, alkaline earth metal, iron, nickel, silicon, and the like are given.

Here, the influence of impurities in the oxide is described.

When silicon or carbon that is a Group 14 element is contained in the oxide, defect states are formed. Thus, the concentration of silicon or carbon (measured by secondary ion mass spectrometry (SIMS)) is set to be lower than or equal to $2 \times 10^{18}$ atoms/cm$^3$, preferably lower than or equal to $2 \times 10^{17}$ atoms/cm$^3$ in the oxide or around an interface with the oxide.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide.

Specifically, the concentration of alkali metal or alkaline earth metal measured by SIMS is set to be lower than or equal to $1\times10^{18}$ atoms/cm$^3$, preferably lower than or equal to $2\times10^{16}$ atoms/cm$^3$.

When containing nitrogen, the oxide easily becomes n-type by generation of electrons serving as carriers and an increase of carrier density. Thus, a transistor whose semiconductor includes an oxide containing nitrogen is likely to be normally-on. For this reason, nitrogen in the oxide is preferably reduced as much as possible; for example, the concentration of nitrogen in the oxide measured by SIMS is set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, and still more preferably lower than or equal to $5\times10^{17}$ atoms/cm$^3$.

Hydrogen contained in an oxide reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, hydrogen in the oxide is preferably reduced as much as possible. Specifically, the concentration of hydrogen in the oxide measured by SIMS is set to be lower than $1\times10^{20}$ atoms/cm$^3$, preferably lower than $1\times10^{19}$ atoms/cm$^3$, more preferably lower than $5\times10^{18}$ atoms/cm$^3$, and still more preferably lower than $1\times10^{18}$ atoms/cm$^3$.

When an oxide with sufficiently reduced impurity concentration is used for a channel formation region in a transistor, the transistor can have stable electrical characteristics.

<2-2. Carrier Density of Oxide Semiconductor Film>

Next, the carrier density of an oxide semiconductor film will be described below.

Examples of a factor affecting the carrier density of an oxide semiconductor film include oxygen vacancy (Vo) and impurities in the oxide semiconductor film.

As the amount of oxygen vacancy in the oxide semiconductor film increases, the density of defect states increases when hydrogen is bonded to the oxygen vacancy (this state is also referred to as VoH). The density of defect states also increases with an increase in the amount of impurity in the oxide semiconductor film. Hence, the carrier density of an oxide semiconductor film can be controlled by controlling the density of defect states in the oxide semiconductor film.

A transistor using the oxide semiconductor film in a channel region will be described below.

The carrier density of the oxide semiconductor film is preferably reduced in order to inhibit the negative shift of the threshold voltage of the transistor or reduce the off-state current of the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor film is lower than $8\times10^{15}$ cm$^{-3}$, preferably lower than $1\times10^{11}$ cm$^{-3}$, and further preferably lower than $1\times10^{10}$ cm$^3$ and is higher than or equal to $1\times10^{-9}$ cm$^3$.

In contrast, the carrier density of the oxide semiconductor film is preferably increased in order to improve the on-state current of the transistor or improve the field-effect mobility of the transistor. In order to increase the carrier density of the oxide semiconductor film, the impurity concentration or the density of defect states in the oxide semiconductor film is slightly increased. Alternatively, the bandgap of the oxide semiconductor film is preferably narrowed. For example, an oxide semiconductor film that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor film that has a high electron affinity and thus has a narrow bandgap so as to increase the density of thermally excited electrons (carriers) can be regarded as substantially intrinsic. Note that a transistor using an oxide semiconductor film with higher electron affinity has lower threshold voltage.

The carrier density of a substantially intrinsic oxide semiconductor film is preferably higher than or equal to $1\times10^5$ cm$^{-3}$ and lower than $1\times10^{18}$ cm$^{-3}$, further preferably higher than or equal to $1\times10^7$ cm$^3$ and lower than or equal to $1\times10^{17}$ cm$^3$, still further preferably higher than or equal to $1\times10^9$ cm$^3$ and lower than or equal to $5\times10^{16}$ cm$^3$, yet further preferably higher than or equal to $1\times10^{10}$ cm$^3$ and lower than or equal to $1\times10^{16}$ cm$^{-3}$, and yet still preferably higher than or equal to $1\times10^{11}$ cm$^3$ and lower than or equal to $1\times10^{15}$ cm$^{-3}$.

Figure 27:
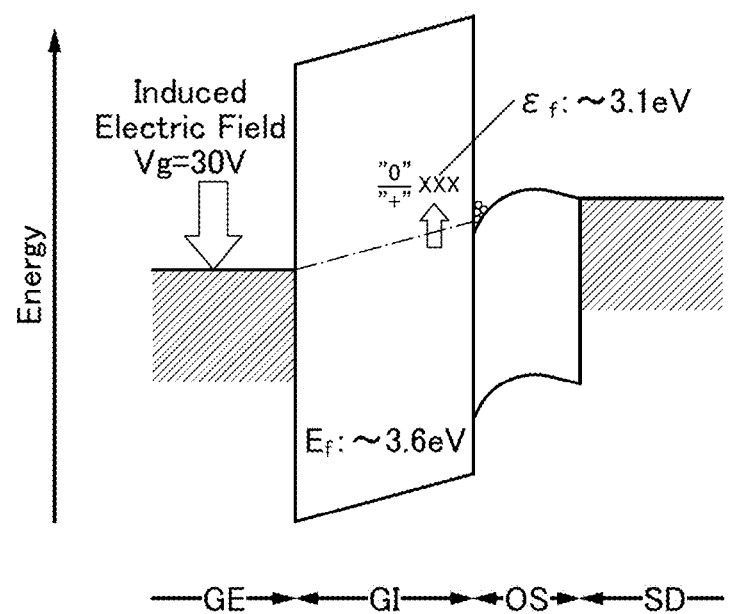
FIG. 27 is an energy band diagram of a transistor in which an oxide semiconductor is used for the channel region.

The use of the substantially intrinsic oxide semiconductor film may improve the reliability of a transistor. Here, the reason for the improvement in the reliability of a transistor which uses the oxide semiconductor film in its channel region is described with reference to FIG. 27. FIG. 27 is an energy band diagram of the transistor which uses the oxide semiconductor film in its channel region.

In FIG. 27, GE, GI, OS, and SD refer to a gate electrode, a gate insulating film, an oxide semiconductor film, and a source/drain electrode, respectively. In other words, FIG. 27 shows an example of energy bands of the gate electrode, the gate insulating film, the oxide semiconductor film, and the source/drain electrode in contact with the oxide semiconductor film.

In FIG. 27, a silicon oxide film and an In—Ga—Zn oxide are used as the gate insulating film and the oxide semiconductor film, respectively. The transition level (cf) of a defect that might be formed in the silicon oxide film is assumed to be formed at a position approximately 3.1 eV away from the conduction band minimum of the gate insulating film. Furthermore, the Fermi level ($E_f$) of the silicon oxide film at the interface between the oxide semiconductor film and the silicon oxide film when the gate voltage ($V_g$) is 30 V is assumed to be formed at a position approximately 3.6 eV away from the conduction band minimum of the gate insulating film. Note that the Fermi level of the silicon oxide film changes depending on the gate voltage. For example, the Fermi level ($E_f$) of the silicon oxide film at the interface between the oxide semiconductor film and the silicon oxide film is lowered as the gate voltage is increased. A white circle and x in FIG. 27 represent an electron (carrier) and a defect state in the silicon oxide film, respectively.

As shown in FIG. 27, when thermal excitation of carriers occurs during the application of a gate voltage, the carriers are trapped by the defect states (x in the diagram) and the charge state of each of the defect states is changed from positive ("+") to neutral ("0"). In other words, when the value obtained by adding the thermal excitation energy to the Fermi level ($E_f$) of the silicon oxide film becomes greater than the transition level ($\in_f$) of the defect, the charge state of the defect states in the silicon oxide film is changed from positive to neutral, so that the threshold voltage of the transistor shifts in the positive direction.

When an oxide semiconductor film with a different electron affinity is used, the Fermi level of the interface between the gate insulating film and the oxide semiconductor film might be changed. When an oxide semiconductor film with a higher electron affinity is used, the conduction band minimum of the gate insulating film becomes relatively high at the interface between the gate insulating film and the oxide semiconductor film or in the vicinity of the interface. In that case, the defect state (x in FIG. 27) which might be formed in the gate insulating film also becomes relatively high, so that the energy difference between the Fermi level of the gate insulating film and the Fermi level of the oxide semiconductor film is increased. The increase in energy difference leads to a reduction in the amount of charge trapped in the gate insulating film. For example, a change in the charge state of the defect states which might be formed in the silicon oxide film becomes smaller, so that a change in the threshold voltage of the transistor by gate bias temperature (GBT) stress can be reduced.

Note that when the oxide semiconductor film is used for a channel region of a transistor, carrier scattering or the like at a grain boundary can be reduced; thus, the transistor can have high field-effect mobility. In addition, the transistor can have high reliability.

Charge trapped by the defect states in the oxide semiconductor film takes a long time to be released and may behave like fixed charge. Thus, the transistor in which a channel region is formed in the oxide semiconductor film having a high density of defect states might have unstable electrical characteristics.

To obtain stable electrical characteristics of the transistor, it is effective to reduce the concentration of impurities in the oxide semiconductor film. In order to reduce the concentration of impurities in the oxide semiconductor film, the concentration of impurities in a film which is adjacent to the oxide semiconductor film is preferably reduced. As examples of the impurities, hydrogen, nitrogen, alkali metal, alkaline earth metal, iron, nickel, silicon, and the like are given.

Here, the influence of impurities in the oxide semiconductor film is described.

When silicon or carbon that is one of Group 14 elements is contained in the oxide semiconductor film, defect states are formed. Thus, the concentration of silicon or carbon in the oxide semiconductor film and around an interface with the oxide semiconductor film (measured by secondary ion mass spectrometry (SIMS)) is set lower than or equal to $2 \times 10^{18}$ atoms/cm$^3$, and preferably lower than or equal to $2 \times 10^{17}$ atoms/cm$^3$.

When the oxide semiconductor film contains alkali metal or alkaline earth metal, defect states are formed and carriers are generated, in some cases. Thus, a transistor including an oxide semiconductor film that contains alkali metal or alkaline earth metal is likely to be normally-on. Therefore, it is preferable to reduce the concentration of alkali metal or alkaline earth metal in the oxide semiconductor film. Specifically, the concentration of alkali metal or alkaline earth metal in the oxide semiconductor film measured by SIMS is set lower than or equal to $1 \times 10^{18}$ atoms/cm$^3$, and preferably lower than or equal to $2 \times 10^{16}$ atoms/cm$^3$.

When the oxide semiconductor film contains nitrogen, the oxide semiconductor film easily becomes n-type by generation of electrons serving as carriers and an increase of carrier density. Thus, a transistor whose semiconductor includes an oxide semiconductor film that contains nitrogen is likely to be normally-on. For this reason, nitrogen in the oxide semiconductor film is preferably reduced as much as possible; for example, the concentration of nitrogen in the oxide semiconductor film measured by SIMS is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide semiconductor film reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Accordingly, it is preferable that hydrogen in the oxide semiconductor film be reduced as much as possible. Specifically, the hydrogen concentration of the oxide semiconductor film measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide semiconductor film with sufficiently reduced impurity concentration is used for a channel formation region in a transistor, the transistor can have stable electrical characteristics.

The energy gap of the oxide semiconductor film is preferably 2 eV or more or 2.5 eV or more.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 60 nm.

<2-3. Structure of Oxide Semiconductor>

Next, a structure of an oxide semiconductor is described.

An oxide semiconductor is classified into a single-crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

[CAAC-OS]

First, a CAAC-OS is described.

A CAAC-OS is one of oxide semiconductors and has a plurality of c-axis aligned crystal parts (also referred to as pellets).

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element constituting a part of an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

[nc-OS]

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

The nc-OS is an oxide semiconductor that has higher regularity than an amorphous oxide semiconductor. Thus, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS in some cases.

[a-Like OS]

An a-like OS has a structure between the structure of an nc-OS and the structure of an amorphous oxide semiconductor.

The a-like OS contains a void or a low-density region. The a-like OS has an unstable structure because it contains a void.

The a-like OS has a lower density than the nc-OS and the CAAC-OS because it contains a void. Specifically, the density of the a-like OS is higher than or equal to 78.6% and lower than 92.3% of the density of the single-crystal oxide semiconductor having the same composition. The density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, in the case of an oxide semiconductor whose atomic ratio of In to Ga and Zn is 1:1:1, the density of single-crystal $InGaZnO_4$ with a rhombohedral crystal structure is 6.357 $g/cm^3$. Accordingly, in the case of the oxide semiconductor whose atomic ratio of In to Ga and Zn is 1:1:1, the density of the a-like OS is higher than or equal to 5.0 $g/cm^3$ and lower than 5.9 $g/cm^3$, for example. In the case of the oxide semiconductor whose atomic ratio of In to Ga and Zn is 1:1:1, the density of the nc-OS and the density of the CAAC-OS are each higher than or equal to 5.9 $g/cm^3$ and lower than 6.3 $g/cm^3$, for example.

In the case where an oxide semiconductor having a certain composition does not exist in a single-crystal state, single-crystal oxide semiconductors with different compositions are combined at an adequate ratio, which makes it possible to calculate a density equivalent to that of a single-crystal oxide semiconductor with the desired composition. The density of a single-crystal oxide semiconductor having the desired composition may be calculated using a weighted average with respect to the combination ratio of the single-crystal oxide semiconductors with different compositions. Note that it is preferable to use as few kinds of single-crystal oxide semiconductors as possible to calculate the density.

As described above, oxide semiconductors have various structures and various properties. In the oxide semiconductor film of one embodiment of the present invention, two or more of an amorphous oxide semiconductor, an a-like OS, an nc-OS, and a CAAC-OS may be mixed. An example of such a case is described below.

The oxide semiconductor film of one embodiment of the present invention can include two kinds of crystal parts. That is, two kinds of crystal parts are mixed in the oxide semiconductor film. One is a crystal part (also referred to as a first crystal part) having orientation in the thickness direction (also referred to as a film-plane direction, or a direction perpendicular to a formation surface or a film surface), i.e., a crystal part having c-axis alignment. The other is a crystal part (also referred to as a second crystal part) which does not have c-axis alignment and has random orientation.

Although crystal parts are divided into the two categories for simplicity: the first crystal part having c-axis alignment and the second crystal part having no c-axis alignment, the first crystal part and the second crystal part cannot be distinguished from each other in some cases because there is not much difference in crystallinity, crystal size, and the like. That is, the oxide semiconductor film of one embodiment of the present invention can be described without a distinction between the first crystal part and the second crystal part.

For example, the oxide semiconductor film of one embodiment of the present invention includes a plurality of crystal parts, and at least one of the crystal parts may have c-axis alignment. Furthermore, in the crystal parts existing in the film, the proportion of crystal parts having no c-axis alignment may be higher than that of crystal parts having c-axis alignment. For example, in a transmission electron microscope image of a cross section of the oxide semiconductor film which is one embodiment of the present invention in the thickness direction, a plurality of crystal parts are observed and the second crystal parts having no c-axis alignment are observed at a higher proportion than the first crystal parts having c-axis alignment in some cases. In other words, the oxide semiconductor film of one embodiment of the present invention has a high proportion of second crystal parts having no c-axis alignment.

When the oxide semiconductor film has a high proportion of second crystal parts having no c-axis alignment, the following effects can be obtained.

In the case where a source which supplies sufficient oxygen is provided in the vicinity of the oxide semiconductor film, the second crystal part having no c-axis alignment can serve as an oxygen diffusion path. Thus, in the case where a source which supplies sufficient oxygen is provided in the vicinity of the oxide semiconductor film, oxygen can be supplied from the source to the first crystal part having c-axis alignment through the second crystal part having no c-axis alignment. Accordingly, the amount of oxygen vacancy in the oxide semiconductor film can be reduced. When such an oxide semiconductor film is used as a semiconductor film of a transistor, high reliability and high field-effect mobility can be obtained.

In the first crystal part, particular crystal planes are aligned in the thickness direction. Accordingly, when an X-ray diffraction (XRD) measurement is performed in a direction substantially perpendicular to the top surface of the oxide semiconductor film including the first crystal parts, a diffraction peak derived from the first crystal parts is observed at a predetermined diffraction angle (2θ). However, even when the oxide semiconductor film includes the first crystal parts, a diffraction peak is not sufficiently observed in some cases because of x-rays scattering or increase in background due to a support substrate. Note that the higher the proportion of the first crystal parts in the oxide semiconductor film is, the higher the diffraction peak becomes; thus, the height (intensity) of the diffraction peak can be an indicator of crystallinity of the oxide semiconductor film.

As an example of a method for evaluating crystallinity of the oxide semiconductor film, electron diffraction can be given. For example, in the case where an electron diffraction measurement is performed on a cross section of the oxide semiconductor film of one embodiment of the present invention and an electron diffraction pattern thereof is observed, first regions including diffraction spots derived from the first crystal parts and second regions including diffraction spots derived from the second crystal parts are observed.

The first regions including diffraction spots derived from the first crystal parts are derived from crystal parts having c-axis alignment. The second regions including diffraction spots derived from the second crystal parts are derived from crystal parts having no orientation or crystal parts having random orientation. Therefore, different patterns are observed in accordance with the diameter of an electron beam, i.e., the area of an observed region in some cases. Note that in this specification and the like, electron diffraction with an electron beam having a diameter of 1 nmϕ to 100 nmϕ inclusive is referred to as nanobeam electron diffraction (NBED).

Note that the crystallinity of the oxide semiconductor film of one embodiment of the present invention may be evaluated by a method different from NBED. As examples of a method for evaluating crystallinity of the oxide semiconductor film, electron diffraction, x-ray diffraction, neutron diffraction, and the like can be given. Among the electron diffractions, transmission electron microscopy (TEM), scanning electron microscopy (SEM), convergent beam electron diffraction (CBED), selected-area electron diffraction (SAED), and the like can be favorably used in addition to the above NBED.

In NBED, a ring-like pattern is observed in a nanobeam electron diffraction pattern obtained by using an electron beam having a large diameter (e.g., greater than or equal to 25 nmϕ and less than or equal to 100 nmϕ, or greater than or equal to 50 nmϕ and less than or equal to 100 nmϕ). The ring-like pattern has luminance distribution in a radial direction in some cases. On the other hand, in an electron diffraction pattern of NBED obtained by using an electron beam having a sufficiently small diameter (e.g., greater than or equal to 1 nmϕ and less than or equal to 10 nmϕ), a plurality of spots distributed in a circumferential direction (also referred to as B direction) are observed at the position of the ring-like pattern. That is, the ring-like pattern obtained by using an electron beam having a large diameter is formed from an aggregate of the plurality of spots.

<2-4. Evaluation of Crystallinity of Oxide Semiconductor Film>

Three samples (Samples X1 to X3) each including an oxide semiconductor film were fabricated and the crystallinity of each of the samples was evaluated. Three kinds of oxide semiconductor films were formed in different conditions. First, methods for fabricating Samples X1 to X3 are described.

[Sample X1]

Sample X1 is a sample in which an approximately 100-nm-thick oxide semiconductor film is formed over a glass substrate. The oxide semiconductor film contains indium, gallium, and zinc. The oxide semiconductor film used for Sample X1 was formed under the following conditions: the substrate temperature was 170° C.; an argon gas with a flow rate of 140 sccm and an oxygen gas with a flow rate of 60 sccm were introduced into a chamber of the sputtering apparatus; the pressure was set to 0.6 Pa; and an AC power of 2.5 kW was applied to a metal oxide target containing indium, gallium, and zinc (In:Ga:Zn=4:2:4.1 [atomic ratio]). Note that the oxygen flow rate percentage under the formation conditions for Sample X1 was 30%.

[Sample X2]

Sample X2 is a sample in which an approximately 100-nm-thick oxide semiconductor film is formed over a glass substrate. The oxide semiconductor film used for Sample X2 was formed under the following conditions: the substrate temperature was 130° C.; and an argon gas with a flow rate of 180 sccm and an oxygen gas with a flow rate of 20 sccm were introduced into a chamber of the sputtering apparatus. The oxygen flow rate percentage under the formation conditions for Sample X2 was 10%. Note that the conditions other than the substrate temperature and the oxygen flow rate percentage are the same as those for Sample X1.

[Sample X3]

Sample X3 is a sample in which an approximately 100-nm-thick oxide semiconductor film is formed over a glass substrate. The oxide semiconductor film used for Sample X3 was formed under the following conditions: the substrate temperature was room temperature (R.T.); an argon gas with a flow rate of 180 sccm and an oxygen gas with a flow rate of 20 sccm were introduced into a chamber of the sputtering apparatus. The oxygen flow rate percentage under the formation conditions for Sample X3 was 10%. Note that the conditions other than the substrate temperature and the oxygen flow rate percentage are the same as those for Sample X1.

The conditions for forming Samples X1 to X3 are shown in Table 1.

TABLE 1

| | Target [atomic ratio] | Substrate temperature [° C.] | Pressure [Pa] | Oxygen flow rate percentage [%] |
|---|---|---|---|---|
| Sample X1 | In:Ga:Zn = 4:2:4.1 | 170 | 0.6 | 30 |
| Sample X2 | In:Ga:Zn = 4:2:4.1 | 130 | 0.6 | 10 |
| Sample X3 | In:Ga:Zn = 4:2:4.1 | R.T. | 0.6 | 10 |

Next, the crystallinity of Samples X1 to X3 was evaluated. In this embodiment, cross-sectional TEM observation, XRD measurement, and electron diffraction were performed to evaluate crystallinity.

[Cross-Sectional TEM Observation]

Figure 28A:
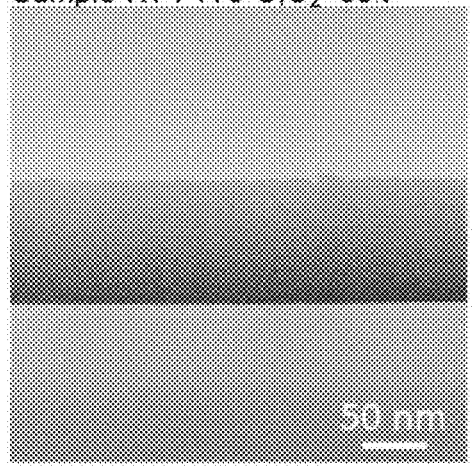
FIGS. 28A to 28C are cross-sectional TEM images and a cross-sectional HR-TEM image of an oxide semiconductor film.
Figure 28B:
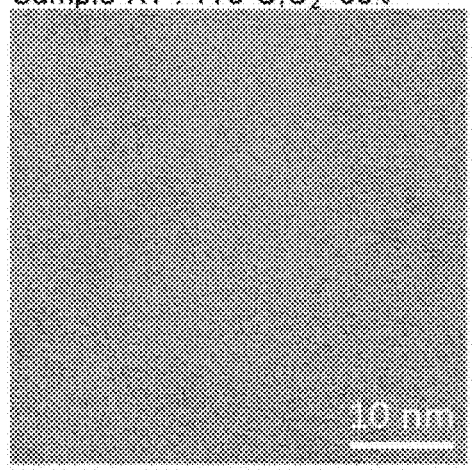
Figure 28C:
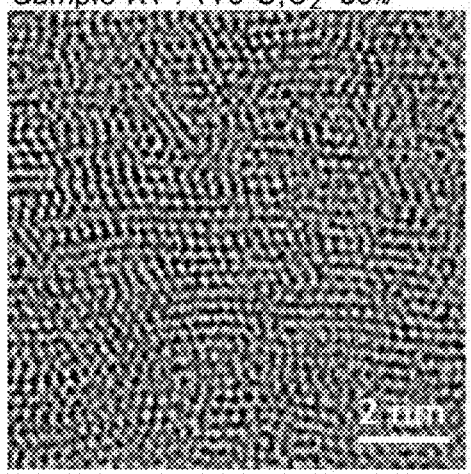
Figure 29A:
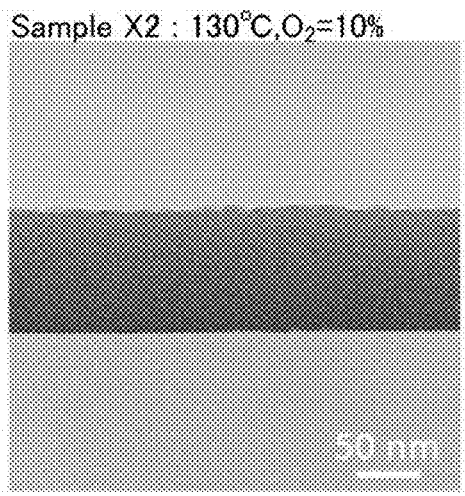
FIGS. 29A to 29C are cross-sectional TEM images and a cross-sectional HR-TEM image of an oxide semiconductor film.
Figure 29B:
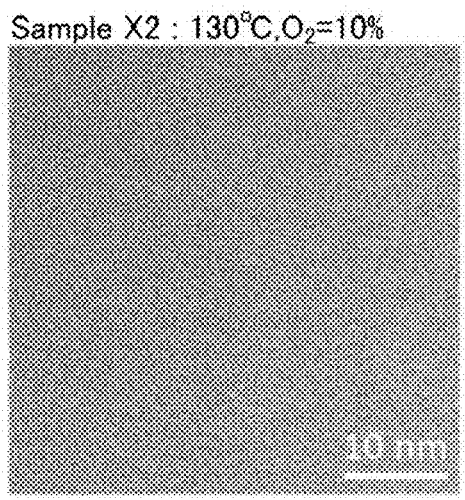
Figure 29C:
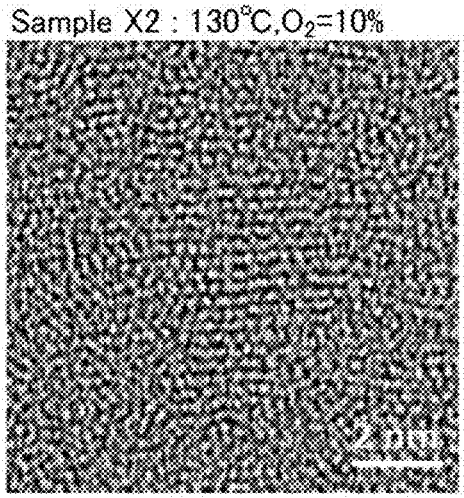
Figure 30A:
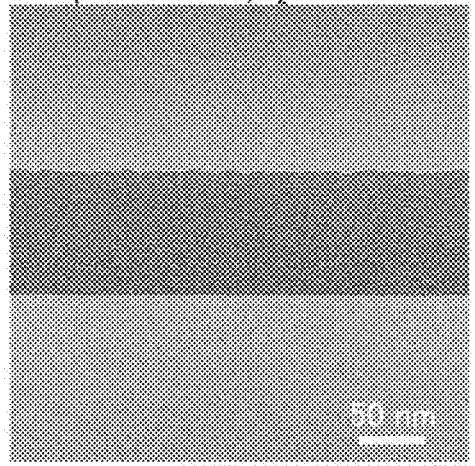
FIGS. 30A to 30C are cross-sectional TEM images and a cross-sectional HR-TEM image of an oxide semiconductor film.
Figure 30B:
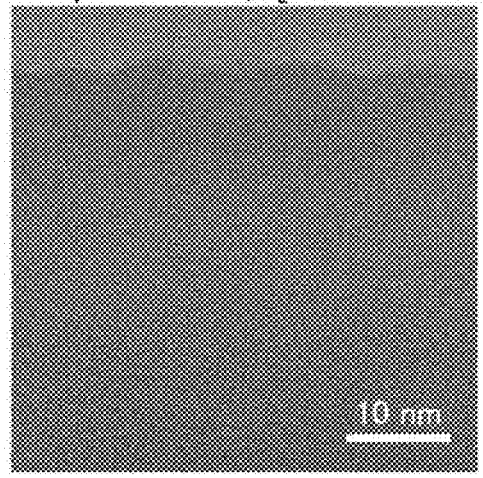

FIGS. 28A to 28C, FIGS. 29A to 29C, and FIGS. 30A to 30C show cross-sectional TEM observation results of Samples X1 to X3. FIGS. 28A and 28B are cross-sectional TEM images of Sample X1. FIGS. 29A and 29B are cross-sectional TEM images of Sample X2. FIGS. 30A and 30B are cross-sectional TEM images of Sample X3.

Figure 30C:
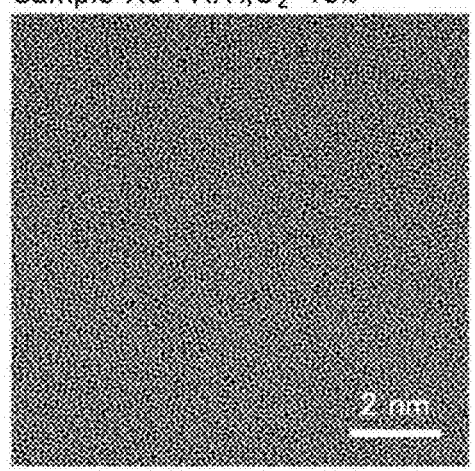

FIG. 28C, FIG. 29C, and FIG. 30C are cross-sectional high resolution transmission electron microscope (HR-TEM) images of Sample X1, Sample X2, and Sample X3, respectively. The cross-sectional HR-TEM images may be obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

As shown in FIGS. 28A to 28C and FIGS. 29A to 29C, crystal parts in which atoms are aligned in a layered manner in the thickness direction are observed in Sample X1 and Sample X2. In particular, in HR-TEM images, crystal parts in which atoms are aligned in a layered manner are easily observed. As shown in FIGS. 30A to 30C, the state where atoms are aligned in a layered manner in the thickness direction is unlikely to be observed in Sample X3.

[XRD Measurement]

Next, XRD measurement results of the samples will be described.

Figure 31A:
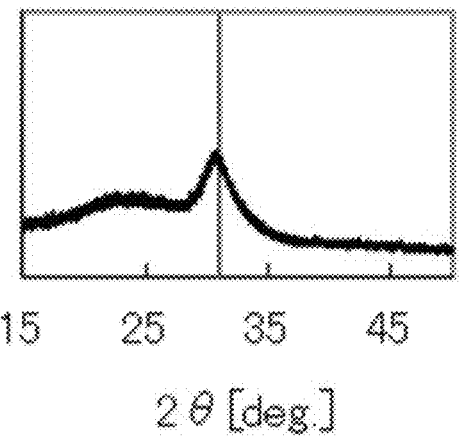
FIGS. 31A to 31C show an XRD measurement results and electron diffraction patterns of an oxide semiconductor film.
Figure 32A:
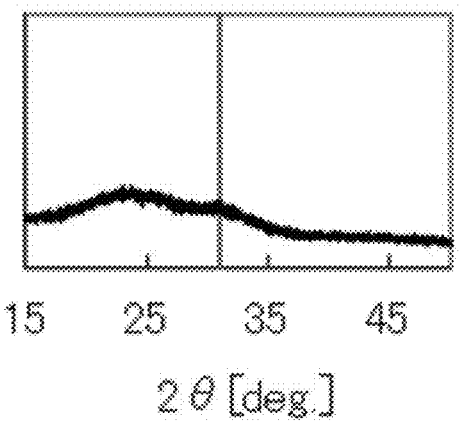
FIGS. 32A to 32C show XRD measurement results and electron diffraction patterns of an oxide semiconductor film.
Figure 33A:
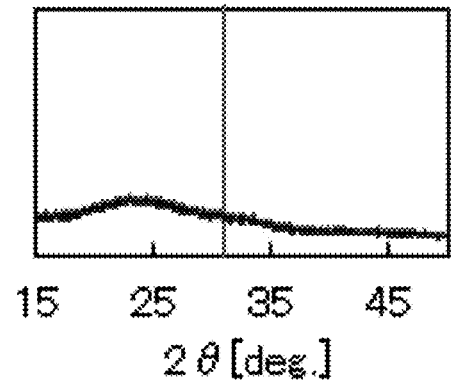
FIGS. 33A to 33C show XRD measurement results and electron diffraction patterns of an oxide semiconductor film.

FIG. 31A, FIG. 32A, and FIG. 33A show XRD measurement results of Sample X1, Sample X2, and Sample X3, respectively.

The XRD measurement was conducted by a powder method (also referred to as a θ-2θ method) which is a kind of an out-of-plane method. Note that in a θ-2θ method, X-ray diffraction intensity is measured while an incident angle of an X-ray is changed and the angle of a detector facing an X-ray source is equal to the incident angle. Note that a grazing-incidence XRD (GIXRD) method (also referred to as a thin film method or a Seemann-Bohlin method) may be used. The GIXRD method is a kind of an out-of-plane method for measuring X-ray diffraction intensity in which X-ray is incident at an angle approximately 0.40° from a film surface with use of a variable-angle detector. In FIG. 31A, FIG. 32A, and FIG. 33A, the vertical axis represents diffraction intensity in arbitrary unit and the horizontal axis represents the angle 2θ.

As shown in FIG. 31A and FIG. 32A, a peak of diffraction intensity is observed at around 2θ=31° in each of Sample X1 and Sample X2. In contrast, as shown in FIG. 33A, in Sample X3, a peak of diffraction intensity at around 2θ=31° is unlikely to be observed. Alternatively, a peak of diffraction intensity at around 2θ=31° is extremely small or does not exist.

The diffraction angle (at around 2θ=31°) at which the peak of the diffraction intensity was observed corresponds to a diffraction angle on the (009) plane of the structure model of single crystal InGaZnO$_4$. Accordingly, the above peaks indicate that each of Samples X1 and X2 includes a crystal part where the c-axes are aligned in the thickness direction (hereinafter also referred to as a crystal part having c-axis alignment or a first crystal part). Note that it is difficult to determine, by XRD measurement, whether a crystal part having c-axis alignment is included in Sample X3.

[Electron Diffraction]

Next, electron diffraction measurement results of Samples X1 to X3 are described below. In the electron diffraction measurement, an electron diffraction pattern was obtained in such a manner that each of the samples is irradiated with an electron beam incident in a direction perpendicular to its cross section. The electron-beam diameters were set to 1 nmϕ and 100 nmϕ.

In electron diffraction, as the diameter of an incident electron beam is larger and the thickness of sample is larger, information of the sample in the depth direction is likely to be shown in the electron diffraction pattern. Therefore, the information of local regions can be obtained by reducing not only the diameter of the electron beam but also the thickness of the sample in the depth direction. In contrast, when the thickness of the sample in the depth direction is too small (e.g., the thickness of the sample in the depth direction is less than or equal to 5 nm), information of only submicroscopic region is obtained. Thus, an electron diffraction pattern obtained when a crystal exists in the submicroscopic region is similar to an electron diffraction pattern of a single crystal in some cases. When the aim is not to analyze the submicroscopic region, the thickness of the sample in the depth direction is preferably greater than or equal to 10 nm and less than or equal to 100 nm, typically greater than or equal to 10 nm and less than or equal to 50 nm.

Figure 31B:
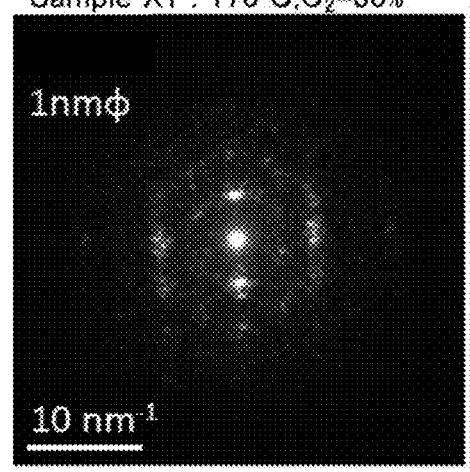
Figure 31C:
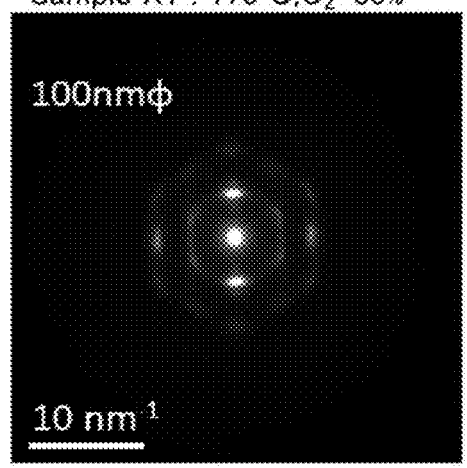
Figure 32B:
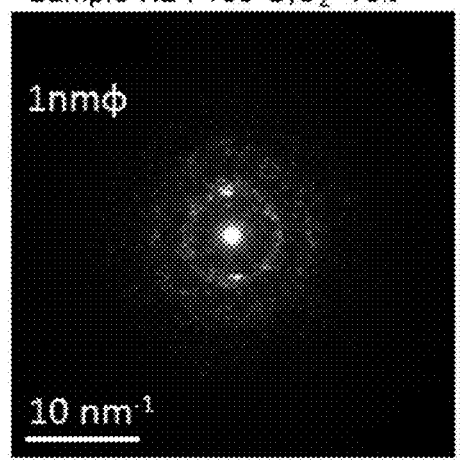
Figure 32C:
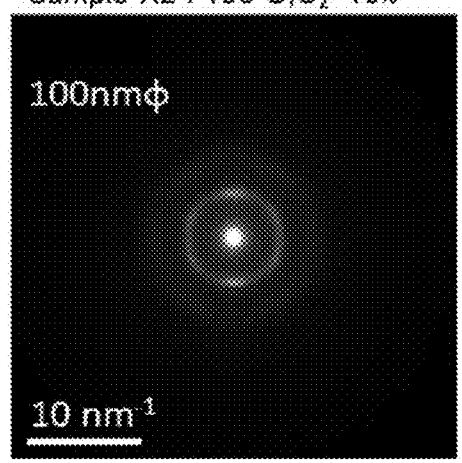
Figure 33B:
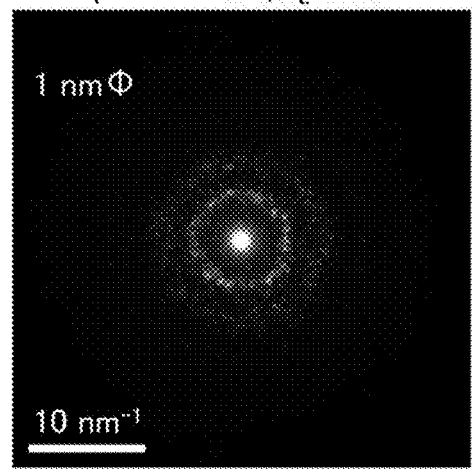
Figure 33C:
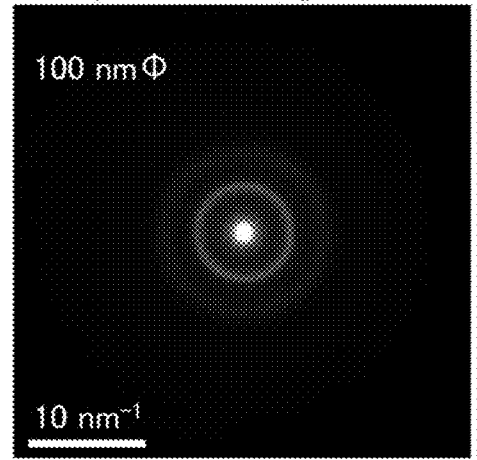

FIGS. 31B and 31C show electron diffraction patterns of Sample X1. FIGS. 32B and 32C show electron diffraction patterns of Sample X2. FIGS. 33B and 33C show electron diffraction patterns of Sample X3.

The contrast of the electron diffraction patterns shown in FIGS. 31B and 31C, FIGS. 32B and 32C, and FIGS. 33B and 33C is adjusted for clarity. In FIGS. 31B and 31C, FIGS. 32B and 32C, and FIGS. 33B and 33C, the brightest luminescent spot at the center of the pattern is derived from the incident electron beam and is the center of the electron diffraction pattern (also referred to as a direct spot or a transmitted wave).

As shown in FIG. 31B, when the diameter of the incident electron beam is set to 1 nmϕ, a plurality of spots circumferentially distributed can be observed. This indicates that the oxide semiconductor film contains a plurality of submicroscopic crystal parts having random surface orientation. As shown in FIG. 31C, when the diameter of the incident electron beam is set to 100 nmϕ, the luminances of a sequence of a plurality of diffraction spots derived from these plurality of crystal parts are averaged to be a ring-like diffraction pattern. Two ring-like diffraction patterns with different radii are observed in FIG. 31C. The rings are referred to as a first ring and a second ring in ascending order of radius. It is observed that the luminance of the first ring is higher than that of the second ring. In addition, two spots (referred to as first regions) with high luminance are observed at a position overlapping with the first ring.

The distance from the center to the first ring in a radial direction substantially corresponds to the distance from the center to a diffraction spot on the (009) plane of the structure model of single crystal InGaZnO$_4$ in a radical direction. The first regions are diffraction spots derived from c-axis alignment.

As shown in FIG. 31C, the observations of the ring-like diffraction patterns indicate that crystal parts having random orientation (hereinafter also referred to as crystal parts having no c-axis alignment or second crystal parts) exist in the oxide semiconductor film.

In addition, two first regions are presumed to have two-hold symmetry because the regions are disposed symmetrically with respect to the center point of the electron diffraction pattern and the luminances of the regions are substantially equal to each other. As described above, since the two first regions are diffraction spots which are derived from the c-axis alignment, the orientation of a straight line which passes through the two first regions and the center is aligned with that of the c-axis of the crystal part. The thickness direction is the vertical direction of FIG. 31C, which suggests the presence of crystal part in which the c-axis is aligned in the thickness direction in the oxide semiconductor film.

As described above, the oxide semiconductor film of Sample X1 is confirmed to be a film including both crystal parts having c-axis alignment and crystal parts having no c-axis alignment.

The results of the electron diffraction patterns shown in FIGS. 32B and 32C and FIGS. 33B and 33C are substantially the same as those of the electron diffraction patterns shown in FIGS. 31B and 31C. The luminance of the two spots (first regions) derived from c-axis alignment is high in the order of Sample X1, Sample X2 and Sample X3. This indicates that the proportion of crystal parts having c-axis alignment is high in that order.

[Quantification Method of Crystallinity of Oxide Semiconductor Film]

Next, an example of a quantification method of crystallinity of an oxide semiconductor film is described with reference to FIGS. 34A and 34B, FIG. 35, and FIG. 36.

First, an electron diffraction pattern is prepared (see FIG. 34A).

FIG. 34A shows an electron diffraction pattern obtained by measuring a 100-nm-thick oxide semiconductor film using an electron beam with a diameter of 100 nm. FIG. 34B shows an electron diffraction pattern obtained by adjusting contrast of the electron diffraction pattern shown in FIG. 34A.

In FIG. 34B, two clear spots (first regions) are observed over and under a direct spot. The two spots (first regions) are derived from diffraction spots corresponding to (001) in a structure model of $InGaZnO_4$, that is, crystal parts having c-axis alignment. In addition to the first regions, a ring-like pattern (second regions) with a low luminance positioned on an approximately concentric circle of the first region is observed. The ring-like pattern is obtained when the luminances of spots derived from structures of crystal parts having no c-axis alignment (second crystal parts) are averaged by using the electron beam with a diameter of 100 nm.

Here, in the electron diffraction pattern, the first regions including diffraction spots derived from the crystal parts having c-axis alignment and the second regions including diffraction spots derived from the second crystal parts are observed to overlap with each other. Thus, a line profile including the first regions and line profiles including the second regions are obtained and compared with each other, whereby the crystallinity of the oxide semiconductor film can be quantified.

The line profile including the first regions and the line profiles including the second regions are described with reference to FIG. 35.

Figure 35:
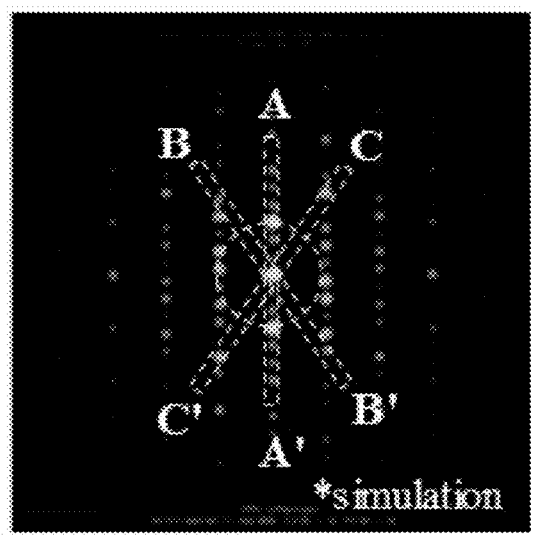
FIG. 35 shows line profiles of an electron diffraction pattern.

FIG. 35 shows a simulation pattern of electron diffraction that is obtained when an electron beam is emitted to the (100) plane of the structure model of $InGaZnO_4$. In the simulation pattern, auxiliary lines of a region A-A', a region B-B', and a region C-C' are drawn.

The region A-A' in FIG. 35 includes a straight line passing through two diffraction spots derived from the first crystal parts having c-axis alignment and a direct spot. The regions B-B' and C-C' in FIG. 35 each include a straight line passing through regions where no diffraction spot derived from the first crystal part having c-axis alignment is observed and a direct spot. An angle between the region A-A' and the region B-B' or C-C' is approximately 34°, specifically, larger than or equal to 30° and smaller than or equal to 38°, preferably larger than or equal to 32° and smaller than or equal to 36°, further preferably larger than or equal to 33° and smaller than or equal to 35°.

The line profiles have the tendencies shown in FIG. 36 in accordance with the structure of the oxide semiconductor film. FIG. 36 shows image diagrams of line profiles, relative luminance R, and a half width (FWHM: full width at half maximum) of a spectrum derived from c-axis alignment that is obtained from an electron diffraction pattern of each structure.

Relative luminance R in FIG. 36 is obtained by dividing the integrated intensity of luminance of the region A-A' by the integrated intensity of luminance of the region B-B' or the integrated intensity of luminance of the region C-C'. Note that the integrated intensity of luminance of each of the regions A-A', B-B', and C-C' is obtained by removing the luminance of background derived from the direct spot which appears at the center.

When the relative luminance R is calculated, the intensity of c-axis alignment can be quantitatively defined. For example, as shown in FIG. 36, in a single-crystal oxide semiconductor film, the peak intensity of diffraction spots derived from the first crystal parts having c-axis alignment in the region A-A' is high and there is no diffraction spot derived from the first crystal part having c-axis alignment in the regions B-B' and C-C'; thus, the relative luminance R is much larger than 1. The relative luminance R decreases in the order of single crystal, only CAAC (details of CAAC will be described later), CAAC+nanocrystal, nanocrystal, and amorphous. In particular, in nanocrystal and amorphous, which have no particular orientation, the relative luminance R is equal to 1.

As the periodicity of the crystal is higher, the intensity of the spectrum derived from the first crystal part having c-axis alignment becomes high and the half width of the spectrum becomes small. Thus, the half width of single crystal is the smallest, and the half width is increased in the order of only CAAC, CAAC+nanocrystal, and nanocrystal. The half width of amorphous is extremely large and the profile thereof is called a "halo".

[Analysis Using Line Profile]

As described above, the ratio of the integrated intensity of luminance of the first regions to the integrated intensity of luminance of the second regions is important information to presume the proportion of crystal parts having orientation.

Then, from electron diffraction patterns of Samples X1 to X3, which are described above, analysis with line profiles was performed.

FIGS. 37A1 and 37A2 show results of analysis with line profiles of Sample X1. FIGS. 37B1 and 37B2 show results of analysis with line profiles of Sample X2. FIGS. 37C1 and 37C2 show results of analysis with line profiles of Sample X3.

FIG. 37A1 shows the electron diffraction pattern in FIG. 31C in which the regions A-A', B-B', and C-C' are drawn. FIG. 37B1 shows the electron diffraction pattern in FIG. 32C in which the regions A-A', B-B', and C-C' are drawn. FIG. 37C1 shows the electron diffraction pattern in FIG. 33C in which the regions A-A', B-B', and C-C' are drawn.

The regions A-A', B-B', and C-C' can each be obtained by normalizing line profiles using the luminance of the direct spot as a reference. Note that the direct spot appears at the center of an electron diffraction pattern. With the regions, Samples X1 to X3 can be relatively compared with one another.

When the profile of the luminance is calculated, a component of the luminance derived from inelastic scatterings and the like from Sample is subtracted as the background, in which case comparison with higher accuracy can be performed. Because the component of the luminance derived from inelastic scatterings shows an extremely broad profile in a radial direction, the luminance of the background may be obtained by a linear approximation. For example, a straight line is drawn along the tails of a target peak, and a region positioned on the luminance side lower than the straight line can be subtracted as the background.

Here, the integrated intensity of the luminance of each of the regions A-A', B-B', and C-C' is calculated from data in which the background is subtracted by the method described above. Then, the relative luminance R is obtained by dividing the integrated intensity of the luminance of the region A-A' by the integrated intensity of the luminance of the region B-B' or the integrated intensity of the luminance of the region C-C'.

Figure 38:
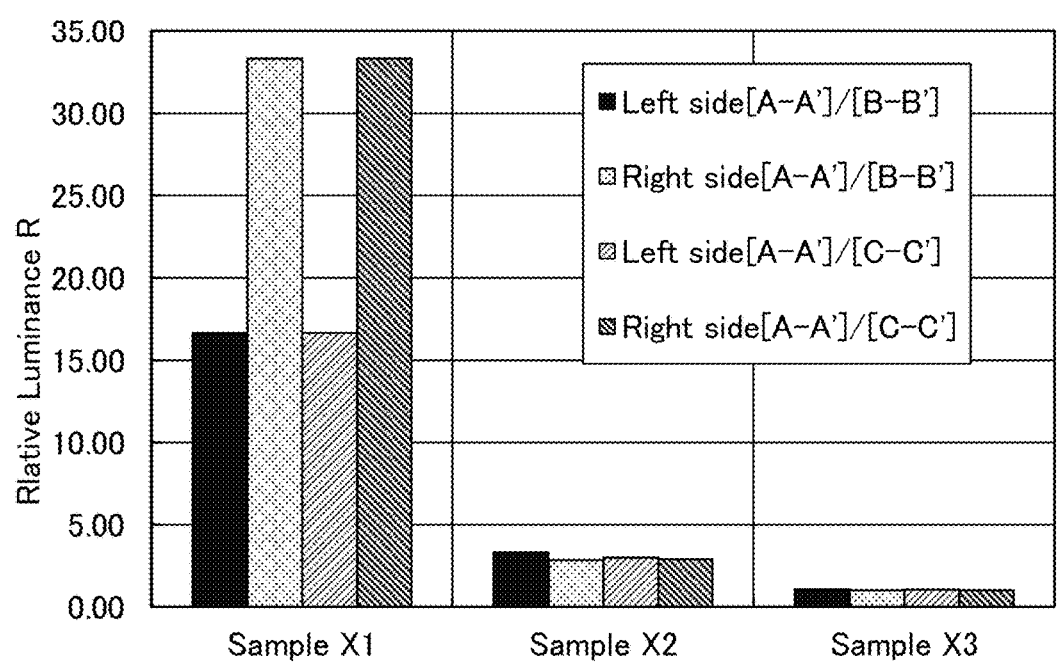
FIG. 38 shows relative luminance estimated from electron diffraction patterns of oxide semiconductor films.

FIG. 38 shows the relative luminance R of Samples X1 to X3. In FIG. 38, in a spectrum on the left side and the right side of the direct spot in the profiles of the luminance in each of FIGS. 37A2, 37B2, and 37C2, a value obtained by dividing the integrated intensity of the luminance of the region A-A' by the integrated intensity of the luminance of the region B-B' and a value obtained by dividing the integrated intensity of the luminance of the region A-A' by the integrated intensity of the luminance of the region C-C' are calculated.

The following are integrated intensities of Samples X1 to X3 obtained from the results shown in FIG. 38: the integrated intensity of Sample X1 is 25.00, the integrated intensity of Sample X2 is 3.04, and the integrated intensity of Sample X3 is 1.05. Note that each integrated intensity is an average value of four points. As described above, the highest integrated intensity was obtained from Sample X1, followed by Sample X2 and Sample X3.

When the oxide semiconductor film of one embodiment of the present invention is used as a semiconductor film in which a channel of a transistor is formed, the relative luminance R is preferably greater than 1 and less than or equal to 40, further preferably greater than 1 and less than or equal to 10, still further preferably greater than 1 and less than or equal to 3. With use of such an oxide semiconductor film as a semiconductor film, both high stability of electrical characteristics and high field-effect mobility in a low-gate-voltage region can be achieved.

<2-5. Proportion of Crystal Part>

The proportion of crystal parts in an oxide semiconductor film can be estimated by analyzing its cross-sectional TEM image.

A method for analyzing the image is described. An image is analyzed as follows. First, a high-resolution TEM image is subjected to two-dimensional fast Fourier transform (FFT), whereby an FFT image is obtained. The obtained FFT image is subjected to a mask processing so that a region other than a region having a periodic structure is removed. After the mask processing, the FFT image is subjected to two-dimensional inverse fast Fourier transform (IFFT), whereby an FFT filtering image is obtained.

In this manner, a real-space image in which only crystal parts are extracted can be obtained. Then, the proportion of crystal parts can be estimated from the proportion of area of the remaining image. Moreover, the proportion of area other than the crystal parts can be estimated by subtracting the remaining region from the area of the region used for calculation (also referred to as the area of the original image).

FIG. 39A1 shows a cross-sectional TEM image of Sample X1. FIG. 39A2 shows an image obtained through the analysis of the cross-sectional TEM image of Sample X1. FIG. 39B1 shows a cross-sectional TEM image of Sample X2. FIG. 39B2 shows an image obtained through the analysis of the cross-sectional TEM image of Sample X2. FIG. 39C1 shows a cross-sectional TEM image of Sample X3. FIG. 39C2 shows an image obtained through the analysis of the cross-sectional TEM image of Sample X3.

White regions in the oxide semiconductor film in the images obtained through the analysis correspond to regions including crystal parts having orientation. Black regions correspond to regions including crystal parts having no orientation or crystal parts with random orientation.

From the result shown in FIG. 39A2, the proportion of the area other than the region including crystal parts having orientation is approximately 43.1% in Sample X1. From the result shown in FIG. 39B2, the proportion of the area other than the region including crystal parts having orientation is approximately 61.7% in Sample X2. From the result shown in FIG. 39C2, the proportion of the area other than the region including crystal parts having orientation is approximately 89.5% in Sample X3.

The proportion of the region other than crystal parts having orientation in an oxide semiconductor film, which is estimated in the above manner, is preferably greater than or equal to 5% and less than 40% because the oxide semiconductor film has extremely high crystallinity and extremely high stability of electrical characteristics and hardly generates oxygen vacancies. In contrast, when the proportion of the region other than crystal parts having orientation in an oxide semiconductor film is higher than or equal to 40% and lower than 100%, preferably higher than or equal to 60% and lower than or equal to 90%, the oxide semiconductor film includes both the crystal parts having orientation and the crystal parts having no orientation at an appropriate ratio and thus can achieve both high stability of electrical characteristics and high mobility.

Here, a region other than the crystal parts that can be easily observed in a cross-sectional TEM image or a cross-sectional TEM image obtained through analysis can be referred to as a lateral growth buffer region (LGBR).

<2-6. Oxygen Diffusion to Oxide Semiconductor Film>

Next, the evaluation results of ease of oxygen diffusion to oxide semiconductor films are described.

The following three samples (Samples Y1 to Y3) were fabricated.

[Sample Y1]

First, an approximately 50-nm-thick oxide semiconductor film was formed over a glass substrate in a manner similar to that of Sample X1. Next, an approximately 30-nm-thick silicon oxynitride film, an approximately 100-nm-thick silicon oxynitride film, and an approximately 20-nm-thick silicon oxynitride film were stacked over the oxide semiconductor film by a plasma CVD method. Note that in the following description, an oxide semiconductor film and a silicon oxynitride film are referred to as OS and GI, respectively, in some cases.

Then, heat treatment was performed at 350° C. for one hour in a nitrogen atmosphere.

Next, a 5-nm-thick In—Sn—Si oxide film was formed by a sputtering method.

Next, oxygen was added to the silicon oxynitride film. The oxygen addition treatment was performed with an ashing apparatus under the conditions where the substrate temperature was 40° C., an oxygen gas ($^{16}O$) at a flow rate of 150 sccm and an oxygen gas ($^{18}O$) at a flow rate of 100 sccm were introduced into a chamber, the pressure was 15 Pa, and an RF power of 4500 W was supplied for 600 sec. between parallel-plate electrodes provided in the ashing apparatus so that a bias would be applied to the substrate side. Since the silicon oxynitride film contained oxygen ($^{16}O$) at a main component level, an oxygen gas ($^{18}O$) was used to exactly measure the amount of oxygen added by the oxygen addition treatment.

Then, an approximately 100-nm-thick silicon nitride film was formed by a plasma CVD method.

[Sample Y2]

Sample Y2 is a sample whose oxide semiconductor film was formed in different conditions from those of Sample Y1. In Sample Y2, an approximately 50-nm-thick oxide semiconductor film was formed in a manner similar to that of Sample X2.

[Sample Y3]

Sample Y3 is a sample whose oxide semiconductor film was formed in different conditions from those of Sample Y1. In Sample Y3, an approximately 50-nm-thick oxide semiconductor film was formed in a manner similar to that of Sample X3.

Through the above process, Samples Y1 to Y3 were fabricated.

[SIMS Analysis]

The concentration of $^{18}O$ in Samples Y1 to Y3 was measured by secondary ion mass spectrometry (SIMS) analysis. The SIMS analysis was performed under three conditions: a condition in which Samples Y1 to Y3 were not subjected to heat treatment; a condition in which Samples Y1 to Y3 were subjected to heat treatment at 350° C. for one hour in a nitrogen atmosphere; and a condition in which Samples Y1 to Y3 were subjected to heat treatment at 450° C. for one hour in a nitrogen atmosphere.

FIGS. 24A to 24C show SIMS measurement results. FIG. 24A, FIG. 24B, and FIG. 24C show SIMS measurement results of Sample Y1, Sample Y2, and Sample Y3, respectively.

FIGS. 24A to 24C show the analysis results of a region including GI and OS. Note that FIGS. 24A to 24C show results of SIMS (also referred to as substrate side depth profile (SSDP)-SIMS) analysis performed from the substrate side.

In FIGS. 24A to 24C, a thick dashed line indicates a profile of Sample in which heat treatment was not performed, a thin dashed line indicates a profile of Sample in which heat treatment was performed at 350° C., and a solid line indicates a profile of Sample in which heat treatment was performed at 450° C.

In each of Samples Y1 to Y3, it is found that $^{18}O$ was diffused to GI and also to OS. Furthermore, the position where $^{18}O$ was diffused was deeper in the order of Sample Y1, Sample Y2, and Sample Y3. In addition, when heat treatment was performed at 350° C. or 450° C., $^{18}O$ was more deeply diffused.

From the above results, it is found that an oxide semiconductor film including both crystal parts having orientation and crystal parts having no orientation and a low proportion of crystal parts having orientation is a film which easily transmits oxygen, in other words, a film in which oxygen is easily diffused. In addition, when heat treatment is performed at 350° C. or 450° C., oxygen in a GI film is diffused to OS.

The above results show that the higher the proportion (density) of crystal parts having orientation is, the more difficult it is for oxygen to be diffused in the thickness direction, and the lower the density is, the easier it is for oxygen to be diffused in the thickness direction. The ease of oxygen diffusion to the oxide semiconductor film can be considered as follows.

In an oxide semiconductor film containing both crystal parts having orientation and submicroscopic crystal parts having no orientation, a region other than the crystal parts which can be obviously observed in a cross-sectional observation image (LGBR) can be a region in which oxygen is easily diffused, that is, can serve as an oxygen diffusion path. As a result, in the case where a source which supplies sufficient oxygen is provided in the vicinity of the oxide semiconductor film, oxygen can be easily supplied through the LGBR to the crystal parts having orientation, and the amount of oxygen vacancy in the film can be reduced.

For example, an oxide film which easily releases oxygen is formed to be in contact with the oxide semiconductor film and heat treatment is performed, so that oxygen released from the oxide film is diffused to the oxide semiconductor film in the thickness direction through the LGBR. Through the LGBR, oxygen can be supplied laterally to crystal parts having orientation. Accordingly, oxygen is easily supplied sufficiently to the crystal parts having orientation and a region other than the crystal parts in the oxide semiconductor film, which leads to an effective reduction of oxygen vacancy in the film.

For example, when a hydrogen atom which is not bonded to a metal atom exists in the oxide semiconductor film, an oxygen atom is bonded to the hydrogen atom, and then OH is formed and fixed in some cases. The state in which a certain amount (e.g., approximately $1 \times 10^{17}$ cm$^{-3}$) of hydrogen atoms trapped in oxygen vacancy (Vo) in the oxide semiconductor film (such a hydrogen atom is referred to as VoH) is formed in the deposition at a low temperature, whereby generation of OH is inhibited. A certain amount of carriers exists in the oxide semiconductor film because VoH generates a carrier. Thus, the oxide semiconductor film with an increased carrier density can be formed. Although oxygen vacancy is formed concurrently with the deposition, the oxygen vacancy can be reduced by introducing oxygen through the LGBR as described above. In this manner, the oxide semiconductor film with a relatively high carrier density and a sufficiently reduced amount of oxygen vacancy can be formed.

A clear grain boundary cannot be observed in the oxide semiconductor film because submicroscopic crystal parts having no orientation at the time of the deposition is formed in a region other than crystal parts having orientation. The submicroscopic crystal part is positioned between a plurality of crystal parts having orientation. The submicroscopic crystal part is bonded to an adjacent crystal part having orientation by growing in the lateral direction with heat at the time of the deposition. The submicroscopic crystal part functions as a region where a carrier is generated. The oxide semiconductor film with such a structure is expected to improve field-effect mobility considerably when used in a transistor.

In addition, plasma treatment in an oxygen atmosphere is preferably performed after the oxide semiconductor film is formed and an oxide insulating film such as a silicon oxide film is formed over the oxide semiconductor film. The treatment can supply oxygen to the film and reduce the hydrogen concentration. For example, during plasma treatment, fluorine which remains in the chamber is doped at the same time to the oxide semiconductor film in some cases. Fluorine exists as a fluorine atom with negative charges and is bonded to a hydrogen atom with positive charges by Coulomb force, and then HF is generated. HF is released to the outside of the oxide semiconductor film during the plasma treatment, and as a result, the hydrogen concentration in the oxide semiconductor film can be reduced. In the plasma treatment, $H_2O$ in which an oxygen atom and hydrogen atoms are bonded is released to the outside of the film in some cases.

A structure in which a silicon oxide film (or a silicon oxynitride film) is stacked over the oxide semiconductor film is considered. Fluorine in the silicon oxide film does not affect electrical characteristics of the oxide semiconductor film because fluorine is bonded to hydrogen in the film and can exist as HF which is electrically neutral. Note that Si—F bond is generated in some cases, which is also electrically neutral. Furthermore, HF in the silicon oxide film does not affect the diffusion of oxygen.

According to the above mechanism, oxygen vacancy in the oxide semiconductor film can be reduced and hydrogen which is not bonded to a metal atom in the film can be reduced, which leads to the improvement of reliability. The electrical characteristics are expected to be improved because the carrier density of the oxide semiconductor film is greater than or equal to a certain amount.

<2-7. Deposition Method of Oxide Semiconductor Film>

A deposition method of the oxide semiconductor film of one embodiment of the present invention is described below.

The oxide semiconductor film of one embodiment of the present invention can be formed by a sputtering method under an atmosphere containing oxygen.

The substrate temperature during the deposition is higher than or equal to room temperature and lower than or equal to 150° C., preferably higher than or equal to 50° C. and lower than or equal to 150° C., further preferably higher than or equal to 100° C. and lower than or equal to 150° C., typified by 130° C. The substrate temperature within the above range can control the ratio of crystal parts having orientation to crystal parts having no orientation.

The oxygen flow rate ratio (partial pressure of oxygen) during the deposition is preferably higher than or equal to 1% and lower than 33%, further preferably higher than or equal to 5% and lower than or equal to 30%, still further preferably higher than or equal to 5% and lower than or equal to 20%, and yet still further preferably higher than or equal to 5% and lower than or equal to 15%, typified by 10%. Low oxygen flow rate can result in a large number of crystal parts having no orientation in the film.

Accordingly, setting the substrate temperature and the oxygen flow rate during the deposition within the above ranges can result in an oxide semiconductor film containing both crystal parts having orientation and crystal parts having no orientation. Furthermore, the proportions of crystal parts having orientation and crystal parts having no orientation can be adjusted by setting the substrate temperature and the oxygen flow rate within the above ranges.

An oxide target that can be used for forming the oxide semiconductor film is not limited to an In—Ga—Zn-based oxide; for example, an In-M-Zn-based oxide (M is Al, Ga, Y, or Sn) can be used.

When an oxide semiconductor film containing crystal parts is formed as the oxide semiconductor film using a sputtering target containing a polycrystalline oxide having a plurality of crystal grains, an oxide semiconductor film with crystallinity can be obtained more easily than the case of using a sputtering target not containing a polycrystalline oxide.

The consideration of the deposition mechanism of the oxide semiconductor film is made below. In the case where a sputtering target contains a plurality of crystal grains each of which has a layered structure and an interface at which the crystal grain is easily cleaved, ion collision with the sputtering target might cleave crystal grains to make plate-like or pellet-like sputtering particles. The obtained plate-like or pellet-like sputtering particles are deposited on a substrate, which probably results in formation of an oxide semiconductor film containing nanocrystals. An oxide semiconductor film containing crystal parts having orientation is likely to be formed when the substrate is heated because the nanocrystals are then bonded to each other or rearranged at a substrate surface.

Note that the above consideration is made on the assumption that a sputtering method is used; a sputtering method is particularly preferable because the crystallinity can be easily adjusted. Instead of a sputtering method, a pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of the thermal CVD method, a metal organic chemical vapor deposition (MOCVD) method can be given.

At least part of this embodiment can be implemented in combination with any of the other embodiments and the other examples described in this specification as appropriate.

Embodiment 3

In this embodiment, a semiconductor device and a method of manufacturing the semiconductor device of one embodiment of the present invention are described with reference to FIGS. 40A and 40B, FIGS. 41A and 41B, FIGS. 42A and 42B, FIGS. 43A and 43B, FIGS. 44A and 44B, FIGS. 45A and 45B, FIGS. 46A and 46B, and FIGS. 47A and 47B.

<3-1. Structure Example 1 of Semiconductor Device>

Figure 40A:
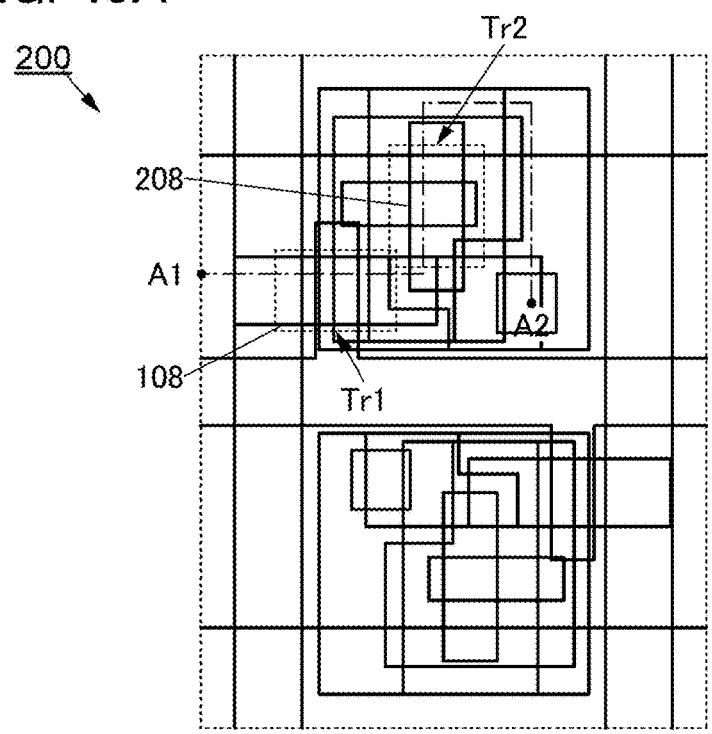
FIGS. 40A and 40B are a top view and a cross-sectional view of a semiconductor device.
Figure 40B:
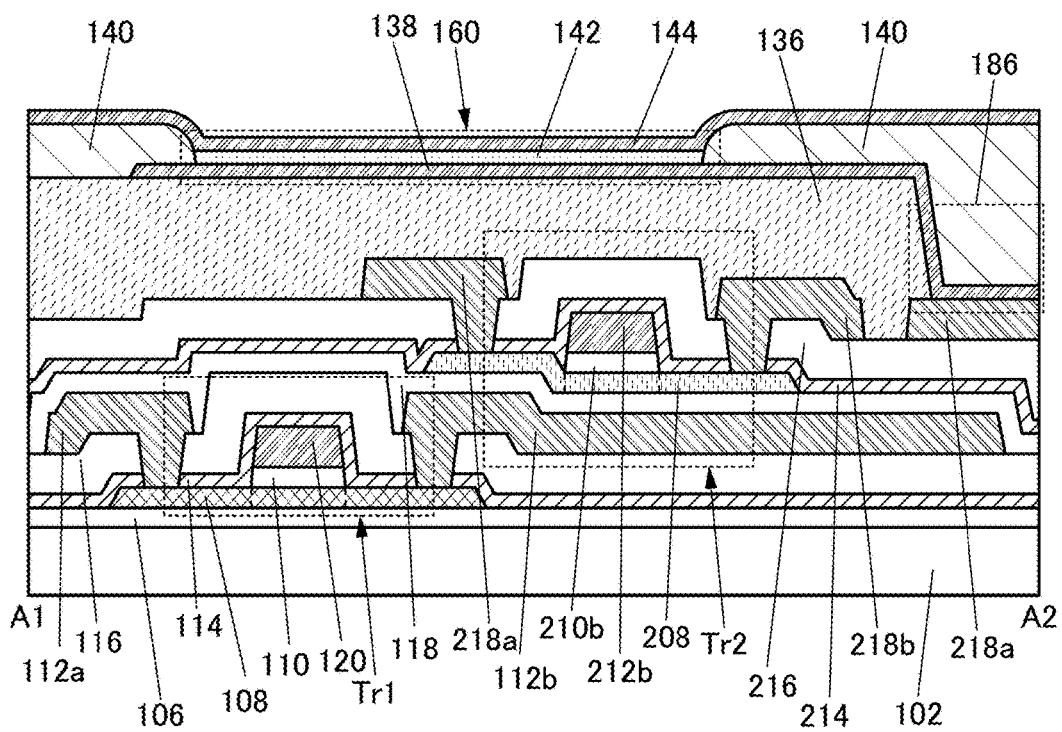

FIG. 40A is a top view of a semiconductor device 200 of one embodiment of the present invention. FIG. 40B is a cross-sectional view taken along dashed dotted line A1-A2 in FIG. 40A. Note that cross sections in a channel length (L) direction of the transistor Tr1 and in a channel length (L) direction of the transistor Tr2 are included in FIG. 40B.

The semiconductor device 200 illustrated in FIGS. 40A and 40B includes the transistor Tr1 and the transistor Tr2 which overlaps at least partly with the transistor Tr1. Note that the transistor Tr1 and the transistor Tr2 are top-gate transistors.

Since the transistor Tr1 overlaps at least partly with the transistor Tr2, the layout area of the transistors can be reduced.

The transistor Tr1 includes the insulating film 106 over the substrate 102, the oxide semiconductor film 108 over the insulating film 106, the insulating film 110 over the oxide semiconductor film 108, the conductive film 120 over the insulating film 110, and the insulating film 114 over the insulating film 106, the oxide semiconductor film 108, and the conductive film 120. As in Embodiment 1, the oxide semiconductor film 108 includes the channel region 108*i* overlapping with the conductive film 120 and in contact with the insulating film 110, the source region 108*s* in contact with the insulating film 114, and the drain region 108*d* in contact with the insulating film 114.

In addition, the transistor Tr1 includes the insulating film 116 over the insulating film 114, the conductive film 112*a* electrically connected to the oxide semiconductor film 108 via the opening 141*a* provided in the insulating films 114 and 116, the conductive film 112*b* electrically connected to the oxide semiconductor film 108 via the opening 141*b* provided in the insulating films 114 and 116, and the insulating film 118 over the insulating film 116 and the conductive films 112a and 112b.

The transistor Tr2 includes the conductive film 112b, the insulating film 118 over the conductive film 112b, the oxide semiconductor film 208 over the insulating film 118, the insulating film 210b over the oxide semiconductor film 208, the conductive film 212b over the insulating film 210b, and the insulating film 214 over the oxide semiconductor film 208 and the conductive film 212b. In a manner similar to that of the oxide semiconductor film 108, the oxide semiconductor film 208 includes a channel region 208i overlapping with the conductive film 212b and in contact with the insulating film 210b, a source region 208s in contact with the insulating film 214, and a drain region 208d in contact with the insulating film 214.

Furthermore, the transistor Tr2 includes the insulating film 216 over the insulating film 214, the conductive film 218a located over the insulating film 216 and electrically connected to the oxide semiconductor film 208, and the conductive film 218b located over the insulating film 216 and electrically connected to the oxide semiconductor film 208.

Note that the oxide semiconductor film 108 and the oxide semiconductor film 208 partly overlap with each other as shown in FIGS. 40A and 40B.

The oxide semiconductor film 108 can have a structure similar to that described in Embodiment 1. The oxide semiconductor film 208 can have a structure similar to that of the oxide semiconductor film 128 described in Embodiment 1.

Therefore, the field-effect mobility of the transistor Tr2 can be high.

For example, the use of the transistor with high field-effect mobility in a gate driver that is included in a display device and generates a gate signal allows the display device to have a narrow frame. When the transistor with high field-effect mobility is used for a source driver (specifically, a demultiplexer connected to an output terminal of a shift register included in the source driver) that supplies a signal from a signal line included in a display device, the number of wirings connected to the display device can be reduced. In addition, when the transistor with high field-effect mobility is used as one or both of a selection transistor and a driver transistor of a pixel circuit included in the display device, the display quality of the display device can be increased.

Although not illustrated, the capacitor Cs1 can be formed with a capacitance between a film which is formed at the same time as the conductive film 112b and a film which is formed at the same time as the conductive film 212b in the semiconductor device 100A in FIGS. 40A and 40B. An insulating film which is formed at the same time as the insulating film 118 and/or an insulating film which is formed at the same time as the insulating film 210b are/is included in the capacitor.

In this embodiment, only the film formed at the same time as the insulating film 118 is used as the insulating film of the capacitor. When a certain on-state current is to be obtained in a saturation region, the thickness of the film formed as the same time as the insulating film 210b can be made larger in the case where the oxide semiconductor film of the transistor whose measurement results are shown in FIG. 8B or 8C is used as the oxide semiconductor film 208 than in the case where the oxide semiconductor film of the transistor whose measurement results are shown in FIG. 8A is used as the oxide semiconductor film 208.

In other words, when the oxide semiconductor film of the transistor whose measurement results are shown in FIG. 8B or FIG. 8C is used in the transistor Tr2, the storage capacitance of the capacitor Cs1 can be small, resulting in reduction in the layout area of the transistors.

The semiconductor device 200 shown in FIGS. 40A and 40B can be favorably used for a pixel circuit of a display device. The layout shown in FIGS. 40A and 40B can increase the pixel density of the display device. For example, even when the pixel density of a display device exceeds 1000 ppi or 2000 ppi, the aperture ratio of pixels can be increased owing to the layout shown in FIGS. 40A and 40B.

Note that when the semiconductor device 200 shown in FIGS. 40A and 40B is used in a pixel circuit of a display device, a configuration similar to that of the pixel circuit shown in FIG. 9 can be used.

When the semiconductor device 200 shown in FIGS. 40A and 40B is used for a pixel of a display device, the channel length (L) and the channel width (W) of a transistor, the line widths of a wiring and an electrode connected to the transistor, and the like can be relatively large. The line width and the like can be larger when the transistor Tr1 and the transistor Tr2 overlap with each other at least partly as shown in FIGS. 40A and 40B than those when the transistor Tr1 and the transistor Tr2 are provided on the same plane, for example; thus, variations in processing size can be reduced.

In addition, one or both of a conductive film and an insulating film can be shared by the transistor Tr1 and the transistor Tr2; thus, the number of masks or steps can be reduced.

For example, in the transistor Tr1, the conductive film 120 functions as the gate electrode, the conductive film 112a functions as the source electrode, and the conductive film 112b functions as the drain electrode. In addition, in the transistor Tr1, the insulating film 110 functions as the gate insulating film. In the transistor Tr2, the conductive film 112b functions as the first gate electrode, the conductive film 218a functions as the source electrode, the conductive film 218b functions as the drain electrode, and the conductive film 212b functions as the second gate electrode. In addition, in the transistor Tr2, the insulating film 118 functions as the first gate insulating film and the insulating film 210b functions as the second gate insulating film.

Note that in this specification and the like, the insulating film 210b may be referred to as a fourth insulating film.

The insulating film 136 is provided over the insulating film 216 and the conductive films 218a and 218b. An opening 186 is provided in the insulating film 136 so as to reach the conductive film 218b. In addition, the conductive film 138 is provided over the insulating film 136. Note that the conductive film 138 is connected to the conductive film 218a via the opening 186.

In addition, the insulating film 140, the EL layer 142, and the conductive film 144 are provided over the conductive film 138. The light-emitting element 160 is composed of the conductive film 138, the EL layer 142, and the conductive film 144.

Each of the transistors Tr1 and Tr2 shown in FIGS. 40A and 40B may have the S-channel structure described in Embodiment 1, which is not illustrated in the drawings.

The transistor Tr1 and the transistor Tr2 of the semiconductor device 200 described in this embodiment can be combined with the transistor Tr1 and the transistor Tr2 of the semiconductor device 100A described in Embodiment 1.

As described above, in the semiconductor device of one embodiment of the present invention, a plurality of transistors are stacked to be reduced in the layout are of the transistors. In addition, since one or both of an insulating film and a conductive film are shared by the plurality of transistors, the number of masks or steps can be reduced.

<3-2. Components of Semiconductor Device>

Next, components of the semiconductor device of this embodiment are described in detail.

<Conductive Film>

The conductive films 212b, 218a, and 218b can be formed using the materials of the conductive films described in Embodiment 1 (the conductive films 112a, 112b, 122a, 122b, 120, 130, 138, and 144). In particular, an oxide conductive (OC) is preferably used for the conductive film 212b, in which case oxygen can be added to the insulating film 210b.

<Insulating Film>

The insulating films 214, 216, and 210b can be formed using the materials of the insulating films described in Embodiment 1 (the insulating films 106, 114, 116, 118, 124, 126, 134, 136, and 140).

Since the insulating film 118 is in contact with the oxide semiconductor film 208, an oxide insulating film, particularly a silicon oxide film or a silicon oxynitride film is preferably used as the insulating film 118. The insulating film 210b is preferably an oxide insulating film, and further preferably includes a region containing oxygen in excess of that in the stoichiometric composition (oxygen-excess region). A silicon oxide film or a silicon oxynitride film is preferably used as the insulating film 210b.

The insulating film 214 contains one or both of hydrogen and nitrogen. Alternatively, the insulating film 214 contains nitrogen and silicon. The insulating film 214 has a function of blocking oxygen, hydrogen, water, alkali metal, alkaline earth metal, or the like. Since the oxide semiconductor film 208 is in contact with the insulating film 214, one or both of hydrogen and nitrogen in the insulating film 214 is transferred to the oxide semiconductor film 208, so that the carrier density of the oxide semiconductor film 208 can be increased. Accordingly, a region of the oxide semiconductor film 208 in contact with the insulating film 214 serves as a source region or a drain region.

<Oxide Semiconductor Film>

The oxide semiconductor film 208 can be formed using the materials of the oxide semiconductor films described in Embodiment 1 (the oxide semiconductor films 108 and 128).

<3-3. Method for Manufacturing Semiconductor Device>

Next, a method for manufacturing the semiconductor device 200 of one embodiment of the present invention is described with reference to FIGS. 41A and 41B, FIGS. 42A and 42B, FIGS. 43A and 43B, FIGS. 44A and 44B, FIGS. 45A and 45B, FIGS. 46A and 46B, and FIGS. 47A and 47B.

Note that FIG. 41A, FIG. 42A, FIG. 43A, FIG. 44A, FIG. 45A, FIG. 46A, and FIG. 47A are top views illustrating the method for manufacturing the semiconductor device 200. FIG. 41B, FIG. 42B, FIG. 43B, FIG. 44B, FIG. 45B, FIG. 46B, and FIG. 47B are cross-sectional views illustrating the method for manufacturing the semiconductor device 200.

The method described in Embodiment 1 can be referred to for a method for manufacturing the transistor Tr1. Thus, Embodiment 1 and FIGS. 14A and 14B, 15A and 15B, and FIGS. 16A and 16B can be referred to for methods for forming, over the substrate 102, the insulating film 106, the oxide semiconductor film 108, the insulating film 110, the conductive film 120, the insulating film 114, the insulating film 116, the conductive film 112a, the conductive film 112b, and the insulating film 118.

Next, the insulating film 118 is formed over the insulating film 116 and the conductive films 112a and 112b. The insulating film 118 can be formed by a method similar to that described in Embodiment 1.

Figure 41A:
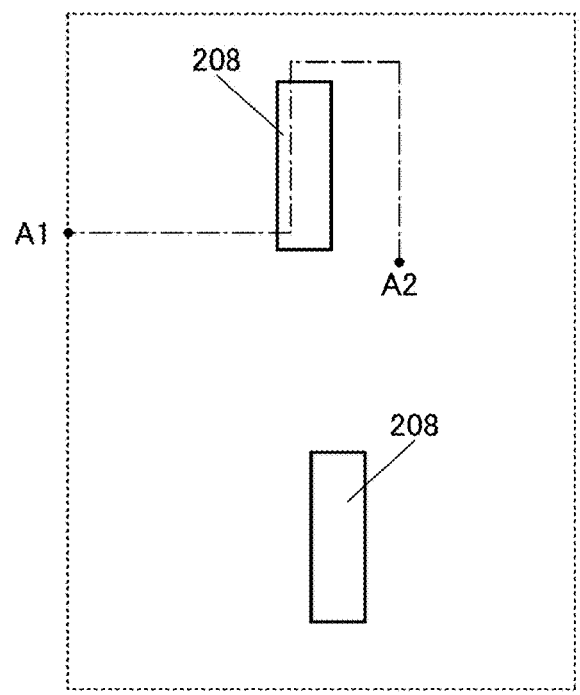
FIGS. 41A and 41B are a top view and a cross-sectional view illustrating a method for manufacturing a semiconductor device.
Figure 41B:
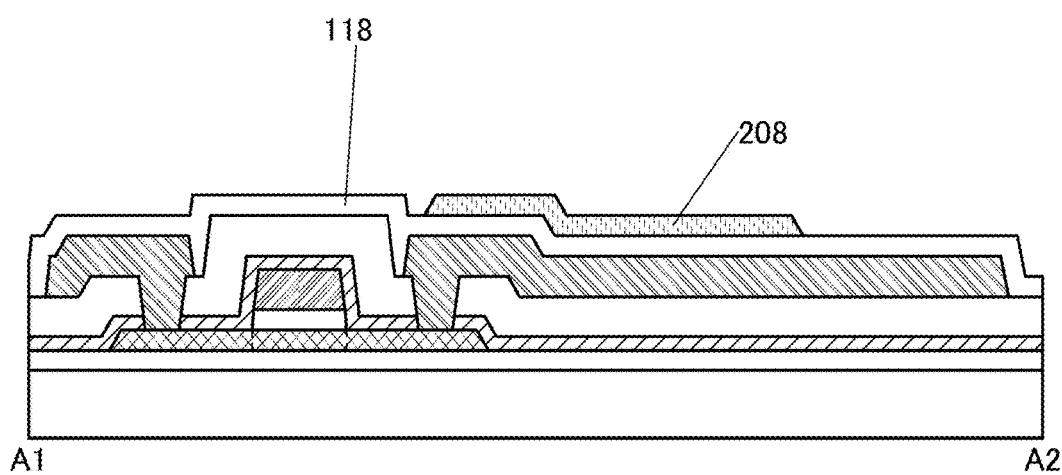
Figure 42A:
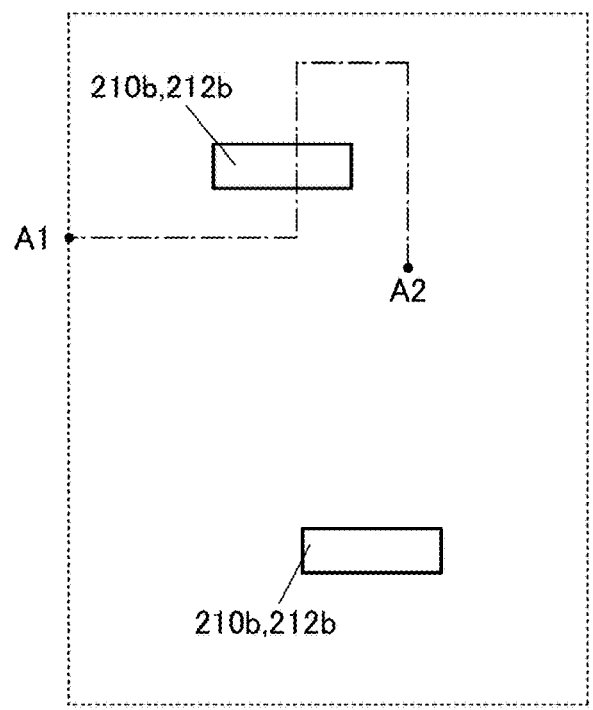
FIGS. 42A and 42B are a top view and a cross-sectional view illustrating a method for manufacturing a semiconductor device.
Figure 42B:
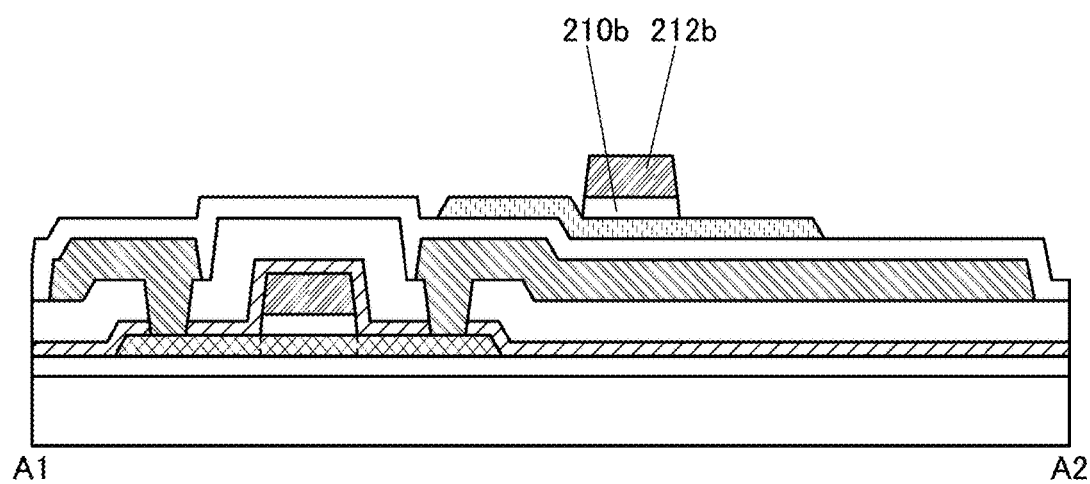

Next, the oxide semiconductor film 208 is formed over the insulating film 118 (see FIGS. 41A and 41B).

In this embodiment, an oxide semiconductor film is formed by a sputtering method using an In—Ga—Zn metal oxide target (In:Ga:Zn=4:2:4.1 [atomic ratio]). The substrate temperature at the time when the oxide semiconductor film is formed is 170° C. For the deposition gas for forming the oxide semiconductor film, an oxygen gas at a flow rate of 60 sccm and an argon gas at a flow rate of 140 sccm are used. Then, the oxide semiconductor film is processed into a desired shape, whereby the oxide semiconductor film 208 having an island shape is formed. Note that a wet-etching apparatus is used to form the oxide semiconductor film.

Next, a stacked-layer film including an insulating film and a conductive film is formed over the insulating film 118 and the oxide semiconductor film 208. Then, the stacked-layer film is processed into a desired shape to form the insulating films 210b and 212b having an island shape (see FIGS. 42A and 42B).

After that, the insulating films 214 and 216 are formed over the insulating film 118, the oxide semiconductor film 208, and the conductive film 212b. Note that regions of the oxide semiconductor film 208 which are in contact with the formed insulating film 214 serve as the source and drain regions 208s and 208d. A region of the oxide semiconductor film 208 which is not in contact with the insulating film 214, i.e., a region of the oxide semiconductor film 208 which is in contact with the insulating film 210b serves as the channel region 208i. Accordingly, the oxide semiconductor film 208 including the channel region 208i, the source region 208s, and the drain region 208d is formed (see FIGS. 43A and 43B).

In this embodiment, a 50-nm-thick silicon oxynitride film is formed as the insulating film 210b with a PECVD apparatus. A 200-nm-thick oxide semiconductor film is formed as the conductive film 212b with a sputtering apparatus. Note that the composition of the oxide semiconductor film is the same as that of the oxide semiconductor film 208. A 100-nm-thick silicon nitride film is formed as the insulating film 214 with a PECVD apparatus. A 200-nm-thick silicon oxynitride film is formed as the insulating film 216 with a PECVD apparatus.

With a silicon nitride film used as the insulating film 214, one or both of hydrogen and nitrogen in the silicon nitride film is transferred to the conductive film 212b, the source region 208s, and the drain region 208d that are in contact with the insulating film 214, so that the carrier density of each of the conductive film 212b, the source region 208s, and the drain region 208d can be increased. As a result, part of the oxide semiconductor film 208 and the conductive film 212b become oxide conductors (OCs).

Note that the insulating film 210b is formed in a self-aligned manner using the conductive film 212b as a mask.

Figure 43A:
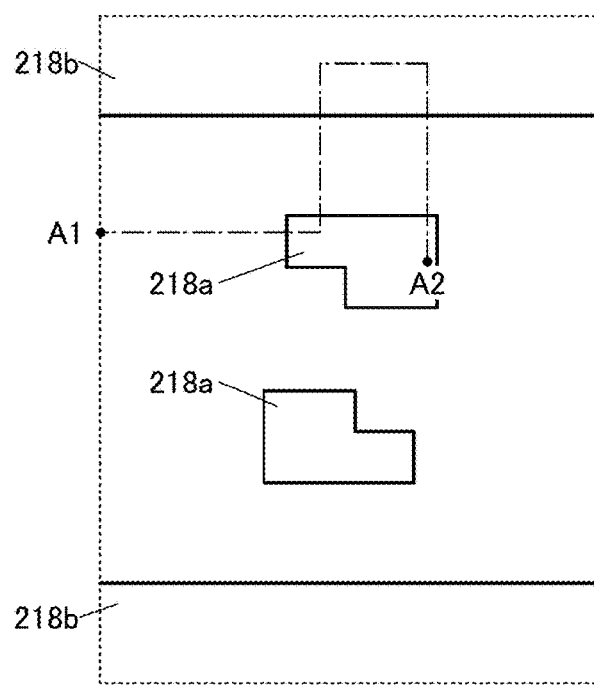
FIGS. 43A and 43B are a top view and a cross-sectional view illustrating a method for manufacturing a semiconductor device.
Figure 43B:
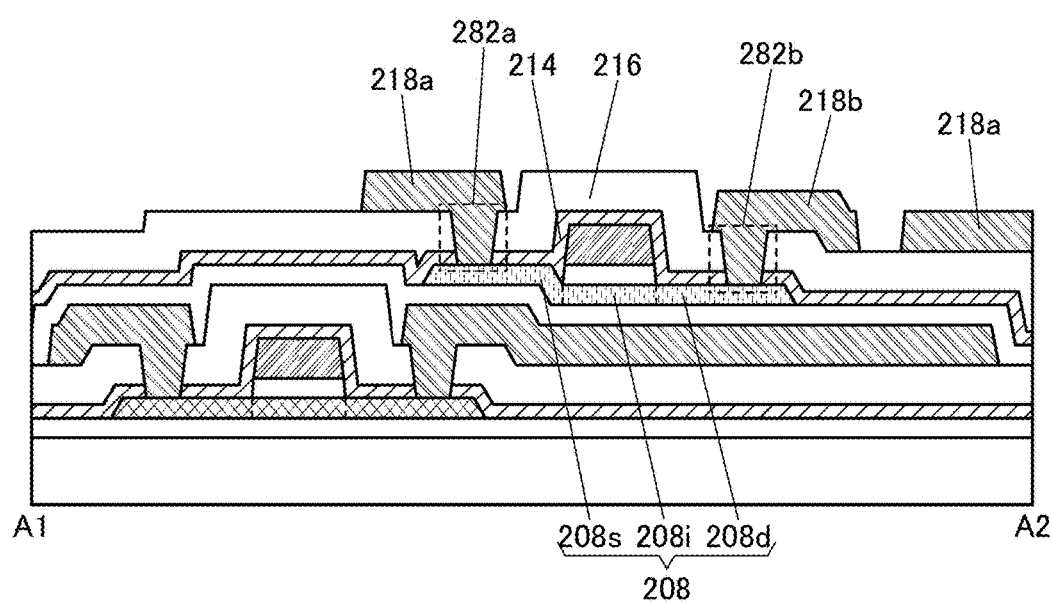
Figure 44A:
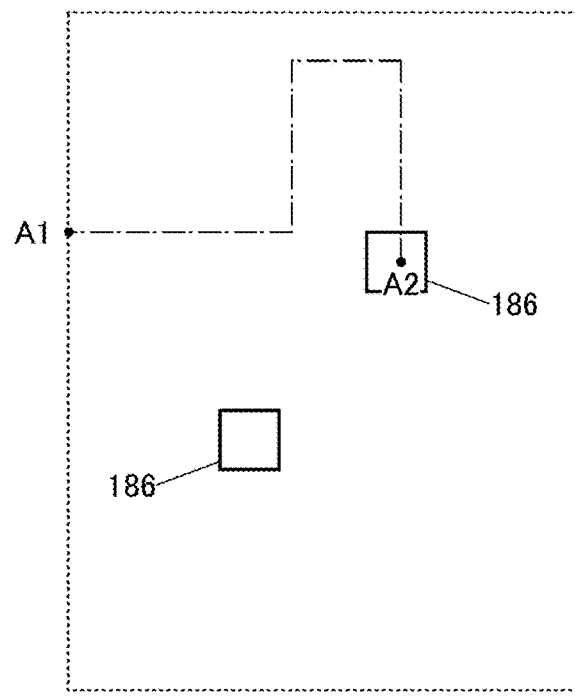
FIGS. 44A and 44B are a top view and a cross-sectional view illustrating a method for manufacturing a semiconductor device.
Figure 44B:
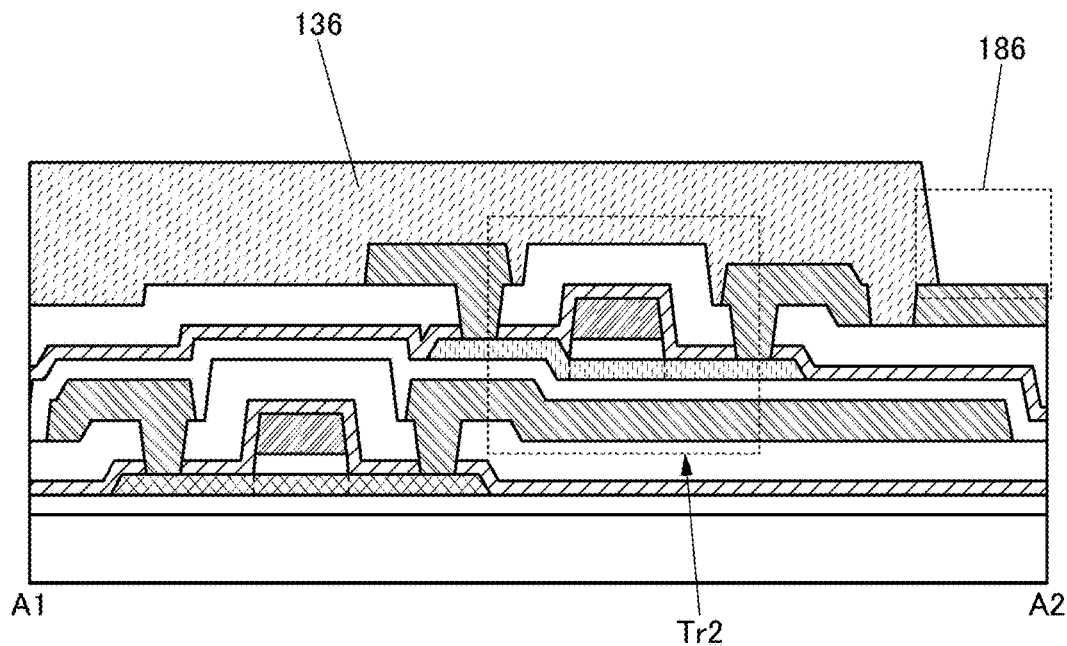

Next, openings 282a and 282b reaching the oxide semiconductor film 208 are formed in desired regions of the insulating films 214 and 216 (see FIGS. 43A and 43B).

The openings 282a and 282b are formed with a dry-etching apparatus or a wet-etching apparatus.

Next, a conductive film is formed over the insulating film 216 and the oxide semiconductor film 208 so as to fill the openings 282a and 282b and is processed into an island shape, so that the conductive films 218a and 218b are formed (see FIGS. 43A and 43B).

A 100-nm-thick tungsten film and a 200-nm-thick copper film are formed as the conductive films 218a and 218b by a sputtering method.

Through the above steps, the transistor Tr2 can be manufactured.

Next, the insulating film 136 is formed over the insulating film 216 and the conductive films 218a and 218b. Then, a desired region of the insulating film 136 is processed to form the opening 186 reaching the conductive film 218a (see FIGS. 44A and 44B).

In this embodiment, a 1.5-µm-thick acrylic-based photosensitive resin film is formed as the insulating film 136.

Figure 45A:
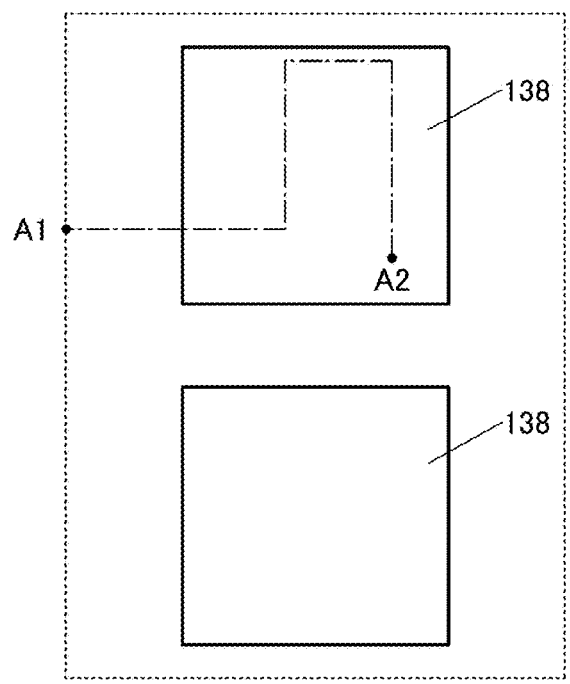
FIGS. 45A and 45B are a top view and a cross-sectional view illustrating a method for manufacturing a semiconductor device.
Figure 45B:
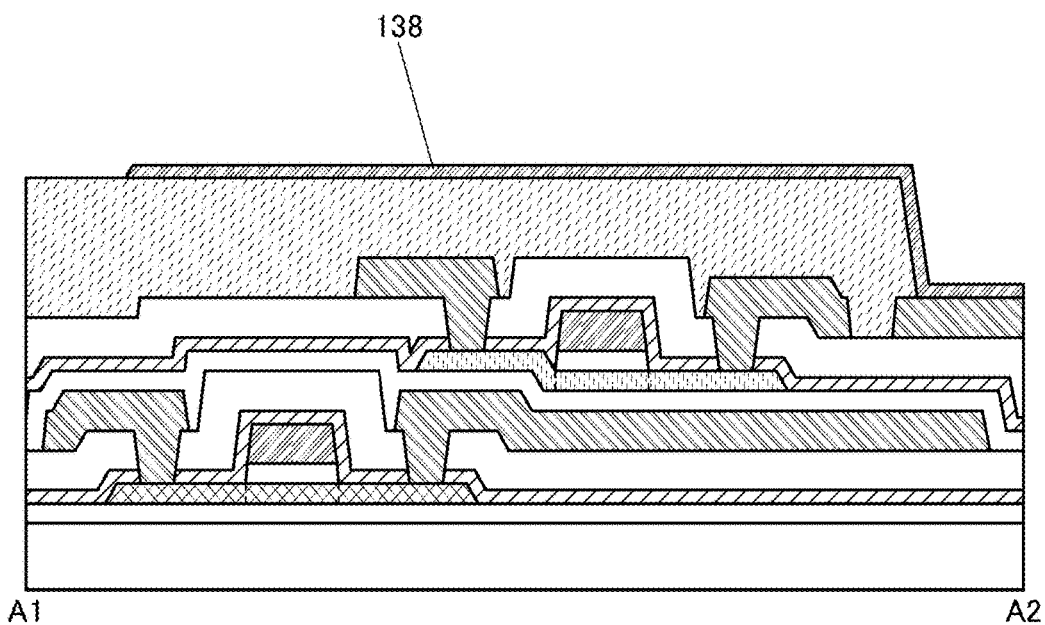

Next, a conductive film is formed over the insulating film 136 and the conductive film 218a and is processed into an island shape, whereby the conductive film 138 is formed (see FIGS. 45A and 45B).

For the conductive film 138 in this embodiment, a stacked film including a 10-nm-thick ITSO film, a 200-nm-thick reflective metal film (a metal film containing silver, palladium, and copper is used here), and a 10-nm-thick ITSO film is used. The stacked film is processed into the conductive film 138 with a wet-etching apparatus.

Figure 46A:
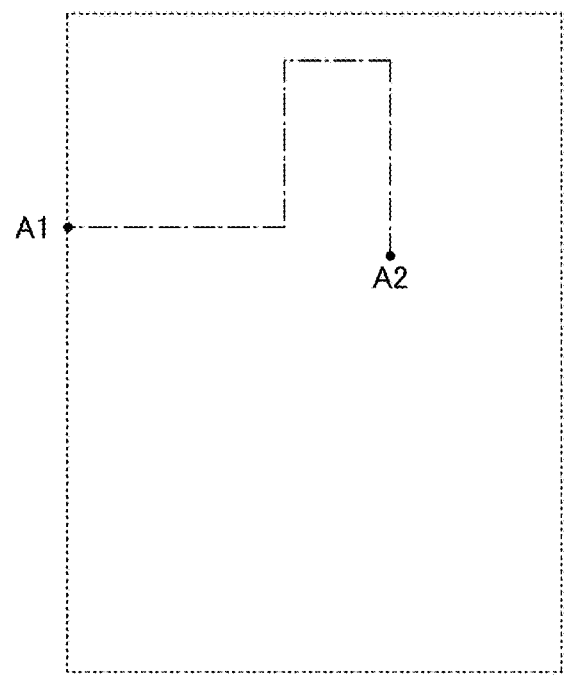
FIGS. 46A and 46B are a top view and a cross-sectional view illustrating a method for manufacturing a semiconductor device.
Figure 46B:
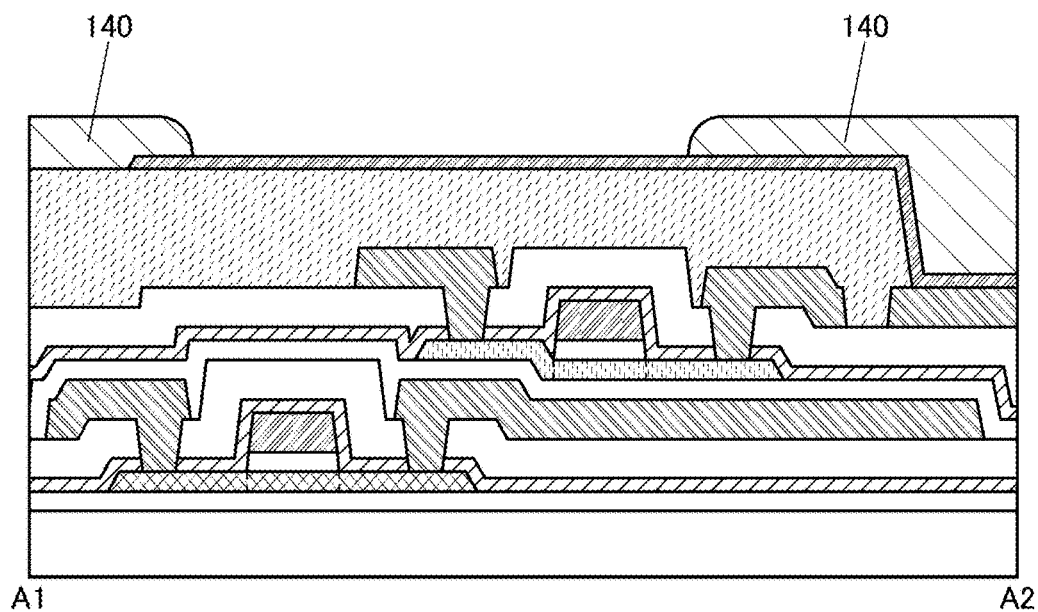

Next, the insulating film 140 having an island shape is formed over the insulating film 136 and the conductive film 138 (see FIGS. 46A and 46B).

As the insulating film 140, a 1.5-µm-thick polyimide-based photosensitive resin film is used.

Figure 47A:
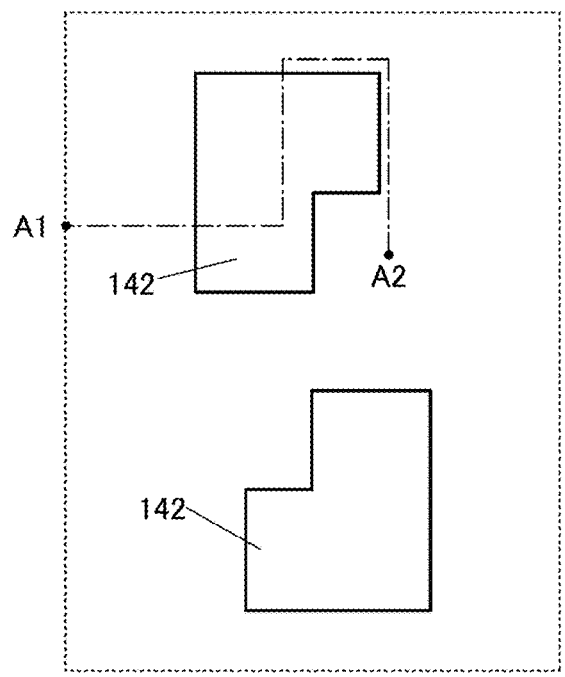
FIGS. 47A and 47B are a top view and a cross-sectional view illustrating a method for manufacturing a semiconductor device.
Figure 47B:
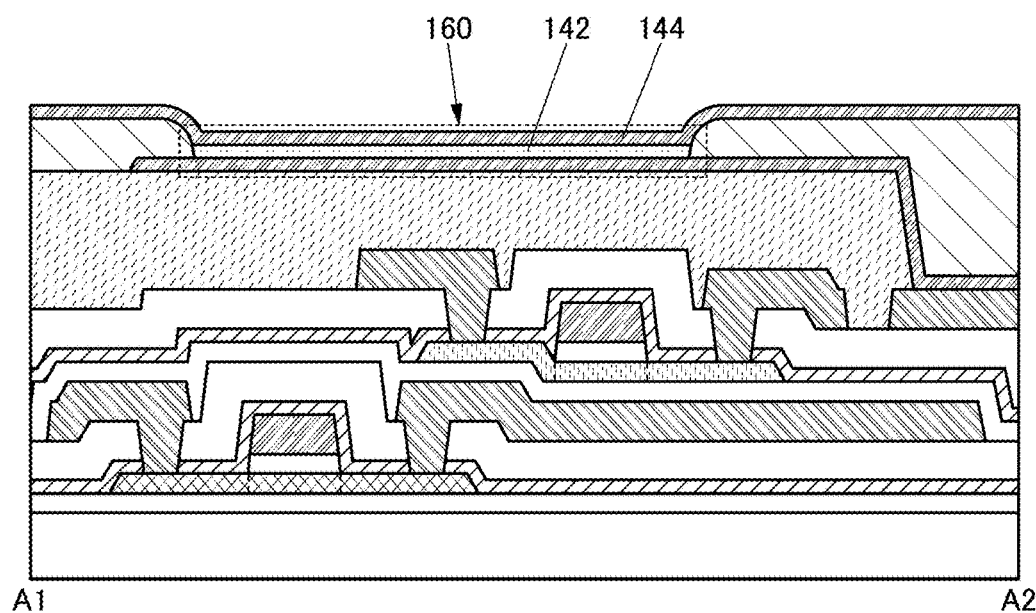

Next, the EL layer 142 is formed over the conductive film 138, and then the conductive film 144 is formed over the insulating film 140 and the EL layer 142, whereby the light-emitting element 160 is obtained (see FIGS. 47A and 47B).

Note that a method for manufacturing the light-emitting element 160 is described in Embodiment 4.

Through the above steps, the semiconductor device 200 shown in FIGS. 40A and 40B can be manufactured.

Note that the structure and method described in this embodiment can be used in appropriate combination with the structure and method described in any of the other embodiments.

Embodiment 4

In this embodiment, a light-emitting element that can be used for a semiconductor device of one embodiment of the present invention is described with reference to FIG. 48, FIGS. 49A to 49D, and FIG. 50.

<4-1. Structure Example of Light-Emitting Element>

Figure 48:
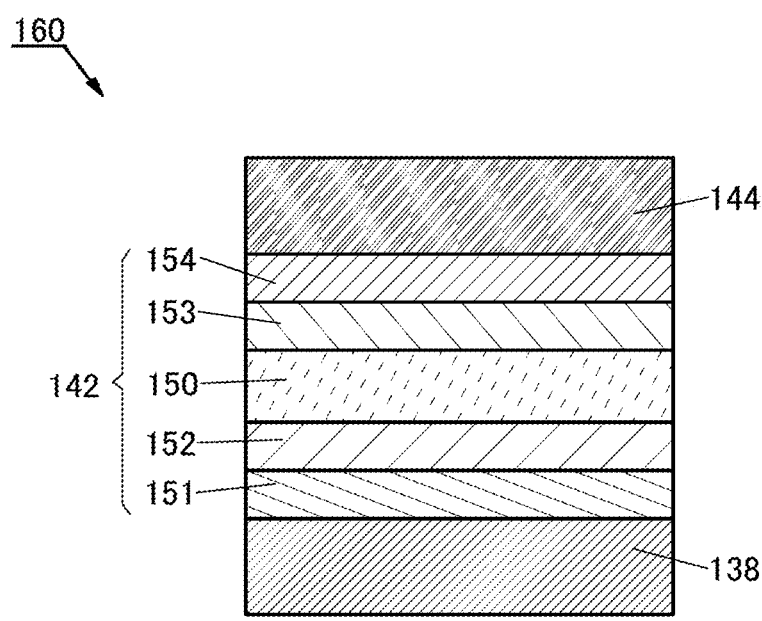
FIG. 48 is a schematic cross-sectional view of a light-emitting element.

First, a structure of a light-emitting element which can be used for a semiconductor device of one embodiment of the present invention is described with reference to FIG. 48. FIG. 48 is a cross-sectional view of the light-emitting element 160.

Note that one or both of an inorganic compound and an organic compound can be used for the light-emitting element 160. As the organic compound used for the light-emitting element 160, a low molecular compound or a high molecular compound can be used. The high molecular compound is preferable because it is thermally stable and can easily form a thin film with excellent uniformity by a coating method or the like.

The light-emitting element 160 shown in FIG. 48 includes a pair of electrodes (the conductive film 138 and the conductive film 144) and the EL layer 142 between the pair of electrodes. The EL layer 142 includes at least a light-emitting layer 150.

The EL layer 142 illustrated in FIG. 48 includes the light-emitting layer 150 and functional layers such as a hole-injection layer 151, a hole-transport layer 152, an electron-transport layer 153, and an electron-injection layer 154.

In this embodiment, description is given assuming that the conductive film 138 and the conductive film 144 of the pair of electrodes serve as an anode and a cathode, respectively, but the structure of the light-emitting element 160 is not limited thereto. For example, a structure in which the conductive film 138 and the conductive film 144 serve as a cathode and an anode, respectively, and the layers between the electrodes are stacked in the reverse order may be used. In other words, the layers may be stacked from the anode side in the following order: the hole-injection layer 151, the hole-transport layer 152, the light-emitting layer 150, the electron-transport layer 153, and the electron-injection layer 154.

The structure of the EL layer 142 is not limited to the structure illustrated in FIG. 48, and another structure may be used as long as the structure includes the light-emitting layer 150 and at least one of the hole-injection layer 151, the hole-transport layer 152, the electron-transport layer 153, and the electron-injection layer 154. The EL layer 142 may include a functional layer that is capable of lowering a hole- or electron-injection barrier, improving a hole- or electron-transport property, inhibiting a hole- or electron-transport property, or suppressing a quenching phenomenon by an electrode, for example. Note that the functional layers may be a single layer or stacked layers.

A low molecular compound or a high molecular compound can be used for the light-emitting layer 150.

In this specification and the like, a high molecular compound refers to a polymer that has molecular weight distribution and an average molecular weight of $1 \times 10^3$ to $1 \times 10^8$. A low molecular compound is a compound which does not have molecular weight distribution and whose molecular weight is less than or equal to $1 \times 10^4$.

The high molecular compound refers to a compound in which one or a plurality of constituent units is polymerized. In other words, the constituent unit refers to a unit at least one of which is included in the high molecular compound.

The high molecular compound may refer to a block copolymer, a random copolymer, an alternating copolymer, a graft copolymer, or the like.

In the case where an end group of the high molecular compound includes a polymerization active group, the light emission characteristics and luminance lifetime of the light-emitting element might be reduced. For this reason, the end group of the high molecular compound is preferably a stable end group. As the stable end group, a group which is covalently bonded to a main chain is preferable, and a group which is bonded to an aryl group or a heterocycle group through a carbon-carbon bond is particularly preferable.

When the low molecular compound is used for the light-emitting layer 150, a light-emitting low molecular compound is preferably contained as a guest material in addition to a low molecular compound serving as a host material. In the light-emitting layer 150, the weight percentage of the host material is larger than that of the guest material, and the guest material is dispersed in the host material.

A light-emitting organic compound can be used as the guest material. A substance capable of emitting fluorescence (hereinafter also referred to as a fluorescent compound) or capable of emitting phosphorescence (hereinafter also referred to as a phosphorescent compound) can be used as the light-emitting organic compound.

In the light-emitting element 160 of one embodiment of the present invention, voltage application between a pair of electrodes (the conductive film 138 and the conductive film 144) causes electrons and holes to be injected from the cathode and the anode, respectively, into the EL layer 142, whereby a current flows. By recombination of the injected electrons and holes, excitons are formed. The ratio of singlet excitons to triplet excitons (hereinafter referred to as exciton generation probability) which are generated by the carrier (electrons and holes) recombination is approximately 1:3 according to the statistically obtained probability. Accordingly, in a light-emitting element that contains a fluorescent compound, the probability of generation of singlet excitons, which contribute to light emission, is 25% and the probability of generation of triplet excitons, which do not contribute to light emission, is 75%. In the light-emitting element containing a phosphorescent compound, both of the singlet excitons and triplet excitons can contribute to light emission. Therefore, a light-emitting element containing a phosphorescent compound has higher light emission efficiency than a light-emitting element containing a fluorescent compound and thus is preferable.

Note that the term "exciton" refers to a pair of carriers (an electron and a hole). Since excitons have energy, a material where excitons are generated is brought into an excited state.

When a high molecular compound is used for the light-emitting layer 150, it is preferable that the high molecular compound include, as its constituent unit, a skeleton having a function of transporting holes (a hole-transport property) and a skeleton having a function of transporting electrons (an electron-transport property). Alternatively, it is preferable that the high molecular compound include a π-electron deficient heteroaromatic skeleton and at least one of a π-electron rich heteroaromatic skeleton and an aromatic amine skeleton. The skeletons are bonded to each other directly or through another skeleton.

When the high molecular compound includes the skeleton having a hole-transport property and the skeleton having an electron-transport property, the carrier balance can be easily controlled. Thus, a carrier recombination region can also be controlled easily. In view of this, it is preferable that the composition ratio of the skeleton having a hole-transport property to the skeleton having an electron-transport property be in the range of 1:9 to 9:1 (molar ratio). It is further preferable that the skeleton having an electron-transport property be contained at a higher proportion than the skeleton having a hole-transport property.

The high molecular compound may include, as its constituent unit, a light-emitting skeleton, in addition to the skeleton having a hole-transport property and the skeleton having an electron-transport property. When the high molecular compound includes a light-emitting skeleton, the composition ratio of the light-emitting skeleton to all the constituent units of the high molecular compound is preferably low, specifically higher than or equal to 0.1 mol % and lower than or equal to 10 mol %, further preferably higher than or equal to 0.1 mol % and lower than or equal to 5 mol %.

Note that the high molecular compound used for the light-emitting element 160 may include a compound in which the constituent units have different bonding directions, bonding angles, bonding lengths, and the like. In addition, the constituent units may have different substituents, and may have different skeletons therebetween. In addition, the polymerization methods of constituent units may differ.

The light-emitting layer 150 may include a light-emitting low molecular material as a guest material, in addition to the high molecular compound serving as a host material. In that case, the light-emitting low molecular compound is dispersed as a guest material into the high molecular compound serving as a host material, and the weight percentage of the high molecular compound is higher than that of at least the light-emitting low molecular compound. The weight percentage of the light-emitting low molecular compound to the high molecular compound is preferably higher than or equal to 0.1 wt % and lower than or equal to 10 wt %, further preferably higher than or equal to 0.1 wt % and lower than or equal to 5 wt %.

<4-2. Manufacturing Method of Light-Emitting Element>

Here, a method for forming the EL layer 142 by a droplet discharge method is described with reference to FIGS. 49A to 49D. FIGS. 49A to 49D are cross-sectional views illustrating the method for forming the EL layer 142.

Figure 49A:
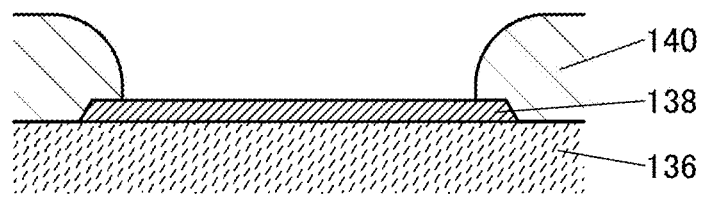
FIGS. 49A to 49D are schematic cross-sectional views illustrating a method for forming an EL layer.
Figure 49B:
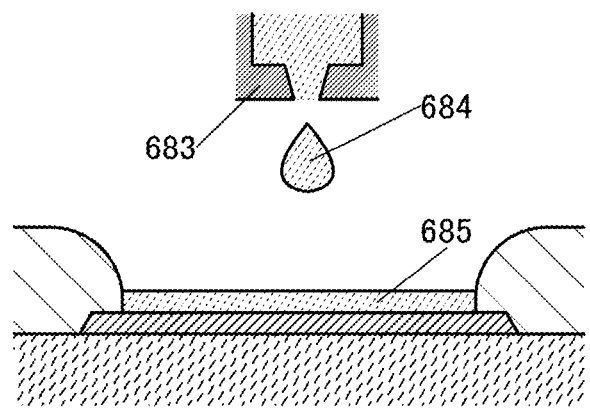

FIG. 49A illustrates a substrate over which the insulating film 136, the conductive film 138, and the insulating film 140 are formed.

First, in a portion where the conductive film 138 is exposed, which is an opening of the insulating film 140, a droplet 684 is discharged from a droplet discharge apparatus 683 to form a layer 685 containing a composition. The droplet 684 is a composition containing a solvent and is attached to the conductive film 138 (see FIG. 49B).

Note that the method for discharging the droplet 684 may be performed under reduced pressure.

Figure 49C:
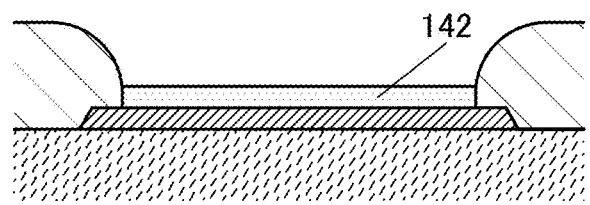

Then, the solvent is removed from the layer 685 containing the composition, and the resulting layer is solidified to form the EL layer 142 (see FIG. 49C).

The solvent may be removed by drying or heating.

Figure 49D:
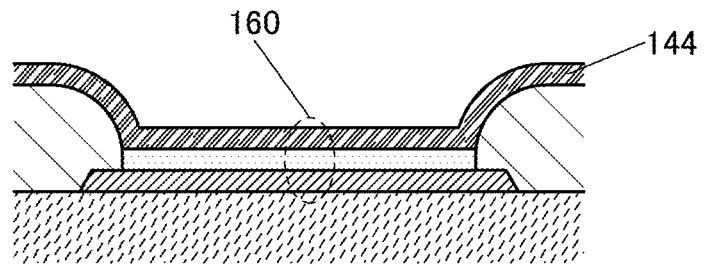

Next, the conductive film 144 is formed over the EL layer 142, whereby the light-emitting element 160 is formed (see FIG. 49D).

When the EL layer 142 is formed by a droplet discharging method as described above, the composition can be selectively discharged, and thus, waste of material can be reduced. Furthermore, a lithography process or the like for shaping is not needed, and thus, the process can be simplified and cost reduction can be achieved.

Note that FIGS. 49A to 49D illustrate a process for forming the EL layer 142 as a single layer. When the EL layer 142 includes functional layers in addition to the light-emitting layer 150 as shown in FIG. 48, the layers are formed sequentially from the conductive film 138 side. In that case, the hole-injection layer 151, the hole-transport layer 152, the light-emitting layer 150, the electron-transport layer 153, and the electron-injection layer 154 may be formed by a droplet discharging method. Alternatively, the hole-injection layer 151, the hole-transport layer 152, and the light-emitting layer 150 may be formed by a droplet discharging method, whereas the electron-transport layer 153 and the electron-injection layer 154 may be formed by an evaporation method or the like. The light-emitting layer may be formed by a combination of a droplet discharging method and an evaporation method or the like.

The hole-injection layer 151 can be formed using poly(ethylenedioxythiophene)/poly(styrenesulfonic acid) by a coating method, such as a droplet discharging method or a spin coating method, for example. The hole-transport layer 152 can be formed using a hole-transport material, e.g., polyvinylcarbazole, by a coating method, such as a droplet discharging method or a spin coating method, for example. After the formation of the hole-injection layer 151 and after the formation of the hole-transport layer 152, heat treatment may be performed under an air atmosphere or an inert gas atmosphere such as nitrogen.

The light-emitting layer 150 can be formed using a high molecular compound or a low molecular compound that emits at least one of violet light, blue light, blue green light, green light, yellow green light, yellow light, orange light, and red light. As the high molecular compound and the low molecular compound, a fluorescent or phosphorescent organic compound can be used. With use of a solvent in which the high molecular compound and the low molecular compound are dissolved, the light-emitting layer can be formed by a coating method, such as a droplet discharge method or a spin coating method. After the formation of the light-emitting layer 150, heat treatment may be performed under an air atmosphere or an inert gas atmosphere such as a nitrogen atmosphere. With the use of the fluorescent or phosphorescent organic compound as a guest material, the guest material may be dispersed into a high molecular compound or a low molecular compound that has higher excitation energy than the guest material. The light-emitting organic compound may be deposited alone or the light-emitting organic compound mixed with another material may be deposited. The light-emitting layer 150 may have a two-layer structure. In that case, each layer of the two-layer light-emitting layer preferably contains a light-emitting organic compound whose emission color is different from that of the other layer. When the light-emitting layer 150 is formed using a low molecular compound, an evaporation method can be used.

The electron-transport layer 153 can be formed using a substance having a high electron-transport property. The electron-injection layer 154 can be formed using a substance having a high electron-injection property. Note that the electron-transport layer 153 and the electron-injection layer 154 can be formed by an evaporation method.

The conductive film 144 can be formed by an evaporation method. The conductive film 144 can be formed using a conductive film having a light-transmitting property. Alternatively, the conductive film 144 may have a stacked layer including a reflective conductive film and a light-transmitting conductive film.

The droplet discharge method described above is a general term for a means including a nozzle equipped with a composition discharge opening or a means to discharge droplets such as a head having one or a plurality of nozzles, such as an ink jet method or a nozzle printing method.

<4-3. Droplet Discharge Apparatus>

Figure 50:
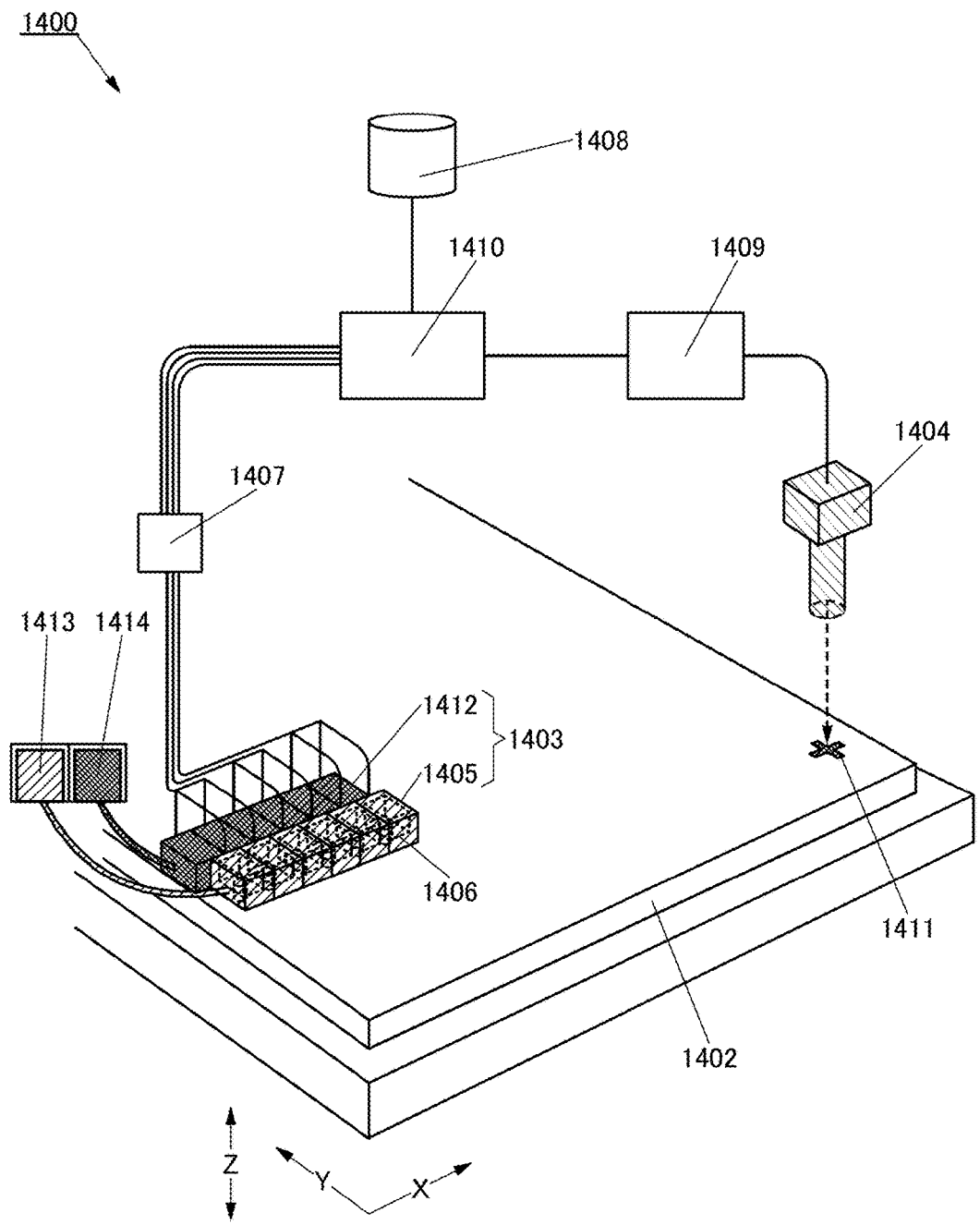
FIG. 50 is a conceptual diagram illustrating a droplet discharge apparatus.

Next, a droplet discharge apparatus used for the droplet discharge method is described with reference to FIG. 50. FIG. 50 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407 that is controlled by a computer 1410 so that a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used as the imaging means 1404. Note that information on a pattern to be formed over the substrate 1402 is stored in a storage medium 1408, and the control signal is transmitted to the control means 1407 on the basis of the information, whereby the head 1405 and the head 1412 of the droplet discharge means 1403 can be separately controlled. The heads 1405 and 1412 are supplied with a material to be discharged from material supply sources 1413 and 1414 through pipes, respectively.

Inside the head 1405, a space 1406 filled with a liquid material as indicated by a dotted line and a nozzle serving as a discharge opening are provided. Although it is not shown, an inside structure of the head 1412 is similar to that of the head 1405. When the nozzle sizes of the heads 1405 and 1412 are different from each other, different materials with different widths can be discharged simultaneously. Each head can discharge and draw a plurality of light emitting materials. In the case of drawing over a large area, the same material can be simultaneously discharged to be drawn from a plurality of nozzles in order to improve throughput. When a large substrate is used, the heads 1405 and 1412 can freely scan the substrate in directions indicated by arrows X, Y, and Z in FIG. 50, and a region in which a pattern is drawn can be freely set. Thus, a plurality of the same patterns can be drawn over one substrate.

A step of discharging the composition may be performed under reduced pressure. Also, a substrate may be heated when the composition is discharged. After discharging the composition, either drying or baking or the both is performed. Both the drying and baking steps are heat treatments but different in purpose, temperature, and time period. The steps of drying and baking are performed under normal pressure or under reduced pressure by laser irradiation, rapid thermal annealing, heating using a heating furnace, or the like. Note that the timing of the heat treatment and the number of times of the heat treatment are not particularly limited. The temperature for performing each of the steps of drying and baking in a favorable manner depends on the materials of the substrate and the properties of the composition.

As described above, the EL layer 142 can be formed using a droplet discharge apparatus.

Note that the structure described in this embodiment can be used in appropriate combination with any of the other embodiments.

Embodiment 5

In this embodiment, examples of a display device which includes the semiconductor device described in the above embodiments are described below with reference to FIG. 51, FIG. 52, and FIG. 53.

<5-1. Top View of Display Device>

Figure 51:
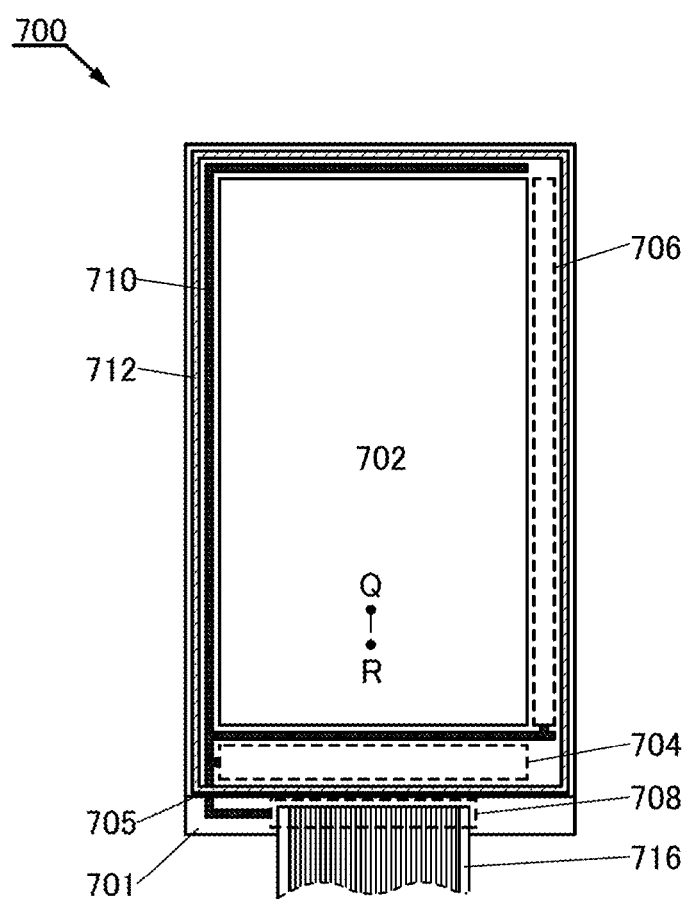
FIG. 51 is a top view illustrating one embodiment of a display device.

FIG. 51 is a top view illustrating an example of a display device. A display device 700 in FIG. 51 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 51, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

<5-2. Cross-Sectional View of Display Device>

Next, a structure of a display device including the semiconductor device 100A in Embodiment 1 is described with reference to FIG. 52. Note that FIG. 52 is a cross-sectional view corresponding to a cross section taken along dashed-dotted line Q-R in FIG. 51.

Figure 52:
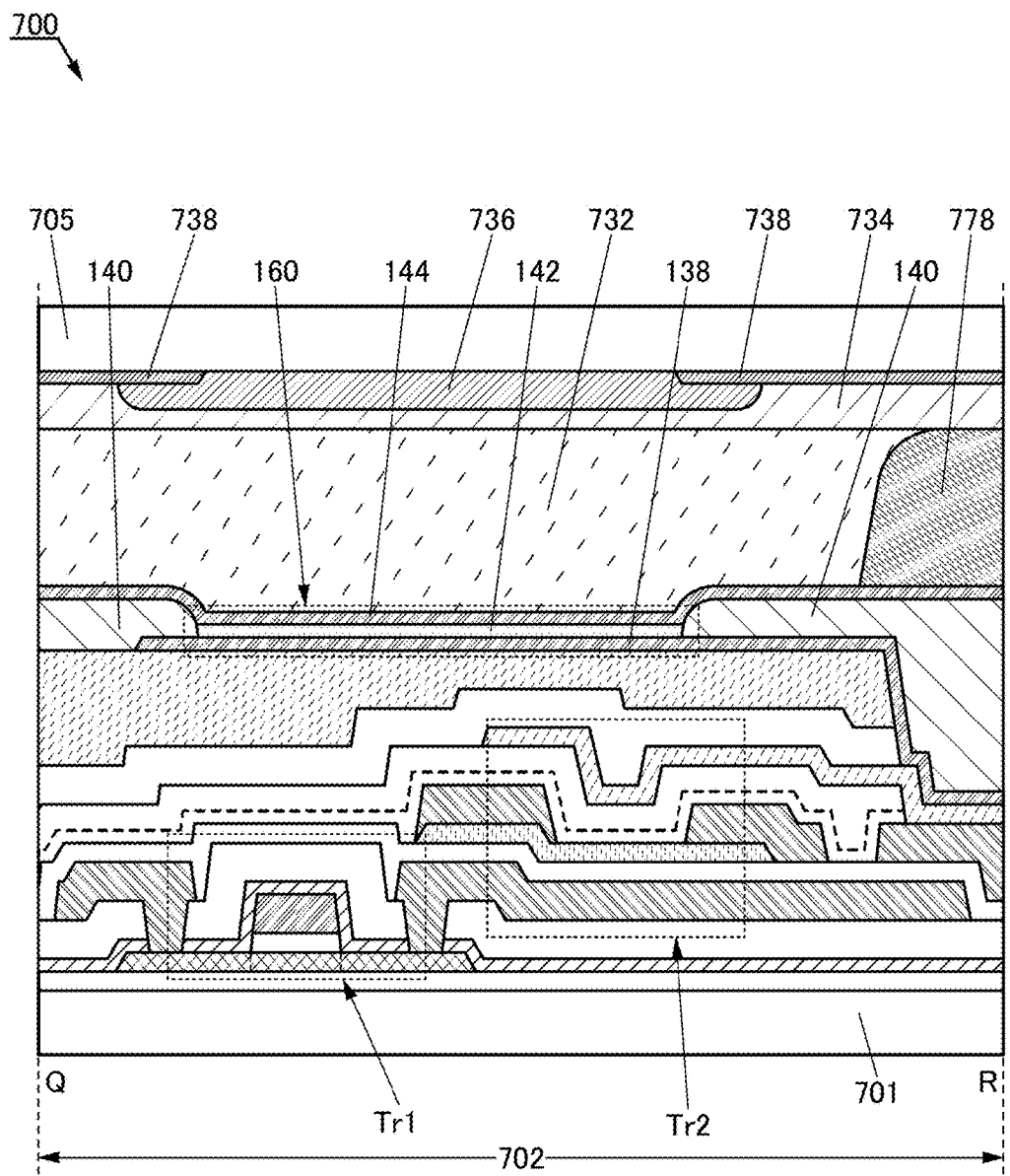
FIG. 52 is a cross-sectional view illustrating one embodiment of a display device.

A display device 700 illustrated in FIG. 52 includes the transistor Tr1, the transistor Tr2, and the light-emitting element 160 between the first substrate 701 and the second substrate 705.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778.

The transistor Tr1 and the transistor Tr2 that are described in Embodiment 1 are provided over the first substrate 701.

The transistor Tr1 and the transistor Tr2 each include an oxide semiconductor which is highly purified and in which formation of an oxygen vacancy is suppressed. Therefore, the off-state current of each of the transistor Tr1 and the transistor Tr2 can be significantly reduced; thus, an electric signal such as an image signal can be held for a longer period and a writing interval can be set longer in a power-on state. As a result, the frequency of refresh operation can be reduced, so that power consumption of the display device can be reduced.

In addition, the transistor Tr2 can have relatively high field-effect mobility and is thus capable of high-speed operation. For example, with such a transistor which can operate at high speed used for a display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

The light-emitting element 160 in this embodiment has a top emission structure. Therefore, the conductive film 144 has a light-transmitting property and transmits light emitted from the EL layer 142. Although the top-emission structure is described as an example in this embodiment, one embodiment of the present invention is not limited thereto. A bottom-emission structure in which light is emitted to the conductive film 138 side, or a dual-emission structure in which light is emitted to both the conductive film 138 side and the conductive film 144 side may be employed.

The coloring film 736 is provided to overlap with the light-emitting element 160, and the light-blocking film 738 is provided to overlap with the insulating film 140. The coloring film 736 and the light-blocking film 738 are covered with the insulating film 734. A space between the light-emitting element 160 and the insulating film 734 is filled with a sealing film 732. Although a structure with the coloring film 736 is described as the display device 700 shown in FIG. 52, the structure is not limited thereto. In the case where the EL layer 142 is formed by a separate coloring method, the coloring film 736 is not necessarily provided.

<5-3. Structure Example of Display Device Provided with Input/Output Device>

An input/output device may be provided in the display device 700 illustrated in FIG. 52. As an example of the input/output device, a touch panel or the like can be given.

Figure 53:
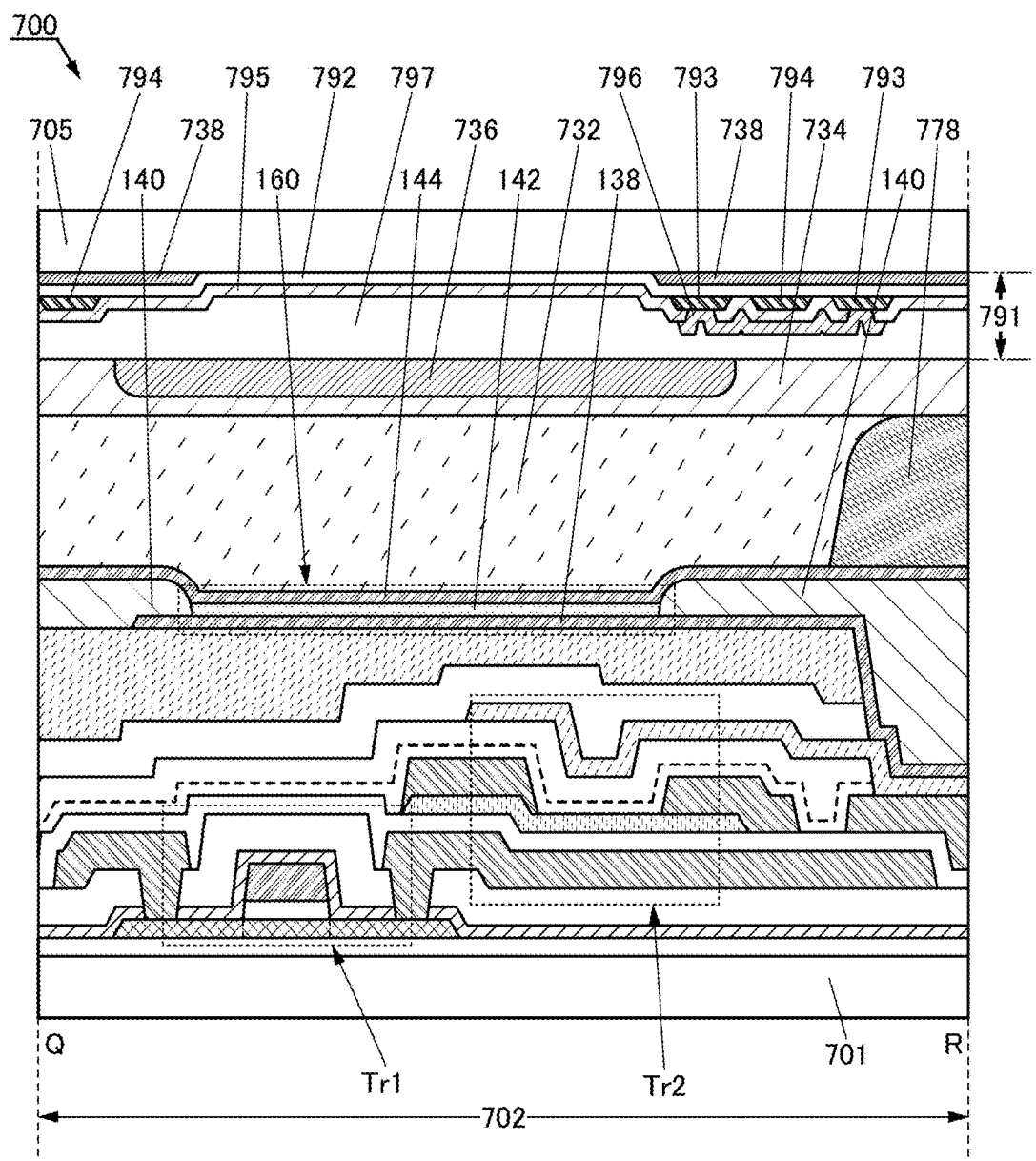
FIG. 53 is a cross-sectional view illustrating one embodiment of a display device.

FIG. 53 illustrates a structure in which the display device 700 illustrated in FIG. 52 includes a touch panel 791.

FIG. 53 is a cross-sectional view of the structure in which the display device 700 illustrated in FIG. 52 includes a touch panel 791.

The touch panel 791 is an in-cell touch panel provided between the substrate 705 and the coloring film 736. The touch panel 791 is formed on the substrate 705 side before the coloring film 736 is formed.

The touch panel 791 includes the light-blocking film 738, an insulating film 792, an electrode 793, an electrode 794, an insulating film 795, an electrode 796, and an insulating film 797. A change in the mutual capacitance between the electrode 793 and the electrode 794 can be sensed when an object such as a finger or a stylus approaches, for example.

A portion in which the electrode 793 intersects with the electrode 794 is illustrated in the upper portion of the insulating film 140. Through openings in the insulating film 795, the electrode 796 is electrically connected to the two electrodes 793 between which the electrode 794 is positioned. Although the electrode 796 is formed in the pixel portion 702 in FIG. 53, this embodiment is not limited to this example, and the electrode 796 may be formed in a gate driver circuit portion or a source driver circuit portion, for example.

The electrodes 793 and 794 are provided in a region overlapping with the light-blocking film 738. It is preferable that the electrode 793 and the electrode 794 do not overlap with the light-emitting element 160. In other words, the electrode 793 and the electrode 794 each has an opening in a region overlapping with the light-emitting element 160. That is, the electrode 793 and the electrode 794 each have a mesh shape. With this structure, the electrode 793 and the electrode 794 do not block light emitted from the light-emitting element 160. Thus, since luminance is hardly reduced even when the touch panel 791 is provided, a display device with high visibility and low power consumption can be obtained.

In addition, since the electrodes 793 and 794 do not overlap with the light-emitting element 160, the electrodes 793 and 794 can be formed using a metal material with low visible light transmittance.

Thus, as compared with the case where an oxide material whose transmittance of visible light is high is used, resistance of the electrodes 793 and 794 can be reduced, whereby sensitivity of the touch panel 791 can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 664, 665, and 667, the transmittance of visible light can be greater than or equal to 89% and the sheet resistance can be greater than or equal to 40 Ω/sq. and less than or equal to 100 Ω/sq.

Although the structure of the in-cell touch panel is illustrated in FIG. 53, one embodiment of the present invention is not limited thereto. For example, a touch panel formed over the display device 700, what is called an on-cell touch panel, or a touch panel attached to the display device 700, what is called an out-cell touch panel may be used.

In this manner, the display device of one embodiment of the present invention can be combined with various types of touch panels.

Note that the structures described in this embodiment can be combined as appropriate with any of the structures described in the other embodiments.

Embodiment 6

In this embodiment, a display device including a semiconductor device of one embodiment of the present invention is described with reference to FIG. 54.
<6-1. Structure Example of Display Device>
FIG. 54 is a block diagram showing an example of a display device including a semiconductor device of one embodiment of the present invention.

Figure 54:
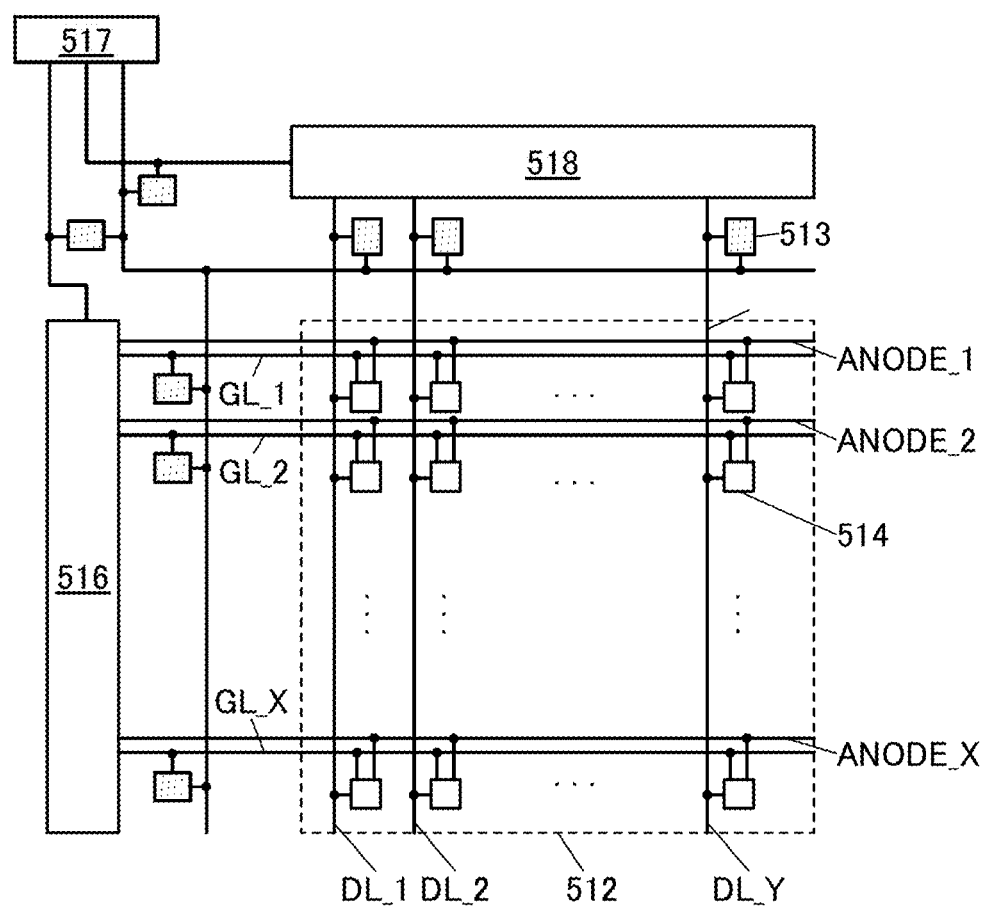
FIG. 54 is a block diagram illustrating a display device.

A display device illustrated in FIG. 54 includes a pixel portion 512, a gate line driver circuit 516 on the periphery of the pixel portion 512, and a signal line driver circuit 518 on the periphery of the pixel portion 512. Note that the pixel portion 512 includes a plurality of pixel circuits 514.

A semiconductor device illustrated in FIG. 54 includes a terminal portion 517 and a protection circuit 513. Note that the terminal portion 517 and the protection circuit 513 are not necessarily provided.
<6-2. Pixel Portion and Pixel Circuit>
The pixel portion 512 includes a plurality of circuits (pixel circuits 514) for driving display elements arranged in X rows (X is a natural number of 2 or more) and Y columns (Y is a natural number of 2 or more). The gate line driver circuit 516 has a function of outputting a signal (a scan signal) for selecting the pixel circuit 514. The signal line driver circuit 518 has a function of supplying a signal (a data signal) for driving the display element in the pixel circuit 514.

Note that the configuration is not limited to the example in FIG. 54, in which the plurality of pixel circuits 514 are arranged in a matrix (a stripe arrangement); for example, delta arrangement or pentile arrangement may be employed for the pixel circuits 514. Furthermore, as color elements controlled in the pixel circuits 514 at the time of color display, three colors of R (red), G (green), and B (blue) can be given. Note that color elements controlled in the pixel circuits 514 at the time of color display are not limited to such colors, and color elements of more than three colors may be employed, e.g., R, G, B, and W (white); or R, G, B, and one or more of Y (yellow), C (cyan), M (magenta), and the like. The size of a display region may be different depending on respective dots of the color components.

The plurality of pixel circuits 514 each include a light-emitting element and a driving transistor for controlling the amount of current flowing to the light-emitting element. In the light-emitting element, by application of voltage to the light-emitting element, electrons are injected from one of a pair of electrodes included in the light-emitting element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The pixel circuit 514 can have the configuration shown in FIG. 9 described in Embodiment 1. This configuration is preferable because the pixel density of the display device can be increased.

<6-3. Gate Line Driver Circuit and Signal Line Driver Circuit>
One or both of the gate line driver circuit 516 and the signal line driver circuit 518 are preferably formed over the substrate over which the pixel portion 512 is formed. Thus, the number of components and the number of terminals can be reduced. When one or both of the gate line driver circuit 516 and the signal line driver circuit 518 are not formed over the substrate over which the pixel portion 512 is formed, one or both of the gate line driver circuit 516 and the signal line driver circuit 518 can be mounted COG or tape automated bonding (TAB).

A pulse signal and a data signal are input to each of the plurality of pixel circuits 514 through one of the plurality of scan lines GL supplied with scan signals and one of the plurality of data lines DL supplied with data signals, respectively. Writing and holding of the data signal to and in each of the plurality of pixel circuits 514 are controlled by the gate line driver circuit 516. For example, to the pixel circuit 514 in the m-th row and the n-th column (m is a natural number of less than or equal to X, and n is a natural number of less than or equal to Y), a pulse signal is input from the gate line driver circuit 516 through the scan line GL_m, and a data signal is input from the signal line driver circuit 518 through the data line DL_n in accordance with the potential of the scan line GL_m.

The gate line driver circuit 516 includes a shift register or the like. The gate line driver circuit 516 receives a signal for driving the shift register through the terminal portion 517 and outputs a signal. For example, the gate line driver circuit 516 receives a start pulse signal, a clock signal, or the like and outputs a pulse signal. The gate line driver circuit 516 has a function of controlling the potentials of wirings supplied with scan signals (hereinafter such wirings are referred to as scan lines GL_1 to GL_X). Note that a plurality of gate line driver circuits 516 may be provided to control the scan lines GL_1 to GL_X separately. Alternatively, the gate line driver circuit 516 has a function of supplying an initialization signal. Without being limited thereto, the gate line driver circuit 516 can supply another signal. For example, as illustrated in FIG. 54, the gate line driver circuit 516 is electrically connected to wirings for controlling the potential of the light-emitting element (hereinafter such wirings are referred to as ANODE_1 to ANODE_X).

The signal line driver circuit 518 includes a shift register or the like. The signal line driver circuit 518 receives a signal (image signal) from which a data signal is derived, as well as a signal for driving the shift register, through the terminal portion 517. The signal line driver circuit 518 has a function of generating a data signal to be written to the pixel circuit 514 which is based on the image signal. In addition, the signal line driver circuit 518 has a function of controlling output of a data signal in response to a pulse signal produced by input of a start pulse signal, a clock signal, or the like. Furthermore, the signal line driver circuit 518 has a function of controlling the potentials of wirings supplied with data signals (hereinafter such wirings are referred to as data lines DL_1 to DL_Y). Alternatively, the signal line driver circuit 518 has a function of supplying an initialization signal. Without being limited thereto, the signal line driver circuit 518 can supply another signal. The signal line driver circuit 518 includes a plurality of analog switches or the like, for example. The signal line driver circuit 518 can output, as the data signals, signals obtained by time-dividing the image signal by sequentially turning on the plurality of analog switches.

<6-4. Protection Circuit>

The protection circuit 513 is connected to, for example, the scan line GL between the gate line driver circuit 516 and the pixel circuit 514. Alternatively, the protection circuit 513 is connected to the data line DL between the signal line driver circuit 518 and the pixel circuit 514. Alternatively, the protection circuit 513 can be connected to a wiring between the gate line driver circuit 516 and the terminal portion 517. Alternatively, the protection circuit 513 can be connected to a wiring between the signal line driver circuit 518 and the terminal portion 517. Note that the terminal portion 517 includes terminals for inputting power, control signals, and image signals to the display device from external circuits.

The protection circuit 513 has a function of electrically connecting a wiring connected to the protection circuit 513 to another wiring when a potential out of a certain range is applied to the wiring connected to the protection circuit 513. The protection circuits 513 are provided, so that the resistance of the display device to overcurrent generated by electrostatic discharge (ESD) or the like can be improved. A configuration in which the protection circuits 513 are connected to the gate line driver circuit 516 or a configuration in which the protection circuits 513 are connected to the signal line driver circuit 518 may be employed. Alternatively, the protection circuits 513 may be connected to the terminal portion 517.

The structure described above in this embodiment can be combined with any of the structures described in the other embodiments as appropriate.

Embodiment 7

In this embodiment, a display module and electronic devices, each of which includes a semiconductor device of one embodiment of the present invention, are described with reference to FIG. 55, FIGS. 56A to 56E, FIGS. 57A to 57G, and FIGS. 58A and 58B.

<7-1. Display Module>

Figure 55:
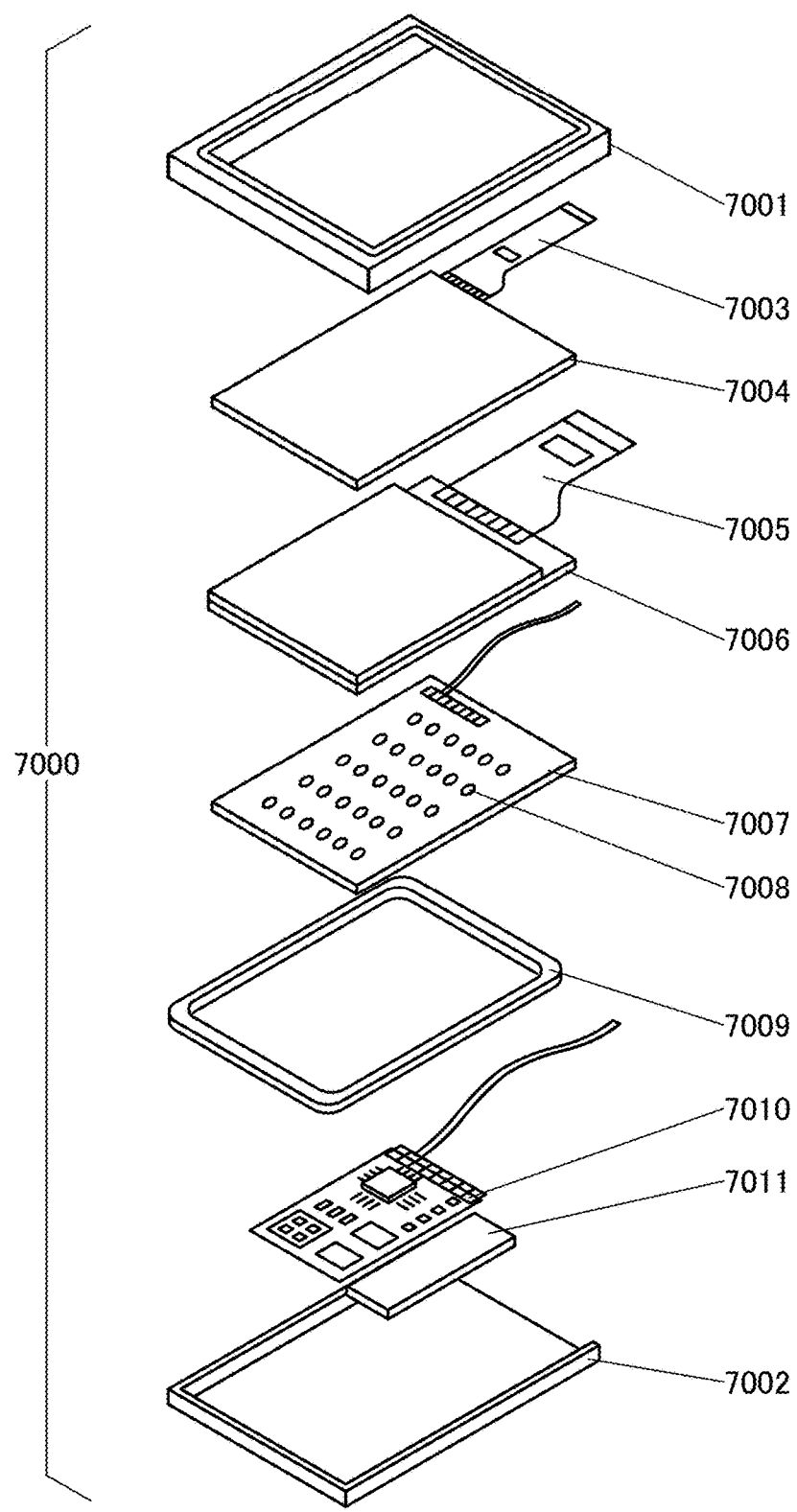
FIG. 55 illustrates a display module.

In a display module 7000 illustrated in FIG. 55, a touch panel 7004 connected to an FPC 7003, a display panel 7006 connected to an FPC 7005, a backlight 7007, a frame 7009, a printed board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 55, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed board 7010. The frame 7009 may also function as a radiator plate.

The printed board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<7-2. Electronic Device 1>

Next, FIGS. 56A to 56E illustrate examples of electronic devices.

Figure 56A:
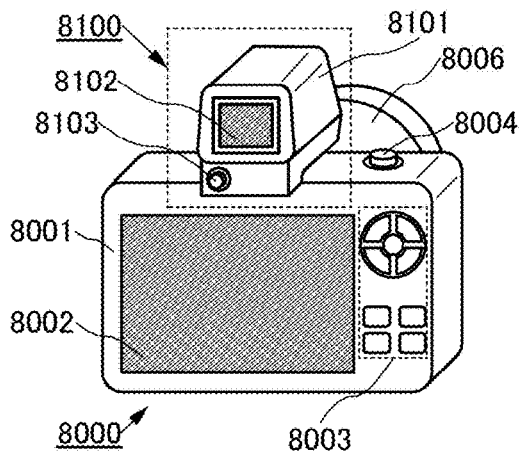
FIGS. 56A to 56E illustrate electronic devices.

FIG. 56A is an external view of a camera 8000 to which a finder 8100 is attached.

The camera 8000 includes a housing 8001, a display portion 8002, an operation button 8003, a shutter button 8004, and the like. Furthermore, a detachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The on/off state of the display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 56A, the housing 8001 of the camera 8000 may include a finder having a display device.

Figure 56B:
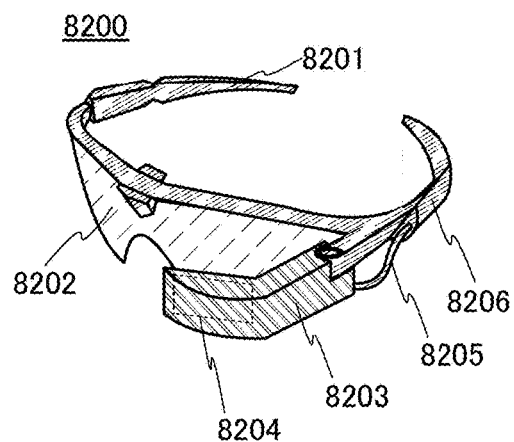

FIG. 56B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes which are to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 56C:
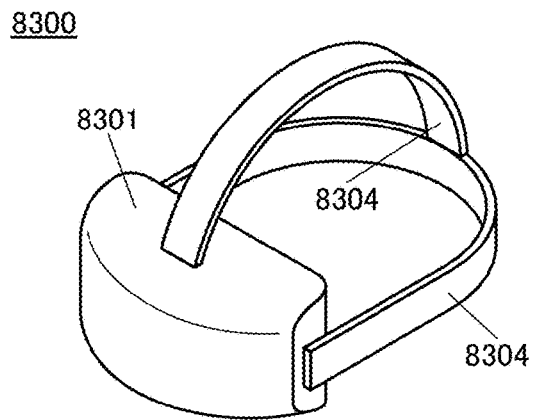
Figure 56D:
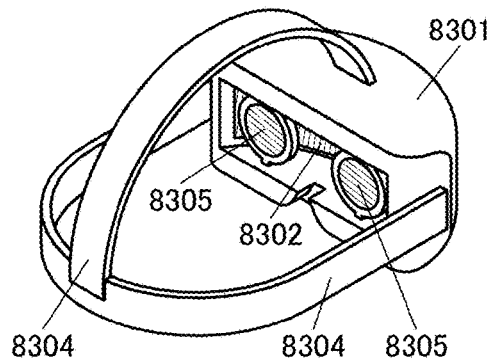
Figure 56E:
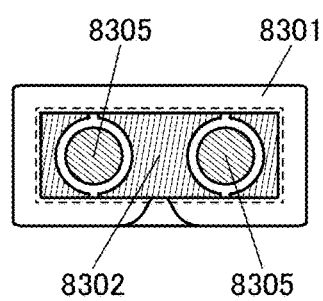

FIGS. 56C to 56E are external views of a head-mounted display 8300. The head-mounted display 8300 includes a housing 8301, a display portion 8302, a fixing band 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 56E, the user does not perceive pixels, and thus a more realistic image can be displayed.

<7-3. Electronic Device 2>

Next, FIGS. 57A to 57G illustrate examples of electronic devices that are different from those illustrated in FIGS. 56A to 56E.

Electronic devices illustrated in FIGS. 57A to 57G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 57A to 57G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 57A to 57G are not limited thereto, and the electronic devices can have a variety of functions. Although not illustrated in FIGS. 57A to 57G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 57A to 57G are described in detail below.

Figure 57A:
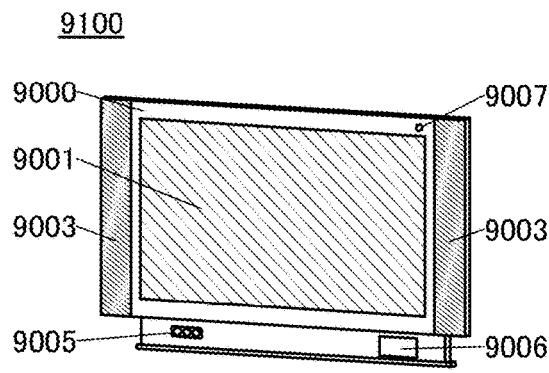
FIGS. 57A to 57G illustrate electronic devices.

FIG. 57A is a perspective view illustrating a television device 9100. The television device 9100 can include the display portion 9001 having a large screen size of, for example, 50 inches or more, or 100 inches or more.

Figure 57D:
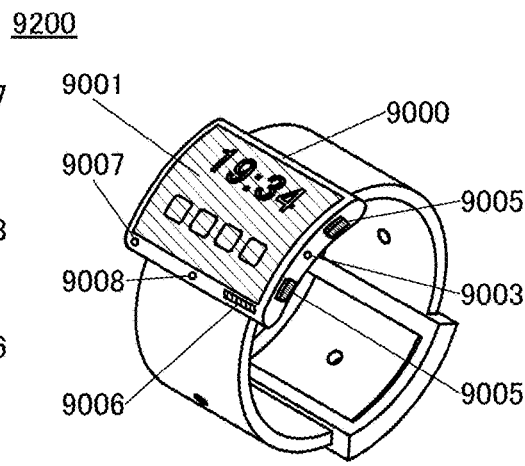
Figure 57B:
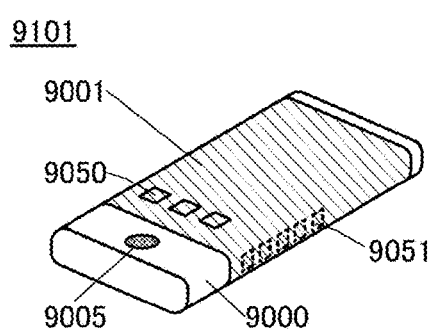

FIG. 57B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include a speaker 9003, a connection terminal 9006, a sensor 9007, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 57E:
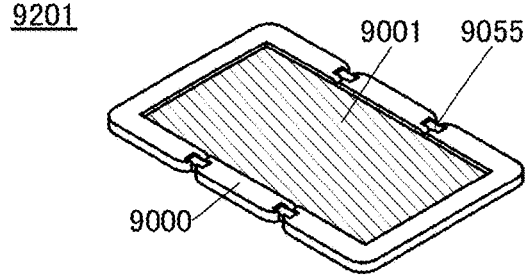
Figure 57C:
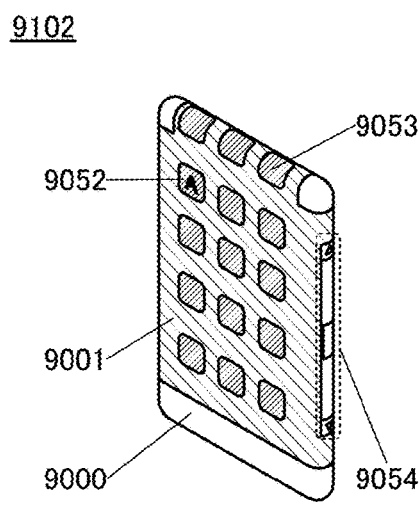

FIG. 57C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 57D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 57F:
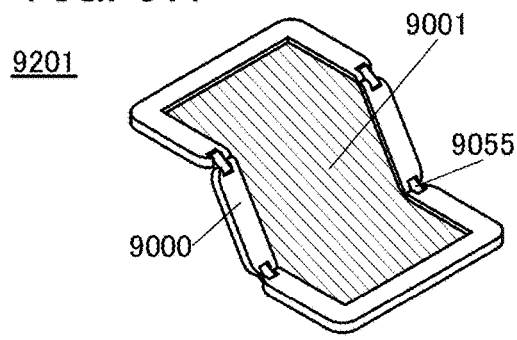
Figure 57G:
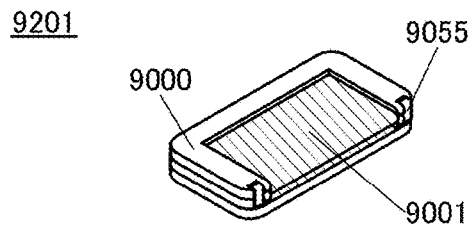

FIGS. 57E, 57F, and 57G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 58A:
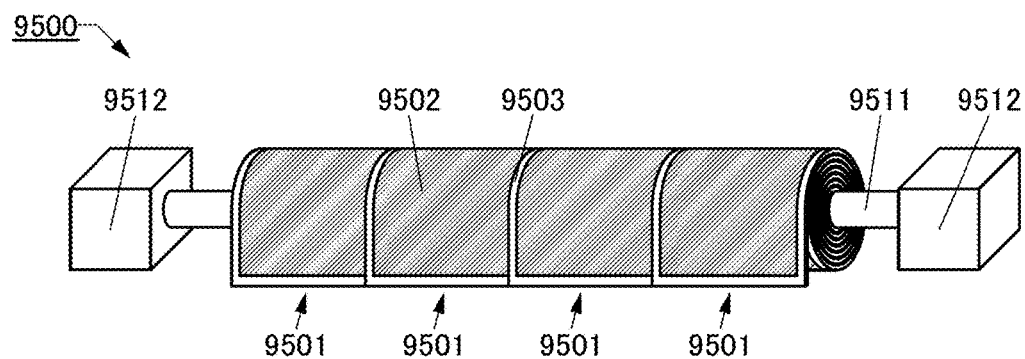
FIGS. 58A and 58B are perspective views illustrating a display device.
Figure 58B:
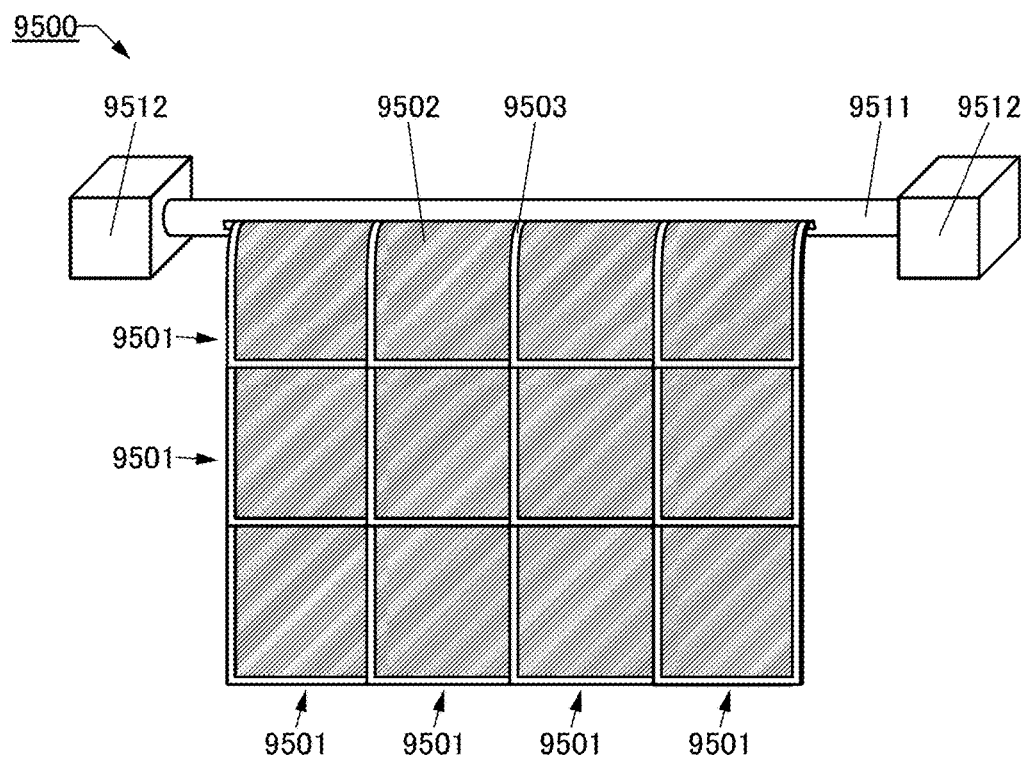

Next, an example of an electronic device that is different from the electronic devices illustrated in FIGS. 56A to 56E and FIGS. 57A to 57G is illustrated in FIGS. 58A and 58B. FIGS. 58A and 58B are perspective views of a display device including a plurality of display panels. The plurality of display panels are wound in the perspective view in FIG. 58A and are unwound in the perspective view in FIG. 58B.

A display device 9500 illustrated in FIGS. 58A and 58B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can overlap with each other. A display device having a large screen can be obtained with the plurality of display panels 9501. The display device is highly versatile because the display panels 9501 can be wound depending on its use.

Although the display regions 9502 of the adjacent display panels 9501 are separated from each other in FIGS. 58A and 58B, without limitation to this structure, the display regions 9502 of the adjacent display panels 9501 may overlap with each other without any space so that a continuous display region 9502 is obtained, for example.

Electronic devices described in this embodiment are characterized by having a display portion for displaying some sort of information. Note that the semiconductor device of one embodiment of the present invention can also be used for an electronic device that does not have a display portion.

Note that the structures described in this embodiment can be combined as appropriate with any of the structures described in the other embodiments.

This application is based on Japanese Patent Application serial no. 2016-055861 filed with Japan Patent Office on Mar. 18, 2016 and Japanese Patent Application serial no. 2016-125919 filed with Japan Patent Office on Jun. 24, 2016, the entire contents of which are hereby incorporated by reference.

What is claimed is:
1. A semiconductor device comprising a first transistor and a second transistor over a substrate,
wherein the first transistor comprises a first oxide semiconductor film,
wherein the second transistor comprises a second oxide semiconductor film,
wherein the first oxide semiconductor film comprises a first metal oxide film,
wherein the first metal oxide film comprises a first crystal part and a second crystal part,
wherein the first crystal part has c-axis alignment,
wherein the second crystal part has a lower degree of c-axis alignment than the first crystal part,
wherein an electron diffraction pattern of a cross section of the first metal oxide film comprises a first region with a diffraction spot derived from the first crystal part and a second region with a diffraction spot derived from the second crystal part,
wherein the second oxide semiconductor film comprises a second metal oxide film,
wherein the second metal oxide film comprises a third crystal part and a fourth crystal part,
wherein the third crystal part has c-axis alignment,
wherein the fourth crystal part has a lower degree of c-axis alignment than the third crystal part,
wherein an electron diffraction pattern of a cross section of the second metal oxide film comprises a third region with a diffraction spot derived from the third crystal part and a fourth region with a diffraction spot derived from the fourth crystal part,
wherein a ratio of an integrated intensity of luminance in the first region to an integrated intensity of luminance in the second region in the first oxide semiconductor film is higher than a ratio of an integrated intensity of luminance in the third region to an integrated intensity of luminance in the fourth region in the second oxide semiconductor film, and
wherein the first transistor is a bottom-gate transistor.
2. The semiconductor device according to claim 1, wherein a source electrode or a drain electrode of the first transistor comprises a region located between the substrate and the second oxide semiconductor film.
3. The semiconductor device according to claim 1, wherein the first oxide semiconductor film comprises a region located between the substrate and the second oxide semiconductor film.
4. The semiconductor device according to claim 1,
wherein the first transistor comprises an interlayer film, and
wherein the interlayer film comprises a region located between the substrate and the second oxide semiconductor film.
5. The semiconductor device according to claim 1,
wherein the atomic ratio of In to M and Zn the first metal oxide film and the second metal oxide film each comprise In, M, and Zn, and
wherein M is Al Ga, Y, or Sn.
6. The semiconductor device according to claim 1, wherein the second transistor is a bottom-gate transistor.
7. The semiconductor device according to claim 1, wherein the second transistor is a top-gate transistor.
8. The semiconductor device according to claim 1, wherein one or both of the first transistor and the second transistor include a back gate electrode.
9. The semiconductor device according to claim 1,
wherein the atomic ratio of the In to the M and the Zn is [In]:[M]:[Zn]=4:2:3 or a neighborhood thereof, and
wherein when the [In] is 4, the [M] is greater than or equal to 1.5 and less than or equal to 2.5 and the [Zn] is greater than or equal to 2 and less than or equal to 4.

10. The semiconductor device according to claim 1, wherein the interlayer film comprises one or more of a silicon nitride film, a silicon nitride oxide film, and an aluminum oxide film.

11. The semiconductor device according to claim 1, wherein a field-effect mobility in a saturation region of the second transistor is higher than a field-effect mobility in a saturation region of the first transistor.

12. A semiconductor device comprising a first transistor and a second transistor over a substrate,
   wherein the first transistor comprises a first oxide semiconductor film,
   wherein the second transistor comprises a second oxide semiconductor film,
   wherein the first oxide semiconductor film comprises a first metal oxide film,
   wherein the first metal oxide film comprises a first crystal part and a second crystal part,
   wherein the first crystal part has c-axis alignment,
   wherein the second crystal part has a lower degree of c-axis alignment than the first crystal part,
   wherein an electron diffraction pattern of a cross section of the first metal oxide film comprises a first region with a diffraction spot derived from the first crystal part and a second region with a diffraction spot derived from the second crystal part,
   wherein the second oxide semiconductor film comprises a second metal oxide film,
   wherein the second metal oxide film comprises a third crystal part and a fourth crystal part,
   wherein the third crystal part has c-axis alignment,
   wherein the fourth crystal part has a lower degree of c-axis alignment than the third crystal part,
   wherein an electron diffraction pattern of a cross section of the second metal oxide film comprises a third region with a diffraction spot derived from the third crystal part and a fourth region with a diffraction spot derived from the fourth crystal part,
   wherein a ratio of an integrated intensity of luminance in the first region to an integrated intensity of luminance in the second region in the first oxide semiconductor film is higher than a ratio of an integrated intensity of luminance in the third region to an integrated intensity of luminance in the fourth region in the second oxide semiconductor film, and
   wherein the first transistor is a top-gate transistor.

13. The semiconductor device according to claim 12, wherein a source electrode or a drain electrode of the first transistor comprises a region located between the substrate and the second oxide semiconductor film.

14. The semiconductor device according to claim 12, wherein the first oxide semiconductor film comprises a region located between the substrate and the second oxide semiconductor film.

15. The semiconductor device according to claim 12,
   wherein the first transistor comprises an interlayer film, and
   wherein the interlayer film comprises a region located between the substrate and the second oxide semiconductor film.

16. The semiconductor device according to claim 12,
   wherein the atomic ratio of In to M and Zn the first metal oxide film and the second metal oxide film each comprise In, M, and Zn, and
   wherein M is Al Ga, Y, or Sn.

17. The semiconductor device according to claim 12, wherein the second transistor is a bottom-gate transistor.

18. The semiconductor device according to claim 12, wherein the second transistor is a top-gate transistor.

19. The semiconductor device according to claim 12, wherein one or both of the first transistor and the second transistor include a back gate electrode.

20. The semiconductor device according to claim 12,
   wherein the atomic ratio of the In to the M and the Zn is [In]:[M]:[Zn]=4:2:3 or a neighborhood thereof, and
   wherein when the [In] is 4, the [M] is greater than or equal to 1.5 and less than or equal to 2.5 and the [Zn] is greater than or equal to 2 and less than or equal to 4.

21. The semiconductor device according to claim 12, wherein the interlayer film comprises one or more of a silicon nitride film, a silicon nitride oxide film, and an aluminum oxide film.

22. The semiconductor device according to claim 12, wherein a field-effect mobility in a saturation region of the second transistor is higher than a field-effect mobility in a saturation region of the first transistor.

* * * * *